(12) United States Patent
Shinagawa et al.

(10) Patent No.: US 7,035,751 B2
(45) Date of Patent: Apr. 25, 2006

(54) NONVOLATILE MEMORY MICROCOMPUTER CHIP, AND A METHOD FOR TESTING THE NONVOLATILE MEMORY MICROCOMPUTER CHIP

(75) Inventors: Masatoshi Shinagawa, Otsu (JP); Akifumi Kawahara, Uji (JP); Tetsuyuki Fukushima, Nishinomiya (JP); Masakazu Kurata, Osaka (JP); Manabu Komiya, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 127 days.

(21) Appl. No.: 10/694,567

(22) Filed: Oct. 28, 2003

(65) Prior Publication Data

US 2004/0153924 A1 Aug. 5, 2004

(30) Foreign Application Priority Data

Oct. 30, 2002 (JP) .............................. 2002-316747

(51) Int. Cl.
*G06F 19/00* (2006.01)
(52) U.S. Cl. ..................................... 702/118; 702/117
(58) Field of Classification Search ................. 700/90, 700/95, 108, 109, 110, 117, 121; 702/117, 702/118, 119, 120, 182, 183, 189, 135; 710/1; 713/1; 714/100, 736
See application file for complete search history.

(56) References Cited

U.S. PATENT DOCUMENTS

| | | | | | |
|---|---|---|---|---|---|
| 5,048,019 | A | * | 9/1991 | Albertsen | .................. 714/718 |
| 5,450,576 | A | | 9/1995 | Kennedy | |
| 6,285,962 | B1 | * | 9/2001 | Hunter | ....................... 702/117 |
| 6,480,799 | B1 | * | 11/2002 | Hunter | ....................... 702/117 |
| 6,829,178 | B1 | * | 12/2004 | Koyama et al. | ........ 365/189.07 |

* cited by examiner

*Primary Examiner*—John Barlow
*Assistant Examiner*—Douglas N. Washburn
(74) *Attorney, Agent, or Firm*—McDermott Will & Emery LLP

(57) ABSTRACT

To provide a nonvolatile memory microcomputer with which a step of testing a microcomputer unit using a logic tester can be omitted, thereby reducing the testing cost. A memory tester supplies test data and expectation data to the nonvolatile memory microcomputer, and the nonvolatile memory microcomputer stores them in a nonvolatile memory. Subsequently, upon receiving an address signal, the nonvolatile memory outputs a test signal and an expectation signal based on test data and expectation data corresponding to the address signal. The test signal is supplied to a circuit block in the microcomputer unit, to drive the circuit block. The circuit block returns a test result signal, which is output to the memory tester together with the expectation signal. The memory tester compares the test result signal and the expectation signal, to judge whether the microcomputer unit operates correctly.

16 Claims, 72 Drawing Sheets

FIG.30

NONVOLATILE MEMORY CELL BLOCK

| | SELP | TEST DATA |
|---|---|---|
| 0000h | 0<br>·<br>·<br>·<br>·<br>0 | CPU TEST DATA GROUP |
| 1000h | 1<br>·<br>·<br>·<br>1 | D/A TEST DATA GROUP |
| 1800h | 0<br>·<br>·<br>·<br>·<br>0 | TIMER TEST DATA GROUP |
| | | ·<br>·<br>· |

FIG.38

NONVOLATILE MEMORY CELL BLOCK

| | SELP | TR | TEST DATA |
|---|---|---|---|
| 0000h | 1 ⋮ 1 | 11 ⋮ 11 | CPU TEST DATA GROUP |
| 0800h | 1 ⋮ 1 | 01 ⋮ 01 | CPU TEST DATA GROUP |
| 1000h | 1 ⋮ 1 | 11 ⋮ 11 | D/A TEST DATA GROUP |
| 1800h | 1 ⋮ 1 | 01 ⋮ 01 | TIMER TEST DATA GROUP |
| | ⋮ | ⋮ | ⋮ |

FIG.41

NONVOLATILE MEMORY CELL BLOCK

| | DL | TEST DATA |
|---|---|---|
| 0000h | 11<br>:<br>11 | CPU TEST DATA GROUP |
| 0800h | 00<br>:<br>00 | D/A TEST DATA GROUP |
| | ⋮ | ⋮ |

FIG.45

NONVOLATILE MEMORY CELL BLOCK

| | DL | TEST DATA |
|---|---|---|
| 0000h | 00<br>01<br>10<br>11<br>·<br>·<br>· | SERIAL TEST DATA GROUP |
| | ·<br>·<br>· | ·<br>·<br>· |

FIG.48

NONVOLATILE MEMORY CELL BLOCK

| | SELP | TR | TEST DATA |
|---|---|---|---|
| 0000h | 1<br>⋮<br>1 | 00<br>⋮<br>00 | TEST DATA GROUP<br>USING EXTERNAL POWER |
| 0800h | 0<br>⋮<br>0 | 01<br>⋮<br>01 | TEST DATA GROUP USING<br>POWER OF FIRST VOLTAGE |
| 1000h | 0<br>⋮<br>0 | 11<br>⋮<br>11 | TEST DATA GROUP USING<br>POWER OF SECOND VOLTAGE |
| 1800h | 0<br>0<br>0<br>0<br>⋮ | 00<br>01<br>10<br>11<br>⋮ | TEST DATA GROUP USING<br>POWER OF VARYING VOLTAGE |
| | ⋮ | ⋮ | ⋮ |

FIG.53

NONVOLATILE MEMORY CELL BLOCK

| | SELP | TR | TEST DATA |
|---|---|---|---|
| 0000h | 1<br>:<br>:<br>1 | 00<br>:<br>:<br>00 | TEST DATA GROUP WITHOUT<br>CURRENT STANDARD |
| 0800h | 0<br>:<br>:<br>0 | 01<br>:<br>:<br>01 | TEST DATA GROUP WITH<br>STOP CURRENT STANDARD |
| 1000h | 0<br>:<br>:<br>0 | 11<br>:<br>:<br>11 | TEST DATA GROUP WITH<br>OPERATING CURRENT STANDARD |
| | :<br>:<br>: | :<br>:<br>: | :<br>:<br>: |

FIG.68A

NONVOLATILE MEMORY 4641

TEST DATA GROUP A

FIG.68B

NONVOLATILE MEMORY 4741

TEST DATA GROUP B

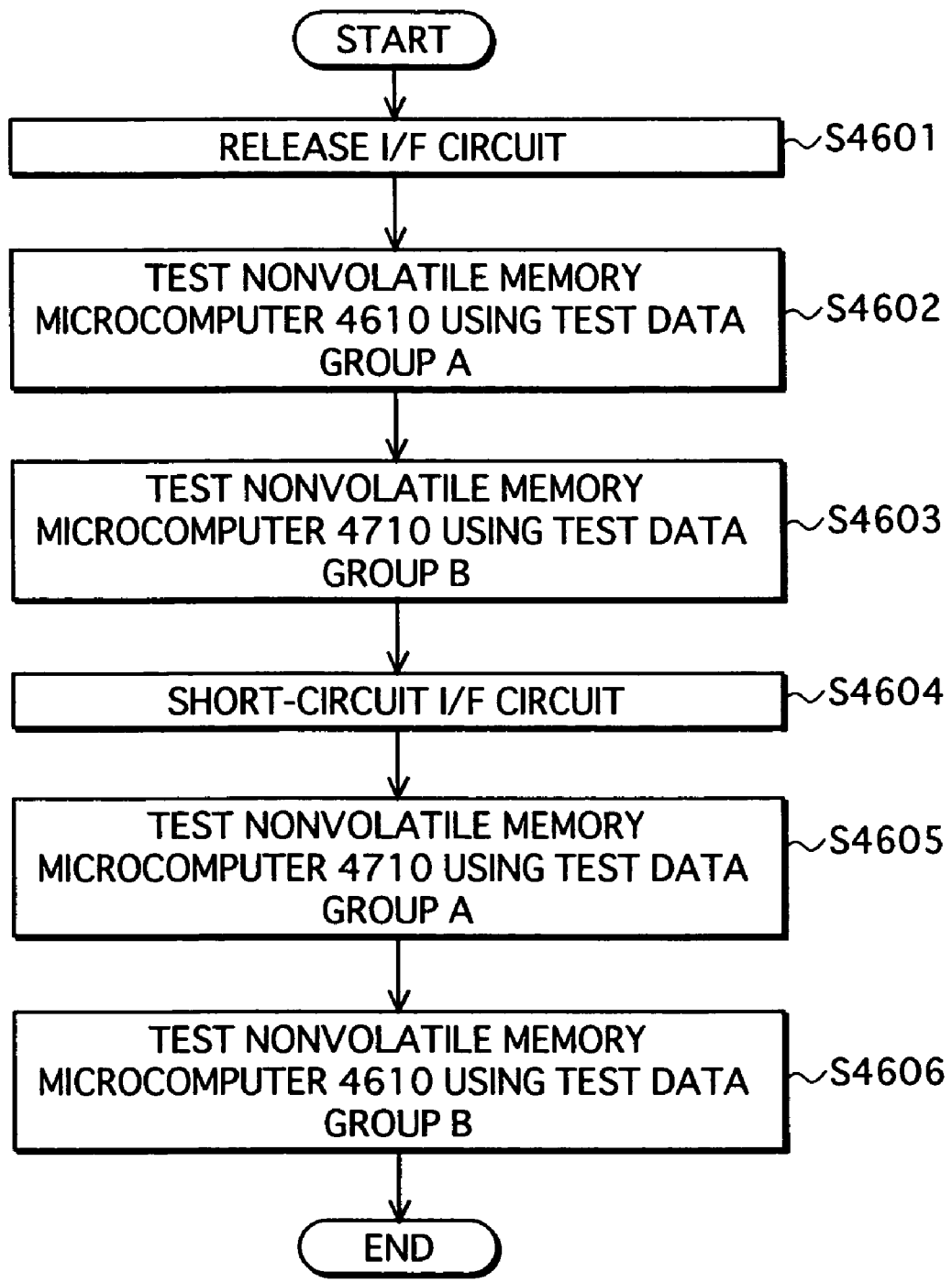

NONVOLATILE MEMORY MICROCOMPUTER CHIP, AND A METHOD FOR TESTING THE NONVOLATILE MEMORY MICROCOMPUTER CHIP

This application is based on an application No. 2002-316747 filed in Japan, the contents of which are hereby incorporated by reference.

BACKGROUND OF THE INVENTION

1. Field of the Invention

The present invention relates to testing of a nonvolatile memory microcomputer, i.e., a microcomputer with a built-in nonvolatile memory.

2. Related Art

Conventionally, a nonvolatile memory microcomputer which includes a microcomputer unit and a memory unit is tested in the following manner. First, the memory unit is tested using a memory tester. After this, the microcomputer unit is tested using a logic tester. Nonvolatile memory microcomputers which are judged as being nondefective as a result of testing are shipped for use in various products (see Takayanagi, Tajima, & Matsui (ed.) *Semiconductor Instrumentation Evaluation Dictionary, First Edition*, Science Forum, Feb. 10, 1994, pp. 625–651 as one example).

FIG. 72 shows rough constructions of a conventional nonvolatile memory microcomputer, a memory tester 3400, and a logic tester 3410.

The conventional nonvolatile memory microcomputer is explained first.

In the drawing, the conventional nonvolatile memory microcomputer is roughly made up of a microcomputer unit 3430 and a memory unit 3440. The microcomputer unit 3430 includes circuit blocks such as a CPU 3431, a RAM 3432, a timer 3433, a serial I/F 3434, a port 3435, an A/D converter 3436, and a D/A converter 3437. These circuit blocks are connected to each other by a bus and the like. A signal from outside the microcomputer unit 3430 is supplied to a circuit block via the port 3435. For example, signal S3410 output from the logic tester 3410 to the microcomputer unit 3430 when testing the microcomputer unit 3430 is supplied to a circuit block via the port 3435, to drive that circuit block. Output of a signal from a circuit block in the microcomputer unit 3430 to outside the microcomputer unit 3430 is made via the port 3435, too.

The memory unit 3440 includes a nonvolatile memory 3441 and a memory I/F 3443. The memory I/F 3443 actually sends/receives signals to/from outside the memory unit 3440 via the port 3435, though the memory I/F 3443 is shown to send/receive signals directly to/from outside in FIG. 72 for simplicity's sake.

When a normal operation other than testing is performed, the CPU 3431 in the microcomputer unit 3430 reads/writes data from/to the nonvolatile memory 3441 via the memory I/F 3443.

The memory tester 3400 is explained next.

The memory tester 3400 includes an address generation circuit 3402, a logic comparison circuit 3404, a pass/fail judgment circuit 3405, and a test signal generation circuit 3406.

The test signal generation circuit 3406 outputs control signal S3406a and data S3406b, which are to be supplied to the nonvolatile memory 3441 through the memory I/F 3443. The address generation circuit 3402 outputs address signal S3402, which is to be supplied to the nonvolatile memory 3441 through the memory I/F 3443.

The logic comparison circuit 3404 receives data read from the nonvolatile memory 3441, via the memory I/F 3443. The logic comparison circuit 3404 compares it with predetermined expectation data, and outputs a comparison result to the pass/fail judgment circuit 3405. The pass/fail judgment circuit 3405 judges the memory unit 3440 as being defective, if the comparison result indicates a mismatch. Otherwise, the pass/fail judgment circuit 3405 judges the memory unit 3440 as being nondefective. The pass/fail judgment circuit 3405 informs a user of the memory tester 3400 of a judgment result, by means of display or the like.

The memory unit 3440 is tested with the microcomputer unit 3430 being put in a reset state and the port 3435 in the microcomputer unit 3430 being put in a memory test state. The memory test state referred to here is a state where the memory tester 3400 and the memory unit 3440 are substantially directly connected. This being so, the test signal generation circuit 3406 supplies a read control signal, or a write control signal and write data, to the memory I/F 3443. Meanwhile, the address generation circuit 3402 supplies an address signal to the memory I/F 3443. This causes the nonvolatile memory 3441 to operate. The logic comparison circuit 3404 checks an operation result of the nonvolatile memory 3441. In FIG. 72, boxed numbers 1 to 7 indicate signal flows when the memory unit 3440 is tested.

The logic tester 3410 is explained next.

The logic tester 3410 includes a pattern generator 3411, a waveform shaping circuit 3412, a timing generator 3413, an input signal reference voltage generator 3414, an I/O signal control circuit 3415, a comparison reference voltage generator 3416, a logic comparison circuit 3417, a pass/fail judgment circuit 3418, and a defect analysis memory 3419.

The pattern generator 3411 generates a test pattern showing an instruction to be given to the microcomputer unit 3430, and sends it to the waveform shaping circuit 3412 as test pattern S3411a. The pattern generator 3411 also generates an expectation pattern showing a test result which is expected when the microcomputer unit 3430 operates correctly, and sends it to the logic comparison circuit 3417 as expectation pattern 3411b.

The waveform shaping circuit 3412 receives test pattern S3411a from the pattern generator 3411, and shapes test pattern S3411a into a signal waveform most suitable for testing, under control of the timing generator 3413. The waveform shaping circuit 3412 sends the signal waveform to the I/O signal control circuit 3415.

The I/O signal control circuit 3415 receives the signal waveform from the waveform shaping circuit 3412, and converts it into a high level or a low level that are determined by an input signal reference voltage generated from the input signal reference voltage generator 3414. The I/O signal control circuit 3415 outputs resulting signal S3410 to the nonvolatile memory microcomputer, to drive a circuit block in the microcomputer unit 3430. The circuit block in the microcomputer unit 3430 operates according to signal S3410, and returns signal S3430 showing an operation result to the I/O signal control circuit 3415.

The I/O signal control circuit 3415 receives signal S3430, and converts it into a high level or a low level that are determined by a comparison reference voltage generated from the comparison reference voltage generator 3416. The I/O signal control circuit 3415 outputs resulting data S3415a and S3415b to the logic comparison circuit 3417.

The logic comparison circuit 3417 compares data S3415a and S3415b with expectation pattern S3411b. If they match, the logic comparison circuit 3417 sends a pass signal indicating that the nonvolatile memory microcomputer is nondefective, to the pass/fail judgment circuit 3418 and the defect analysis memory 3419. If they do not match, the logic comparison circuit 3417 sends a fail signal indicating that the nonvolatile memory microcomputer is defective, to the pass/fail judgment circuit 3418 and the defect analysis memory 3419.

The defect analysis memory 3419 stores, upon receiving the fail signal from the logic comparison circuit 3417, test pattern identification data S3411c which is output from the pattern generator 3411 in sync with test pattern S3411a. As a result, defects can be identified by referring to the defect analysis memory 3419.

The microcomputer unit 3430 is tested with connector terminals of the logic tester 3410 being connected to signal I/O terminals of the nonvolatile memory microcomputer. This being so, the logic tester 3410 outputs signal S3410 for driving the microcomputer unit 3430, to the port 3435. The logic tester 3410 then receives signal S3430 showing a driving result from the port 3435, and judges whether signal S3430 matches an expected result. Usually, the testing is performed using a lot of test patterns. In FIG. 72, circled numbers 1 and 2 indicate signal flows when the microcomputer unit 3430 is tested.

Thus, conventionally a nonvolatile memory microcomputer is tested in two steps, that is, a step of testing a memory unit using a memory tester and a step of testing a microcomputer unit using a logic tester.

To shorten testing time, the following method is typically employed. A test device which functions as a plurality of memory testers is connected with a plurality of nonvolatile memory microcomputer chips, to test a memory unit of each nonvolatile memory microcomputer chip in parallel. Also, a test device which functions as a plurality of logic testers is connected with a plurality of nonvolatile memory microcomputer chips, to test a microcomputer unit of each nonvolatile memory microcomputer chip in parallel.

However, since the number of terminals equipped in one test device is limited, only a limited number of nonvolatile memory microcomputer chips can be tested in parallel. In general, more connector terminals are needed to test a microcomputer unit than to test a memory unit. Therefore, particularly when testing a microcomputer unit, only a small number of nonvolatile memory microcomputer chips can be tested in parallel.

Furthermore, an operation of testing a memory unit using a memory tester in one step and testing a microcomputer unit using a logic tester in another step requires changes to be made on connection and the like between the two steps. This causes a decrease in testing efficiency.

SUMMARY OF THE INVENTION

In view of the above problems, the object of the present invention is to omit the step of testing a microcomputer unit using a logic tester. Which is to say, the object of the present invention is to make it unnecessary to connect a nonvolatile memory microcomputer with a test device for testing a microcomputer unit using a logic tester, thereby shortening the total testing time. For this object, the present invention aims to provide a new nonvolatile memory microcomputer which can be tested efficiently, and a method of testing the new nonvolatile memory microcomputer.

The stated aim can be achieved by a nonvolatile memory microcomputer chip including a microcomputer unit and a memory unit, the microcomputer unit including: a plurality of circuit blocks including a CPU, and the memory unit including: a nonvolatile memory operable to store therein test data used for testing when the testing is performed, and operation data used for an operation other than the testing when the operation is performed; a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data; a drive unit operable to supply each of the plurality of test signals sequentially output from the nonvolatile memory, to any of the plurality of circuit blocks that is to be tested using a piece of test data shown by the test signal, to drive the circuit block; and an output unit operable to receive a test result signal from the driven circuit block, and output the test result signal to outside the nonvolatile memory microcomputer chip.

Conventionally, a microcomputer unit is tested by supplying test data from a logic tester to each circuit block such as a CPU. According to the above construction, however, a microcomputer unit can be tested by storing test data to a nonvolatile memory and then outputting the test data from the nonvolatile memory to each circuit block. This enables a memory tester to test a nonvolatile memory microcomputer. Since the step of testing a microcomputer unit using a logic tester is omitted, the testing cost can be reduced. Also, more nonvolatile memory microcomputers can be tested in parallel by a test device having many terminals. This shortens the total testing time.

Here, the microcomputer unit may further include: a port operable to send/receive a signal to/from outside the microcomputer unit, wherein the drive unit supplies the test signal to the circuit block through the port, and the output unit receives the test result signal from the circuit block through the port.

According to the above construction, the microcomputer unit sends/receives data to/from the outside via the port. This being so, instead of supplying test data from a logic tester to the microcomputer unit via the port and outputting test result data from the microcomputer unit to the logic tester via the port, test data is supplied from the nonvolatile memory to the microcomputer unit via the port and test result data is output from the microcomputer unit to the outside via the port. Since the logic tester is unnecessary, many connection lines for connecting the logic tester and the port are unnecessary too. Accordingly, more nonvolatile memory microcomputers can be tested in parallel by a test device having many terminals. This shortens the total testing time.

Here, the memory control unit may (a) acquire a plurality of pieces of expectation data from outside the nonvolatile memory microcomputer chip in a one-to-one correspondence with the plurality of pieces of test data, and store each piece of test data and a corresponding piece of expectation data in a memory area of the nonvolatile memory having a unique address, each piece of expectation data representing a test result signal that is expected if a circuit block to which a test signal showing a corresponding piece of test data is output is driven correctly, and then (b) each time an address signal is given from outside the nonvolatile memory microcomputer chip, control the nonvolatile memory to output a test signal and an expectation signal that respectively show a piece of test data and a piece of expectation data stored in a memory area having an address shown by the address signal, wherein the drive unit supplies the test signal output from the nonvolatile memory in response to the address signal, to a circuit block that is to be tested using the piece of test data shown by the test signal, to drive the circuit block, and the output unit receives a test result signal from the driven circuit block, and outputs the test result signal and the expectation signal together to outside the nonvolatile memory microcomputer chip.

According to the above construction, test data which is an instruction for driving a circuit block in the microcomputer unit is output from the nonvolatile memory together with expectation data which represents test result data that is expected when the circuit block operates correctly. Test result data returned from the circuit block and the expectation data are then output together to outside the nonvolatile memory microcomputer. This allows an external device such as a memory tester to easily judge whether the circuit block operates correctly, by comparing the test result data and the expectation data.

Here, the nonvolatile memory microcomputer chip may further include: an address generation unit operable to sequentially output a plurality of address signals, wherein the memory control unit (a) stores each piece of test data in a memory area of the nonvolatile memory having a unique address, and then (b) each time the address generation unit outputs an address signal, controls the nonvolatile memory to output a test signal showing a piece of test data stored in a memory area having an address shown by the address signal, and the drive unit supplies the test signal output from the nonvolatile memory in response to the address signal, to a circuit block that is to be tested using the piece of test data shown by the test signal, to drive the circuit block.

According to the above construction, once test data has been stored in the nonvolatile memory, address signals generated by the address generation unit in the nonvolatile memory microcomputer are sequentially supplied to the nonvolatile memory to test the microcomputer unit. This makes it unnecessary to supply address signals from outside the nonvolatile memory microcomputer. As a result, connection lines for supplying address signals from outside the nonvolatile memory microcomputer when testing the microcomputer unit become unnecessary too. Accordingly, more nonvolatile memory microcomputers can be tested in parallel by a test device having many terminals. This shortens the total testing time.

Here, the memory control unit may (a) acquire a plurality of pieces of control data from outside the nonvolatile memory microcomputer chip in a one-to-one correspondence with the plurality of pieces of test data, and store each piece of control data in a memory area of the nonvolatile memory in which a corresponding piece of test data is stored, the plurality of pieces of control data designating an order in which the plurality of pieces of test data are used, and then (b) each time the address generation unit outputs an address signal, control the nonvolatile memory to output a test signal and a control signal which respectively show a piece of test data and a piece of control data stored in a memory area having an address shown by the address signal, wherein the address generation unit includes: a counter unit holding a count value, and operable to periodically output an address signal showing the count value and increment the count value by 1; and a counter control unit operable to (i) store the count value held by the counter unit when the nonvolatile memory outputs a control signal showing a piece of control data having a first value, and subsequently (ii) replaces the count value held by the counter unit with the stored count value when the nonvolatile memory outputs a control signal showing a piece of control data having a second value.

According to the above construction, address signals supplied to the nonvolatile memory can be controlled according to control data which is stored in the nonvolatile memory together with test data, to thereby change an order in which a plurality of pieces of test data are output from the nonvolatile memory. For instance, particular pieces of test data may be repeatedly output from the nonvolatile memory according to control data. In this way, more testing can be conducted with a smaller amount of test data. The nonvolatile memory has only a limited capacity. Also, it takes time to store test data to the nonvolatile memory. Therefore, by reducing the number of pieces of test data stored in the nonvolatile memory and performing more testing with a smaller amount of test data, excellent effects such as a reduction in testing time can be achieved.

Here, the plurality of pieces of test data may be divided into test data groups, with a piece of test data at the end of each test data group being end data that can be distinguished from other pieces of test data, wherein the address generation unit includes: an address storage unit operable to store an address of a memory area of the nonvolatile memory in which a piece of test data at the beginning of each test data group is stored; a counter unit holding a count value, and operable to periodically output an address signal showing the count value and increment the count value by 1; and a counter control unit operable to replace the count value held by the counter unit with one of addresses stored in the address storage unit, when the nonvolatile memory outputs a test signal showing the end data.

According to the above construction, test data groups corresponding to different circuit blocks are stored in the nonvolatile memory. This being so, just by supplying a start address of a test data group from outside the nonvolatile memory microcomputer, a corresponding circuit block can be tested using the test data group.

Here, the plurality of pieces of test data may be divided into test data groups, with a piece of test data at the end of each test data group being end data that can be distinguished from other pieces of test data, wherein the address generation unit includes: an address storage unit operable to acquire a plurality of addresses and a plurality of control flag values which are in a one-to-one correspondence with each other from outside the nonvolatile memory microcomputer chip, and store the plurality of addresses and the plurality of control flag values beforehand; and a release signal acquisition unit operable to acquire a release signal from outside the nonvolatile memory microcomputer chip, and the address generation unit, for each address stored in the address storage unit, (1) outputs an address signal showing the address, (2) if a corresponding control flag value is a first value, subsequently outputs address signals which show consecutive addresses following the address in sequence, until the nonvolatile memory outputs a test signal showing the end data, and (3) if the corresponding control flag value is a second value, subsequently outputs address signals which uniformly show the address in sequence, until the release signal acquisition unit acquires the release signal.

According to the above construction, the generation of address signals which are supplied to the nonvolatile memory to output test data is controlled from outside the nonvolatile memory microcomputer. For example, a specific address signal may repeatedly be generated to keep a circuit block in a certain state.

Here, the memory control unit may include: an address adjustment unit operable to: (1) hold a repetition start address, a repetition end address, and a repetition number; (2) sequentially receive a plurality of address signals; and (3) each time an address signal is received, (i) output the address signal if an address shown by the address signal is different from the repetition start address, and (ii) repeat, a number of times equivalent to the repetition number, outputting address signals which show consecutive addresses from the repetition start address to the repetition end address in sequence, if the address shown by the address signal is same as the repetition start address, wherein the memory control unit (a) stores each piece of test data in a memory area of the nonvolatile memory having a unique address, and then (b) each time the address adjustment unit outputs an address signal, controls the nonvolatile memory to output a test signal showing a piece of test data stored in a memory area having an address shown by the address signal, and the drive unit supplies the test signal output from the nonvolatile memory in response to the address signal, to a circuit block that is to be tested using the piece of test data shown by the test signal, to drive the circuit block.

According to the above construction, the nonvolatile memory is controlled to repeatedly output specific pieces of test data. This makes it unnecessary to store identical pieces of test data to the nonvolatile memory.

Here, at least two pieces of test data out of the plurality of pieces of test data may have different bit lengths according to different contents of the at least two pieces of test data, wherein the drive unit supplies a mixed signal to the port, the mixed signal being made up of a test signal showing a piece of test data whose bit length is not largest among the plurality of pieces of test data and one part of an expectation signal output from the nonvolatile memory together with the test signal, and the port extracts the test signal from the mixed signal according to contents of the mixed signal, and supplies the extracted test signal to a circuit block that is to be tested using the piece of test data shown by the test signal.

According to the above construction, the microcomputer unit can be tested even when the length of test data differs for each circuit block.

Here, the drive unit may shift the test signal in level based on an input signal reference voltage applied from outside the nonvolatile memory microcomputer chip, and supply the shifted test signal to the circuit block to drive the circuit block, wherein the output unit shifts the test result signal in level based on a comparison reference voltage applied from outside the nonvolatile memory microcomputer chip, and outputs the shifted test result signal to outside the nonvolatile memory microcomputer chip.

According to the above construction, a test signal showing test data is adjusted to a voltage necessary for driving a circuit block, before being sent to the circuit block. Also, a test result signal showing test result data returned from the circuit block can be correctly judged whether each bit is 1 or 0.

Here, the nonvolatile memory microcomputer chip may further include: a plurality of pairs of connection lines which are provided in a one-to-one correspondence with the plurality of circuit blocks, and each operable to transfer a signal between a corresponding circuit block and the drive unit and between the corresponding circuit block and the output unit, wherein the drive unit supplies the test signal to the circuit block through one connection line out of a pair of connection lines corresponding to the circuit block, and the output unit receives the test result signal from the circuit block through the other connection line out of the pair of connection lines corresponding to the circuit block.

According to the above construction, a test signal can be supplied directly to a circuit block in the microcomputer unit. This makes it possible to perform more diversified testing than when a test signal is supplied to a circuit block via the port.

Here, the memory control unit may (a) store each piece of test data in a memory area of the nonvolatile memory having a unique address, and then (b) each time an address signal is given from outside the nonvolatile memory microcomputer chip, control the nonvolatile memory to output a test signal showing a piece of test data stored in a memory area having an address shown by the address signal, wherein the memory unit further includes: a circuit block specification unit operable to specify a circuit block that is to be tested using the piece of test data shown by the test signal output from the nonvolatile memory in response to the address signal, based on the address signal, and the drive unit supplies the test signal to the circuit block specified by the circuit block specification unit, to drive the circuit block.

According to the above construction, a circuit block to be tested using test data is selected and a test signal showing the test data is supplied directly to that circuit block.

Here, the memory control unit may (a) acquire a plurality of pieces of selection data from outside the nonvolatile memory microcomputer chip in a one-to-one correspondence with the plurality of pieces of test data, and store each piece of test data and a corresponding piece of selection data in a memory area of the nonvolatile memory having a unique address, each piece of selection data being used for specifying a circuit block that is to be tested using a corresponding piece of test data, and then (b) each time an address signal is given from outside the nonvolatile memory microcomputer chip, control the nonvolatile memory to output a test signal and a selection signal which respectively show a piece of test data and a piece of selection data stored in a memory area having an address shown by the address signal, wherein the drive unit supplies the test signal output from the nonvolatile memory in response to the address signal, to a circuit block that is specified according to the selection signal, to drive the circuit block.

According to the above construction, test data and circuit selection information (selection data) are stored in correspondence in the nonvolatile memory. Hence each circuit block can be tested directly without involving the port.

Here, the memory unit may include a plurality of nonvolatile memories, wherein the memory control unit (a) stores the plurality of pieces of test data in the plurality of nonvolatile memories, and then (b) controls each nonvolatile memory to sequentially output a plurality of test signals which each show a piece of test data out of pieces of test data stored in the nonvolatile memory, in parallel, wherein if two nonvolatile memories out of the plurality of nonvolatile memories are to output test signals showing pieces of test data used for testing a same circuit block, the memory control unit allows one of the two nonvolatile memories to output a test signal and prohibits the other nonvolatile memory from outputting a test signal, and the drive unit supplies a test signal output from each nonvolatile memory, to a circuit block that is to be tested using a piece of test data shown by the test signal, to drive the circuit block.

According to the above construction, two or more circuit blocks in the microcomputer unit can be tested in parallel using two or more pieces of test data which are each stored in a different one of the plurality of nonvolatile memories. This contributes to shorter testing time.

Here, the nonvolatile memory may include: an oscillation circuit operable to generate a first clock signal, wherein the nonvolatile memory microcomputer chip further include: a selection circuit operable to selectively supply one of the first clock signal and a second clock signal which is fed from outside the nonvolatile memory microcomputer chip, to each circuit block in the microcomputer unit.

According to the above construction, one of a clock signal generated by the oscillation circuit in the nonvolatile memory and a clock signal generated by an external crystal oscillation circuit is selectively supplied to the CPU. In this way, a circuit block can be tested with specific clock periodicity. The oscillation circuit here can be realized by an oscillation circuit that is typically used for supplying power to the nonvolatile memory.

Here, the memory control unit may (a) acquire a plurality of pieces of selection data from outside the nonvolatile memory microcomputer chip in a one-to-one correspondence with the plurality of pieces of test data, and store each piece of test data and a corresponding piece of selection data in a memory area of the nonvolatile memory having a unique address, each piece of selection data being used for selecting one of the first clock signal and the second clock signal, and then (b) each time an address signal is given from outside the nonvolatile memory microcomputer chip, control the nonvolatile memory to output a test signal and a selection signal which respectively show a piece of test data and a piece of selection data stored in a memory area having an address shown by the address signal, wherein the selection circuit supplies one of the first clock signal and the second clock signal that is selected according to the selection signal, to each circuit block in the microcomputer unit.

According to the above construction, a clock signal is selected according to selection data stored in the nonvolatile memory. For example, some circuit block can be tested with a clock signal of low speed generated from the oscillation circuit in the nonvolatile memory, according to selection data.

Here, the memory control unit may (a) acquire a plurality of pieces of selection data from outside the nonvolatile memory microcomputer chip in a one-to-one correspondence with the plurality of pieces of test data, and store each piece of test data and a corresponding piece of selection data in a memory area of the nonvolatile memory having a unique address, each piece of selection data being used for selecting a frequency of the first clock signal, and then (b) each time an address signal is given from outside the nonvolatile memory microcomputer chip, control the nonvolatile memory to output a test signal and a selection signal which respectively show a piece of test data and a piece of selection data stored in a memory area having an address shown by the address signal, wherein the oscillation circuit generates the first clock signal having a frequency that is selected from a plurality of predetermined frequencies according to the selection signal.

According to the above construction, a circuit block can be tested with a clock frequency selected from a plurality of clock frequencies. This makes it possible, for example, to test the operating quality of each circuit block with different execution speeds.

Here, the memory control unit may (a) acquire a plurality of pieces of selection data from outside the nonvolatile memory microcomputer chip in a one-to-one correspondence with the plurality of pieces of test data, and store each piece of test data and a corresponding piece of selection data in a memory area of the nonvolatile memory having a unique address, each piece of selection data being used for selecting a delay time, and then (b) each time an address signal is given from outside the nonvolatile memory microcomputer chip, control the nonvolatile memory to output a test signal and a selection signal which respectively show a piece of test data and a piece of selection data stored in a memory area having an address shown by the address signal, wherein the output unit includes: a delay unit operable to delay a test result signal received from a circuit block which is driven by the test signal output from the nonvolatile memory in response to the address signal, by a delay time that is selected from a plurality of predetermined delay times according to the selection signal, and the output unit outputs the delayed test result signal to outside the nonvolatile memory microcomputer chip.

According to the above construction, a circuit block is tested based on a delayed test result signal obtained by delaying a test result signal by a delay time corresponding to a selection signal. For instance, by delaying the test result signal so that the delayed test result signal perfectly synchronizes with an expectation signal if the test result signal is returned from the circuit block at a correct timing, even a slight deviation from the correct timing can be detected.

Since such a delay is provided to the test result signal in the nonvolatile memory microcomputer, it is unnecessary for a test device such as a memory tester to delay the test result signal. This contributes to a more simplified testing environment, by omitting test jigs such as delay lines.

Here, the memory control unit may (a) acquires a plurality of pieces of selection data from outside the nonvolatile memory microcomputer chip in a one-to-one correspondence with the plurality of pieces of test data, and store each piece of test data and a corresponding piece of selection data in a memory area of the nonvolatile memory having a unique address, each piece of selection data being used for selecting a delay time, and then (b) each time an address signal is given from outside the nonvolatile memory microcomputer chip, control the nonvolatile memory to output a test signal and a selection signal which respectively show a piece of test data and a piece of selection data stored in a memory area having an address shown by the address signal, wherein the drive unit includes: a delay unit operable to delay the test signal output from the nonvolatile memory in response to the address signal, by a delay time that is selected from a plurality of predetermined delay times according to the selection signal, and the drive unit supplies the delayed test signal to a circuit block that is to be tested using the piece of test data shown by the delayed test signal, to drive the circuit block.

According to the above construction, a circuit block is tested based on a delayed test signal obtained by delaying a test signal by a delay time corresponding to a selection signal. This makes it easier to evaluate a maximum delay time of an input signal that can be tolerated by the circuit block.

Here, the memory control unit may (a) acquire a plurality of pieces of designation data from outside the nonvolatile memory microcomputer chip in a one-to-one correspondence with the plurality of pieces of test data, and store each piece of test data and a corresponding piece of designation data in a memory area of the nonvolatile memory having a unique address, each piece of designation data being used for designating a voltage, and then (b) each time an address signal is given from outside the nonvolatile memory microcomputer chip, control the nonvolatile memory to output a test signal and a designation signal which respectively show a piece of test data and a piece of designation data stored in a memory area having an address shown by the address signal, wherein the nonvolatile memory microcomputer chip further include: a power supply unit operable to adjust a voltage of external power applied from outside the nonvolatile memory microcomputer chip to a voltage that is designated according to the designation signal to generate internal power, and supply the internal power to a circuit block that is to be tested using the piece of test data shown by the test signal as operating power.

According to the above construction, each circuit block can be tested using various power supply voltages. This is particularly suitable for conducting SHMOO measurements for checking the power supply voltage dependence of each circuit block.

Here, the plurality of circuit blocks in the microcomputer unit may include: a D/A conversion circuit which serves as the power supply unit, wherein the D/A conversion circuit generates the internal power by digital-to-analog converting the piece of designation data shown by the designation signal, and supplies the internal power to the circuit block as the operating power.

According to the above construction, the D/A conversion circuit is used as the power supply unit. This makes it possible to test each circuit block with various power supply voltages, without using a dedicated circuit.

Here, the nonvolatile memory may include a power circuit which serves as the power supply unit, wherein the power circuit includes: a step-up circuit operable to step-up the voltage of the external power; and a voltage adjustment circuit operable to generate the internal power by stepping-down the stepped-up voltage of the external power to the voltage designated according to the designation signal, and supply the internal power to the circuit block as the operating power.

According to the above construction, the power circuit in the nonvolatile memory is used as the power supply unit. This makes it possible to test each circuit block with various power supply voltages, without using a dedicated circuit. Also, since the power circuit in the nonvolatile memory includes the step-up circuit, each circuit block can be tested using power supply voltages that are higher than an external power supply voltage.

Here, the memory control unit may (a) acquire a plurality of pieces of designation data from outside the nonvolatile memory microcomputer chip in a one-to-one correspondence with the plurality of pieces of test data, and store each piece of test data and a corresponding piece of designation data in a memory area of the nonvolatile memory having a unique address, each piece of designation data being used for designating a current, and then (b) each time an address signal is given from outside the nonvolatile memory microcomputer chip, control the nonvolatile memory to output a test signal and a designation signal which respectively show a piece of test data and a piece of designation data stored in a memory area having an address shown by the address signal, wherein the nonvolatile memory microcomputer chip further includes: a current judgment unit operable to judge whether a power supply current applied to the microcomputer unit exceeds a current designated according to the designation signal, and output a current judgment signal showing a result of the judgment, and the output unit receives the current judgment signal from the current judgment unit, and outputs the current judgment signal to outside the nonvolatile memory microcomputer chip together with a test result signal received from a circuit block which is driven by the test signal.

According to the above construction, the current consumption of the microcomputer unit can be checked based on various current standards.

Here, the nonvolatile memory may include: a sense amplifier through which the power supply current passes, and which serves as the current judgment unit, wherein the sense amplifier generates a reference current according to the designation signal, and outputs the current judgment signal based on a comparison between the reference current and the power supply current.

According to the above construction, the sense amplifier in the nonvolatile memory is used as the current comparison unit. This makes it possible to check the current consumption of the microcomputer unit based on various current standards, without using a dedicated circuit.

Here, when a defective signal is given from outside the nonvolatile memory microcomputer chip in response to the test result signal and the expectation signal, the memory control unit may store the address shown by the address signal to a predetermined memory area of the nonvolatile memory, the defective signal indicating that the circuit block is judged as being defective as a result of testing.

According to the above construction, the defective address is written to the nonvolatile memory. Therefore, even if a power failure occurs, the defective address can be read once power has been recovered. This enhances testing flexibility and defect analysis efficiency.

Here, the memory control unit may (a) acquire a plurality of instructions which constitute a program that is executable by the CPU, from outside the nonvolatile memory microcomputer chip, and store each instruction in a memory area of the nonvolatile memory having a unique address, and then (b) when the defective signal is given from outside the nonvolatile memory microcomputer chip, store the address shown by the address signal to the predetermined memory area of the nonvolatile memory, and subsequently supply a control signal to the CPU, the control signal instructing to execute the program from an address of a memory area storing a beginning instruction.

According to the above construction, the defective address is written to the nonvolatile memory. Therefore, even if a power failure occurs, the defective address can be read once power has been recovered. This enhances testing flexibility and defect analysis efficiency. Furthermore, the defect can be analyzed closely through the execution of the analysis program.

Here, the memory control unit may supply a data signal showing a non-operation instruction, to the CPU, wherein the CPU executes the non-operation instruction shown by the data signal a plurality of times to sequentially output address signals which show consecutive addresses, thereby serving as the address generation unit.

According to the above construction, it becomes unnecessary to supply address signals from outside the nonvolatile memory microcomputer. As a result, the number of connection lines between the nonvolatile memory microcomputer and an external test device can be reduced. Since more nonvolatile memory microcomputers can be tested in parallel, the total testing time decreases.

The stated aim can also be achieved by a method for testing a nonvolatile memory microcomputer chip including a microcomputer unit and a nonvolatile memory unit, including: a first test step of storing first test data in the nonvolatile memory unit, and then testing the microcomputer unit using the first test data in the nonvolatile memory unit to judge whether the microcomputer unit is defective; and a second test step of storing, if the microcomputer unit is judged as being defective in the first test step, replacing the first test data in the nonvolatile memory unit with second test data, and then testing the microcomputer unit using the second test data in the nonvolatile memory unit.

According to the above method, test data is supplied from the nonvolatile memory to the microcomputer unit. This enables a memory tester to test the nonvolatile memory microcomputer, with it being possible to reduce the testing cost. Even when the nonvolatile memory has a capacity of storing only test data of one test standard, test data of each of various test standards can be loaded to the nonvolatile memory in turn to test the microcomputer unit. In so doing, the nonvolatile memory microcomputer can be ranked based on the various test standards.

The stated aim can also be achieved by a method for testing a plurality of nonvolatile memory microcomputer chips which each include a microcomputer unit and a nonvolatile memory unit, including: a first test step of selecting a part of the plurality of nonvolatile memory microcomputer chips as test samples, storing first test data for performing testing about at least one test item in a nonvolatile memory unit of each test sample, and then testing a microcomputer unit of each test sample using the first test data stored in the nonvolatile memory unit for each test item; a decision step of deciding, for each test item, whether all of the plurality of nonvolatile memory microcomputer chips need to be tested, based on a result of the testing in the first test step; and a second test step of storing second test data for performing testing about each test item for which all of the plurality of nonvolatile memory microcomputer chips are decided as needing to be tested, to a nonvolatile memory unit of each of the plurality of nonvolatile memory microcomputer chips, and then testing a microcomputer unit of each of the plurality of nonvolatile memory microcomputer chips using the second test data stored in the nonvolatile memory unit.

According to the above method, if the defect rate of some test item is low in the selective testing of the first test step, that test item is omitted in the total testing of the second test step. This shortens the testing time. For example, by executing such testing before taking a chip away from a wafer and then executing total testing once again after packaging, the testing time at the wafer stage can be shortened without a loss of product quality.

The stated aim can also be achieved by a method for testing a first nonvolatile memory microcomputer chip and a second nonvolatile memory microcomputer chip which each include a microcomputer unit and a nonvolatile memory unit, where the first and second nonvolatile memory microcomputer chips are connected so that data stored in a nonvolatile memory unit of the second nonvolatile memory microcomputer chip can be supplied to a microcomputer unit of the first nonvolatile memory microcomputer chip, including: a storage step of storing first test data for performing testing about a first test item in a nonvolatile memory unit of the first nonvolatile memory microcomputer chip, and storing second test data for performing testing about a second test item in the nonvolatile memory unit of the second nonvolatile memory microcomputer chip; a first test step of testing the microcomputer unit of the first nonvolatile memory microcomputer chip using the first test data stored in the nonvolatile memory unit of the first nonvolatile memory microcomputer chip; a supply step of supplying the second test data stored in the nonvolatile memory unit of the second nonvolatile memory microcomputer chip, to the microcomputer unit of the first nonvolatile memory microcomputer chip; and a second test step of testing the microcomputer unit of the first nonvolatile memory microcomputer chip using the second test data supplied from the nonvolatile memory unit of the second nonvolatile memory microcomputer chip.

According to the above method, if the size of test data is greater than a capacity of one nonvolatile memory, the test data is divided into first and second test data and stored separately in nonvolatile memories of first and second nonvolatile memory microcomputers. This being so, the first nonvolatile memory microcomputer can be tested using the first and second test data. This enables extensive testing to be performed without rewriting test data in the nonvolatile memory, which shortens the total testing time.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIG. 30 shows an example of data stored in the nonvolatile memory, before testing a microcomputer unit shown in FIG. 27;

FIG. 38 shows an example of data stored in the nonvolatile memory before testing a microcomputer unit shown in FIG. 34;

FIG. 41 shows an example of data stored in a nonvolatile memory shown in FIG. 39, before testing a microcomputer unit shown in FIG. 39;

FIG. 45 shows an example of data stored in a nonvolatile memory shown in FIG. 43, before testing a microcomputer unit shown in FIG. 43;

FIG. 48 shows an example of data stored in a nonvolatile memory shown in FIG. 47, before testing a microcomputer unit shown in FIG. 47;

FIG. 53 shows an example of data stored in a nonvolatile memory shown in FIG. 51, before testing a microcomputer unit shown in FIG. 51;

FIG. 68A shows an example of data stored in a nonvolatile memory of one nonvolatile memory microcomputer shown in FIG. 67;

FIG. 68B shows an example of data stored in a nonvolatile memory of the other nonvolatile memory microcomputer shown in FIG. 67;

FIG. 69 is a flowchart showing a testing procedure in the twenty-fourth embodiment;

DESCRIPTION OF THE PREFERRED EMBODIMENTS

First Embodiment

The following describes a nonvolatile memory microcomputer to which the first embodiment of the invention relates, with reference to FIGS. 1 to 5.

(Construction)

Figure 1:
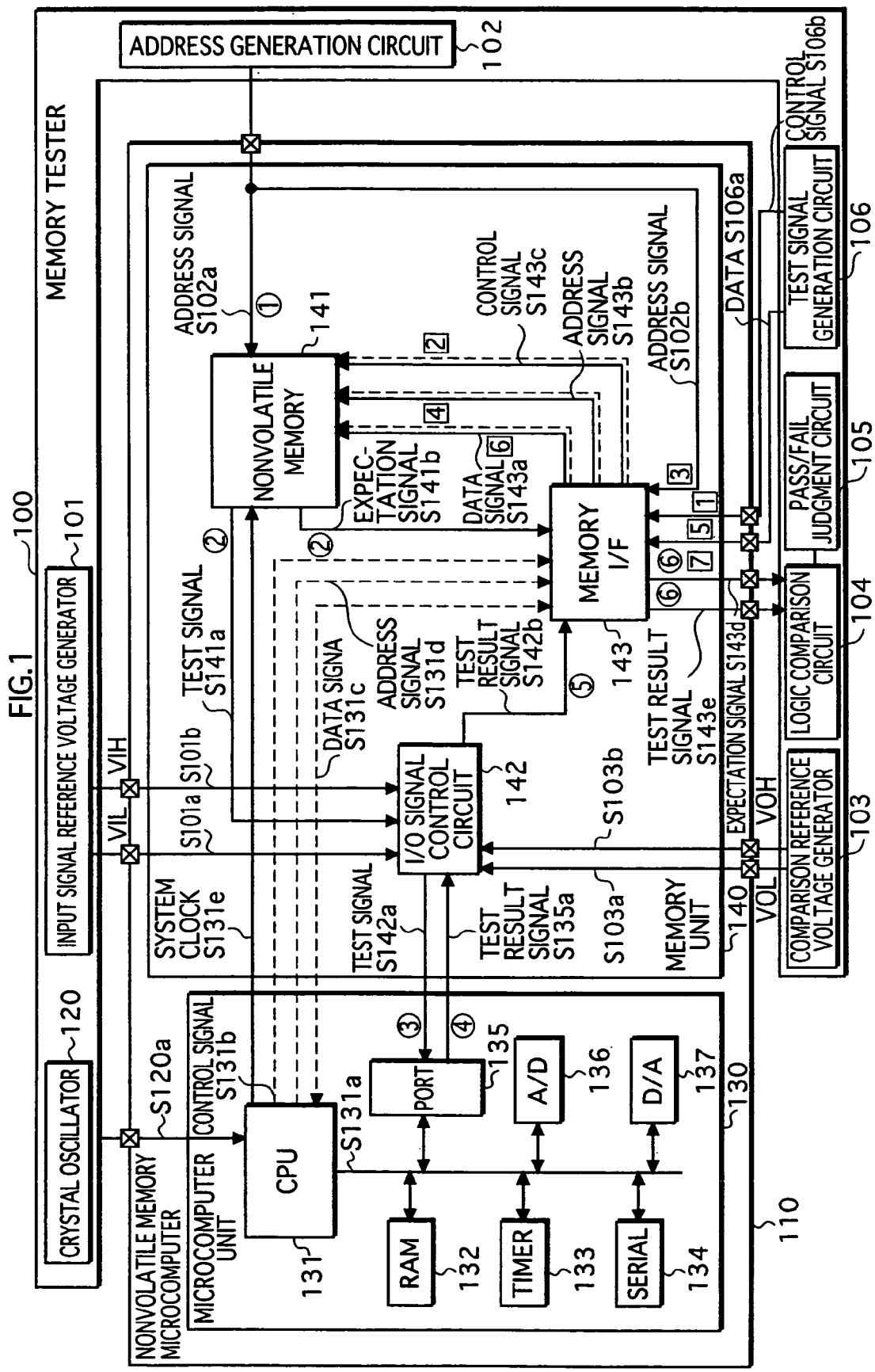
FIG. 1 shows a construction of a nonvolatile memory microcomputer to which the first embodiment of the invention relates.

FIG. 1 shows a construction of a nonvolatile memory microcomputer 110 in the first embodiment.

FIG. 1 also shows a memory tester 100 that is an external device for testing the nonvolatile memory microcomputer 110. In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

The nonvolatile memory microcomputer 110 is roughly made up of a microcomputer unit 130 and a memory unit 140, and is formed as a semiconductor chip. Which is to say, functional blocks such as an I/O signal control circuit 142 and a memory I/F 143 in the nonvolatile memory microcomputer 110 are formed by combining materials including semiconductor so as to achieve their functions.

The nonvolatile memory microcomputer 110 has the following construction. When a normal operation other than testing is performed, the nonvolatile memory microcomputer 110 is constructed so that a CPU 131 in the microcomputer unit 130 accesses data stored in a nonvolatile memory 141 in the memory unit 140 and operates using the data. In this way, the nonvolatile memory microcomputer 110 achieves the same functions as a conventional nonvolatile memory microcomputer. When testing is performed, the nonvolatile memory microcomputer 110 is constructed so that the microcomputer unit 130 can be tested by the memory tester 100 through the use of the functions of the memory unit 140, with there being no need to connect to and use a logic tester.

The microcomputer unit 130 includes circuit blocks such as the CPU 131, a RAM 132, a timer 133, a serial I/F 134 for inputting/outputting serial signals, a port 135 which is an I/F for inputting/outputting a plurality of signals, an A/D converter 136, and a D/A converter 137.

The CPU 131 sends/receives signals S131b, S131c, and S131d to access the nonvolatile memory 141 in the memory unit 140, when a normal operation other than testing is performed. Also, the CPU 131 supplies system clock S131e to the memory unit 140.

The circuit blocks in the microcomputer unit 130 are connected to each other by a bus and the like. This being so, the port 135 outputs a signal received from outside the nonvolatile memory microcomputer 110, to a component in the microcomputer unit 130 or in the memory unit 140 depending on the contents of the signal. Transfer of a signal between the nonvolatile memory microcomputer 110 and the memory tester 100 is actually conducted via the port 135. In FIG. 1, however, signal paths through the port 135 are omitted for simplicity's sake, so that the signal appears to be transferred directly.

Test signal S142a for driving a circuit block in the microcomputer unit 130 is supplied form the memory unit 140 to the circuit block via the port 135. Test result signal S135a showing a driving result is output from the port 135 to the memory unit 140.

The memory unit 140 includes the nonvolatile memory 141, the I/O signal control circuit 142, and the memory I/F 143.

Figure 2:
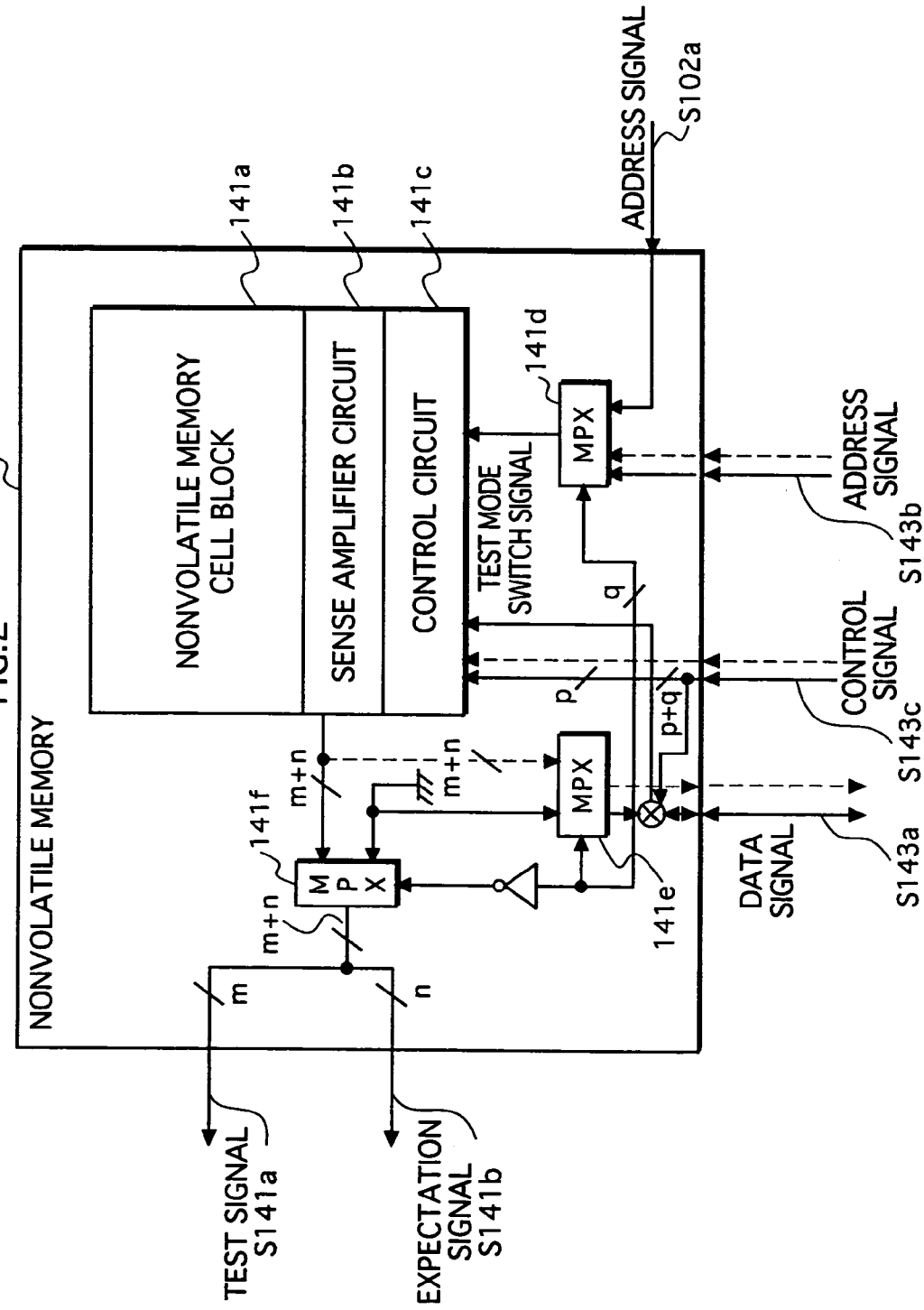
FIG. 2 shows a construction of a nonvolatile memory shown in FIG. 1.

FIG. 2 shows a construction of the nonvolatile memory 141. In the drawing, the dotted arrows indicate signal flows when a normal operation other than testing is performed, whereas the solid arrows indicate signal flows when testing is performed.

The nonvolatile memory 141 includes a nonvolatile memory cell block 141a for storing data, a sense amplifier circuit 141b for outputting data stored in the nonvolatile memory cell block 141a, and a control circuit 141c for controlling the sense amplifier circuit 141b. The nonvolatile memory 141 also includes multiplexers (MPX) 141d, 141e, and 141f for switching between a signal path for inputting an address and a signal path for outputting data, depending on a test mode shown by control signal S143c. The test mode referred to here indicates whether the memory unit 140 or the microcomputer unit 130 is tested, and is set by the memory tester 100.

The nonvolatile memory 141 receives an address signal in sync with system clock S131e.

In detail, when testing the memory unit 140, address signal S143b, data signal S143a, and control signal S143c are supplied to the control circuit 141c. If control signal S143c designates a write, data shown by data signal S143a is written to a cell in the nonvolatile memory cell block 141a at an address shown by address signal S143b. If control signal S143c designates a read, data is read from a cell in the nonvolatile memory cell block 141a at an address shown by address signal S143b via the sense amplifier circuit 141b, and output as data signal S143a. When testing the microcomputer unit 130, on the other hand, address signal S102a is supplied to the control circuit 141c. Data is read from a cell in the nonvolatile memory cell block 141a at an address shown by address signal S102a via the sense amplifier circuit 141b, and output as test signal S141a or expectation signal S141b.

Here, prior to the testing of the microcomputer unit 130, the memory tester 100 writes a test signal string for driving the circuit blocks of the microcomputer unit 130 and an expectation signal string to be compared with driving results of the circuit blocks, to the nonvolatile memory cell block 141a.

This being so, when testing the microcomputer unit 130, the nonvolatile memory 141 receives address signal S102a from the memory tester 100, and responsively outputs test signal S141a and expectation signal S141b respectively to the I/O signal control circuit 142 and the memory I/F 143.

The I/O signal control circuit 142 receives test signal S141a for driving a circuit block in the microcomputer unit 130, from the nonvolatile memory 141. The I/O signal control circuit 142 converts test signal S141a into a high voltage or a low voltage that are determined by an input signal reference voltage supplied from the memory tester 100. The I/O signal control circuit 142 outputs a resulting signal to the port 135 in the microcomputer unit 130 as test signal S142a. Also, the I/O signal control circuit 142 receives test result signal S135a showing a driving result, from the port 135 in the microcomputer unit 130. The I/O signal control circuit 142 converts test result signal S135a into a high voltage or a low voltage that are determined by a comparison reference voltage supplied from the memory tester 100. The I/O signal control circuit 142 outputs a resulting signal to the memory I/F 143 as test result signal S142b.

The memory I/F 143 functions as an interface for the CPU 131 to access the nonvolatile memory 141, when a normal operation other than testing is performed. The memory I/F 143 receives data S106a and control signal S106b for testing the memory unit 140 from the memory tester 100 and sends them to the nonvolatile memory 141, and sends a result showing a driving result to the memory tester 100, when the memory unit 140 is tested. The memory I/F 143 receives expectation signal S141b and test result signal S142b respectively from the nonvolatile memory 141 and the I/O signal control circuit 142, and outputs them to the memory tester 100, when the microcomputer unit 130 is tested.

The memory tester 100 is a device for testing the nonvolatile memory microcomputer 110. The memory tester 100 includes a crystal oscillator 120, an input signal reference voltage generator 101, an address generation circuit 102, a comparison reference voltage generator 103, a logic comparison circuit 104, a pass/fail judgment circuit 105, and a test signal generation circuit 106. In other words, the memory tester 100 incorporates the crystal oscillator 120, the input signal reference voltage generator 101, and the comparison reference voltage generator 103 for testing the microcomputer unit 130, in a conventional memory tester for testing only the memory unit 140.

The input signal reference voltage generator 101 is a circuit capable of generating low voltage VIL and high voltage VIH.

The comparison reference voltage generator 103 is a circuit capable of generating low voltage VOL and high voltage VOH.

The address generation circuit 102 generates an address signal for accessing a cell in the nonvolatile memory cell block 141a in the nonvolatile memory 141, under control of a test control program or the like executed in the memory tester 100.

The test signal generation circuit 106 generates signals, such as a control signal for designating a test mode and the like and a write data signal for testing the nonvolatile memory 141, under control of the test control program or the like.

The logic comparison circuit 104 compares data read from the nonvolatile memory 141 with predetermined expectation data and outputs a comparison result to the pass/fail judgment circuit 105 under control of the test control program or the like, when the memory unit 140 is tested.

The pass/fail judgment circuit 105 judges whether the nonvolatile memory microcomputer 110 is defective or not, depending on the comparison result. The pass/fail judgment circuit 105 informs the user of the memory tester 100 of a judgment result.

Also, the memory tester 100 sends a reset signal to the nonvolatile memory microcomputer 110 to reset the microcomputer unit 130.

(Testing Procedure)

A procedure of testing the nonvolatile memory microcomputer 110 by the memory tester 100 is explained below. This testing procedure is realized, for example, by a control CPU equipped in the memory tester 100 executing a specific test control program to control the components such as the address generation circuit 102.

First, the memory unit 140 is tested. To test the memory unit 140, the memory tester 100 resets the microcomputer unit 130. As a result, the port 135 enters a test state that enables signals to be directly transferred between the memory tester 100 and the memory unit 140.

The test signal generation circuit 106 generates control signal S106b showing the memory unit test mode. Also, as in the conventional memory unit testing method, the address generation circuit 102 generates address signal S102b and supplies it to the memory I/F 143. Meanwhile, the test signal generation circuit 106 supplies data S106a and control signal S106b to the memory I/F 143. The memory I/F 143 receives address signal S102b, data S106a, and control signal S106b, and passes them to the nonvolatile memory 141 respectively as address signal S143b, data signal S143a, and control signal S143c. As a result, data is written to/read from the nonvolatile memory 141.

Data signal S143a output from the nonvolatile memory 141 is passed to the logic comparison circuit 104 via the memory I/F 143, as data signal S143d.

The logic comparison circuit 104 compares the data signal received from the memory unit 140, with an expectation value specified according to the test control program or the like in the memory tester 100. The logic comparison circuit 104 outputs a comparison result to the pass/fail judgment circuit 105. The pass/fail judgment circuit 105 judges whether the nonvolatile memory microcomputer 110 is defective or not, based on the comparison result.

In FIG. 1, boxed numbers 1 to 7 indicate signal flows when the memory unit 140 is tested.

The connection between the memory unit 140 and the microcomputer unit 130 is tested in the same way as the conventional technique.

If the memory unit 140 is judged as being nondefective as a result of testing the memory unit 140 in the above manner, the memory tester 100 writes test data for the microcomputer unit 130, in the nonvolatile memory 141 in the memory unit 140.

Figure 3:
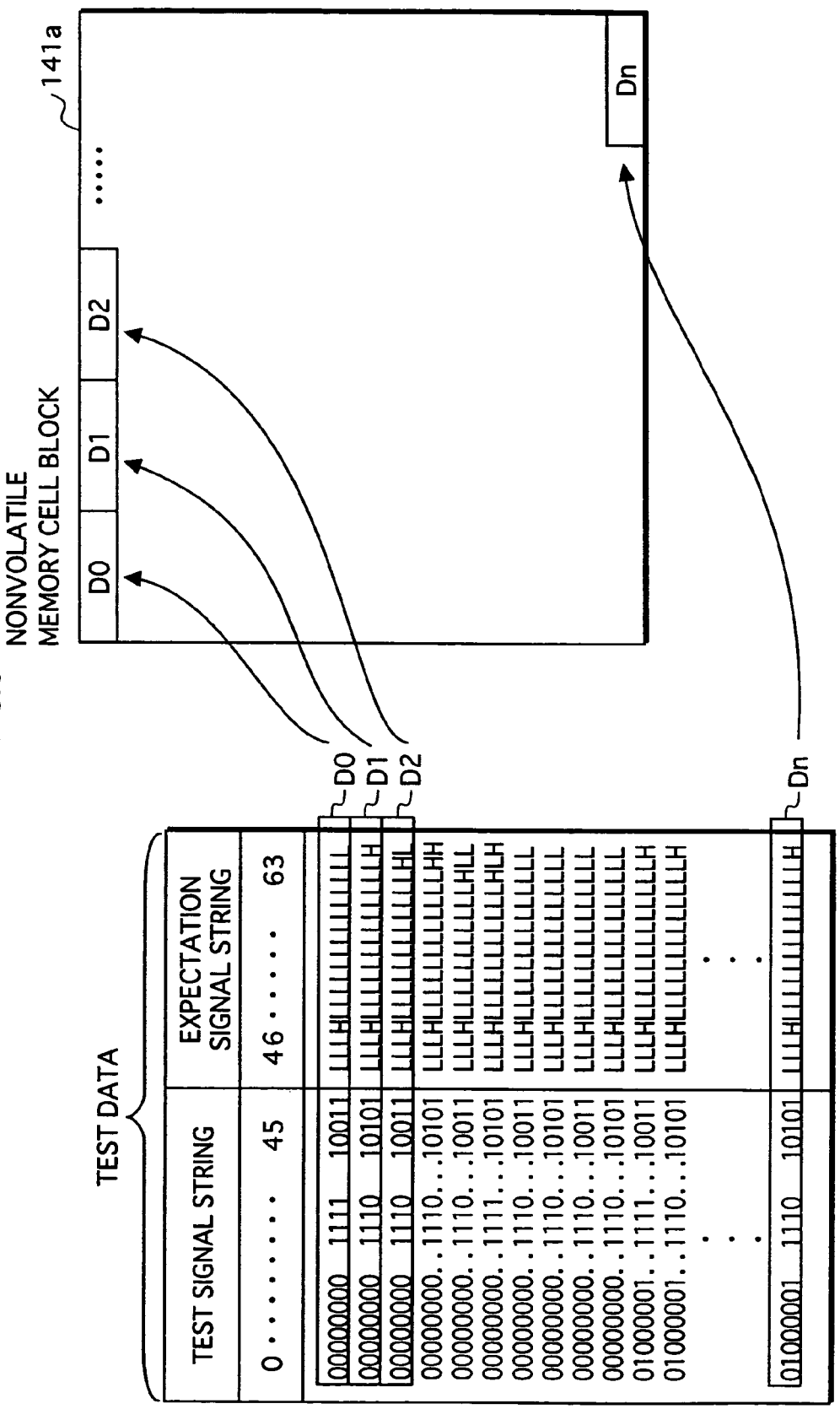
FIG. 3 shows an example of test data stored in the nonvolatile memory before testing a microcomputer unit shown in FIG. 1.

FIG. 3 shows an example of test data stored in the nonvolatile memory 141, prior to testing the microcomputer unit 130.

This test data is written to the nonvolatile memory cell block 141a by the memory tester 100 for testing the microcomputer unit 130. As shown in the drawing, the test data is made up of combinations of test signals and expectation signals. When testing the microcomputer unit 130, each of these combinations is output from the nonvolatile memory 141 as test signal 141a and expectation signal S141b.

Each test signal in the test data is control data for driving a circuit block in the microcomputer unit 130. As one example, each test signal is an instruction to be decoded and executed by the CPU 131. Each expectation signal in the test data is a signal showing an expectation value when the circuit block operates correctly, and is compared with a signal showing an operation result which is output from the circuit block that is driven by the test signal.

The test signal generation circuit 106 outputs such test data to the memory I/F 143, and the memory I/F 143 writes the test data to the nonvolatile memory cell block 141a in the nonvolatile memory 141 in the order of D0, D1, D2, . . . , as shown in FIG. 3.

After writing the test data to the nonvolatile memory 141, the memory tester 100 tests the microcomputer unit 130 using the test data stored in the nonvolatile memory 141.

First, the test signal generation circuit 106 generates control signal S106b showing the microcomputer unit test mode. Also, the crystal oscillator 120 supplies clock signal S120a to the CPU 131. Upon receiving clock signal S120a, the CPU 131 outputs system clock S131e to each component of the memory unit 140 such as the nonvolatile memory 141. Each component of the memory unit 140 operates in sync with system clock S131e.

Following this, the address generation circuit 102 outputs address signal S102a showing a 16-bit address, to the nonvolatile memory 141. In response, the nonvolatile memory 141 outputs data stored in the nonvolatile memory cell block 141a at the address shown by address signal S102a. The higher-order m bits (e.g. m=46) of the data are output to the I/O signal control circuit 142 as test signal S141a, and the lower-order n bits (e.g. n=18) of the data are output to the memory I/F 143 as expectation signal S141b. It is assumed here that each address of the nonvolatile memory cell block 141a is expressed by 16 bits, for ease of explanation.

The I/O signal control circuit 142 receives test signal S141a, and changes a voltage level of test signal S141a based on voltages S101a and S101b applied from the input signal reference voltage generator 101. The I/O signal control circuit 142 outputs a resulting signal to the port 135, as test signal S142a for driving the microcomputer unit 130.

The microcomputer unit 130 operates according to test signal S142a, and returns test result signal S135a showing an operation result to the I/O signal control circuit 142 via the port 135. The operation of the microcomputer unit 130 here is the same as that in the conventional technique where a test signal is input to a port and testing is performed using a logic tester.

The I/O signal control circuit 142 changes a voltage level of test result signal S135a, based on voltages S103a and S103b applied from the comparison reference voltage generator 103. The I/O signal control circuit 142 outputs a resulting signal to the memory I/F 143 as test result signal S142b.

The memory I/F 143 outputs expectation signal S141b received from the nonvolatile memory 141 and test result signal S142b received from the I/O signal control circuit 142, to the logic comparison circuit 104 respectively as expectation signal S143d and test result signal S143e.

The logic comparison circuit 104 compares expectation signal S143d and test result signal S143e, and outputs a comparison result to the pass/fail judgment circuit 105. The pass/fail judgment circuit 105 judges whether the nonvolatile memory microcomputer 110 is defective or not, according to the comparison result. If expectation signal S143d and test result signal S143e do not match at a comparison point in a time period corresponding to system clock S131e, the pass/fail judgment circuit 105 judges the nonvolatile memory microcomputer 110 as being defective.

In FIG. 1, circled numbers 1 to 6 indicate signal flows when the microcomputer unit 130 is tested in the above way.

Figure 4:
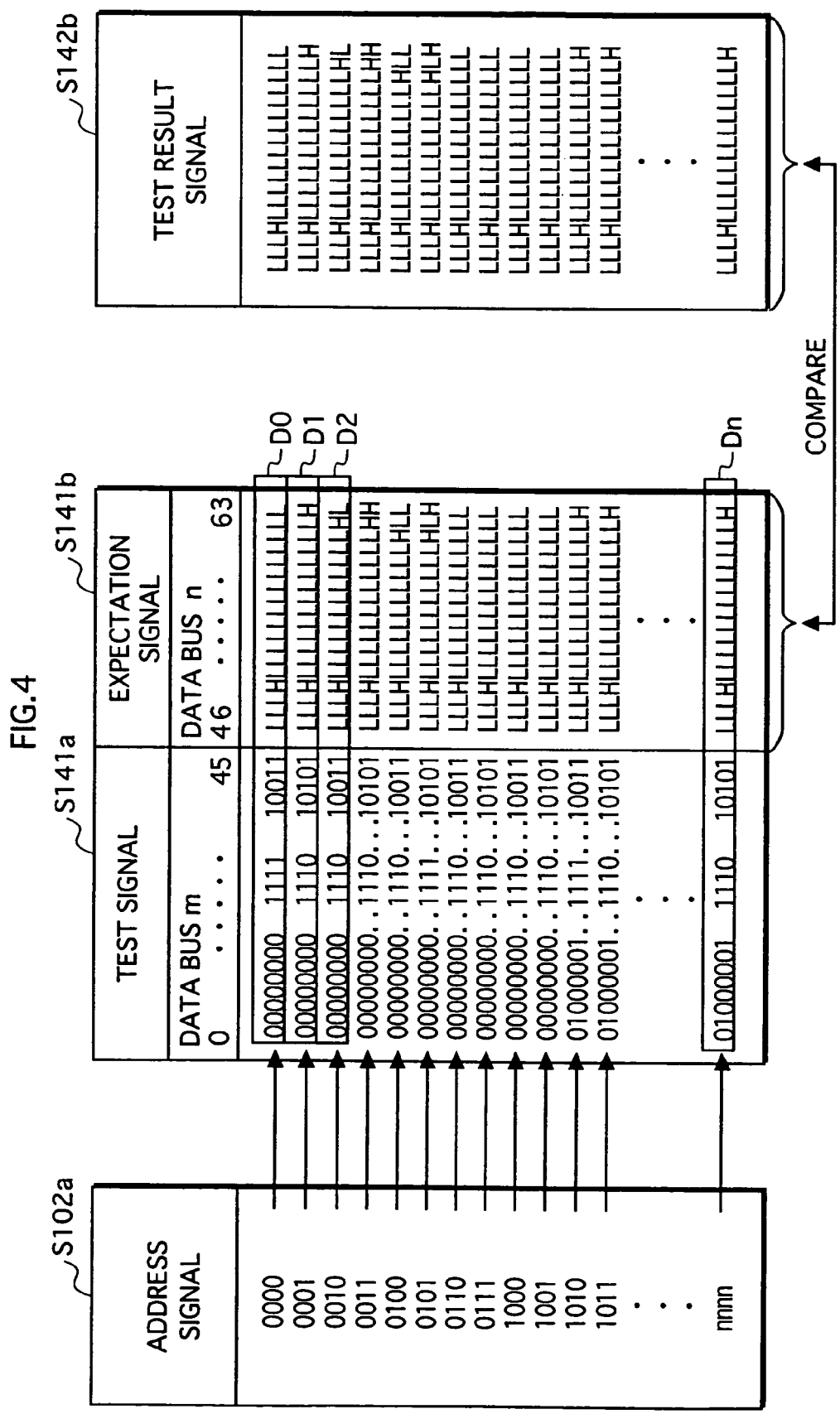
FIG. 4 shows a relationship between main signals which are generated when testing the microcomputer unit.
Figure 5:
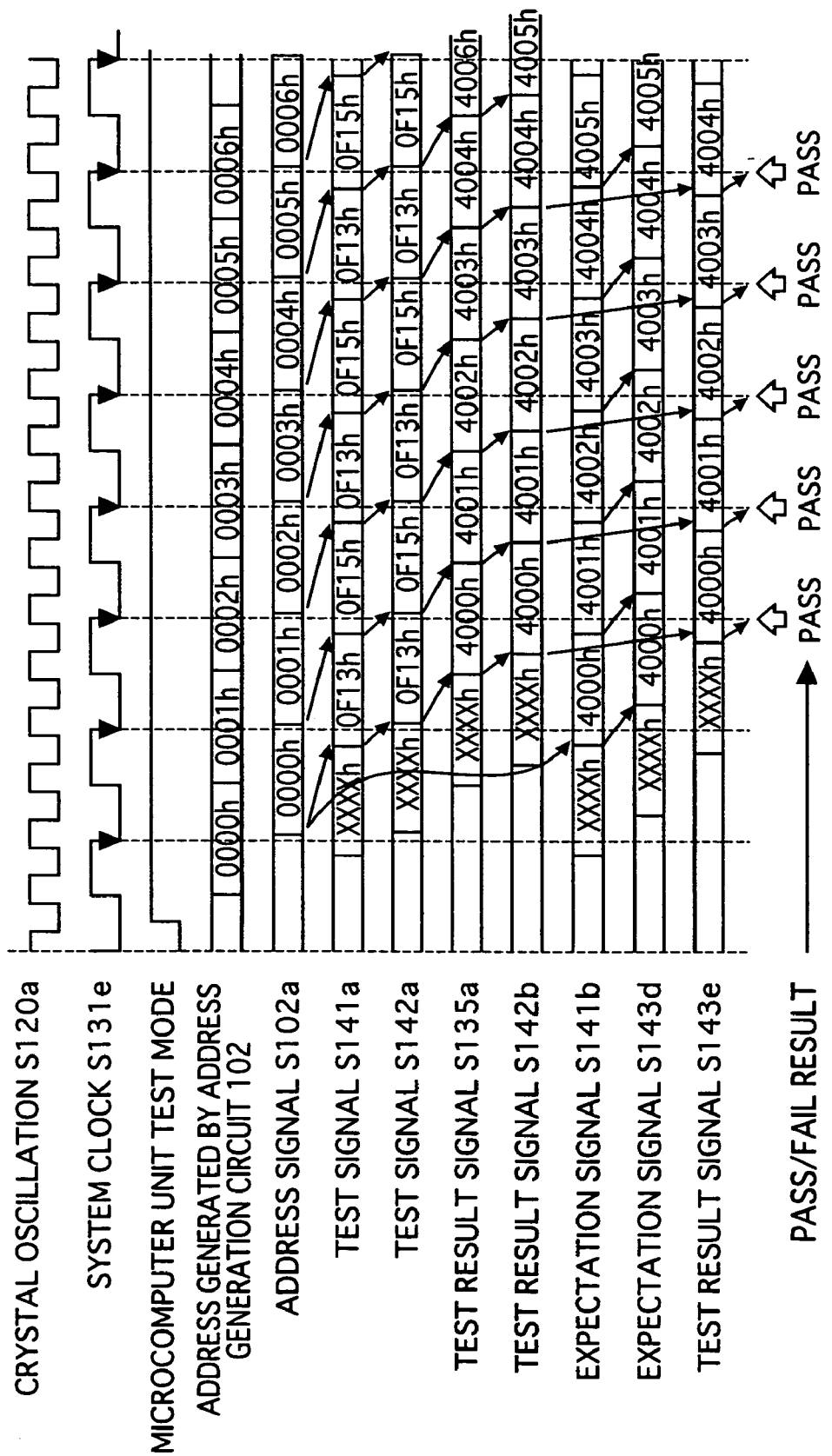
FIG. 5 is a timing chart when testing the microcomputer unit.

The above testing of the microcomputer unit 130 is explained using specific examples of signals, by referring to FIGS. 4 and 5.

FIG. 4 shows a relationship of main signals which are generated when testing the microcomputer unit 130.

Upon receipt of address signal S102a, the nonvolatile memory 141 outputs test signal S141a and expectation signal S141b stored in the nonvolatile memory cell block 141a at an address shown by address signal S102a. The I/O signal control circuit 142 outputs test signal S142a corresponding to test signal S141a to the microcomputer unit 130. The microcomputer unit 130 returns test result signal S135a to the I/O signal control circuit 142. The I/O signal control circuit 142 outputs test result signal S142b corresponding to test result signal S135a to the memory I/F 143. Lastly, the memory I/F 143 outputs expectation signal S143d and test result signal S143e corresponding to expectation signal S141b and test result signal S142b, to the logic comparison circuit 104 for comparison.

FIG. 5 is a timing chart when the microcomputer unit 130 is tested.

In sync with clock signal S120a applied from the crystal oscillator 120, the CPU 131 generates system clock S131e and supplies it to the memory unit 140. This being so, each component of the memory unit 140 performs signal output based on system clock S131e.

Shortly after receiving address signal S102a, the nonvolatile memory 141 simultaneously outputs test signal S141a and expectation signal S141b stored in the nonvolatile memory cell block 141a at an address shown by address signal S102a, respectively to the I/O signal control circuit 142 and the memory I/F 143. Note that test signal S141a and expectation signal S141b are both assumed to be 16 bits in FIG. 5.

For example, shortly after receiving test signal S141a showing a value "0F13h" (hexadecimal), the I/O signal control circuit 142 outputs test signal S142a showing "0F13h", i.e., an instruction, to the microcomputer unit 130. This time delay between test signal S141a and test signal S142a is caused by a transmission delay. The microcomputer unit 130 operates according to the instruction, and outputs test result signal S135a showing "4000h" to the I/O signal control circuit 142. Shortly after receipt of test result signal S135a, the I/O signal control circuit 142 outputs test result signal S142b showing the same value "4000h" to the memory I/F 143. The memory I/F 143 outputs expectation signal S141b showing "4000h" and test result signal S142b showing "4000h", to the logic comparison circuit 104 respectively as expectation signal S143d and test result signal S143e. As a result of comparison by the logic comparison circuit 104, the pass/fail judgment circuit 105 judges the nonvolatile memory microcomputer 110 as being nondefective.

If test result signal S143e and expectation signal S143d do not match in any of a plurality of such comparisons performed in the logic comparison circuit 104, the pass/fail judgment circuit 105 judges the nonvolatile memory microcomputer 110 as being defective.

This embodiment describes an example where an expectation signal is compared with a test result signal obtained in response to a test signal that is paired with the expectation signal in the nonvolatile memory 141. This can be modified as follows. Suppose the transmission delay is high and the performance of the microcomputer unit 130 is low. In such a case, test signals and expectation signals in test data stored in the nonvolatile memory 141 may be arranged such that expectation signal P is compared with test result signal Q obtained in response to a test signal that is paired with an expectation signal which was output from the nonvolatile memory 141 before expectation signal P, to judge whether a circuit block in the microcomputer unit 130 operates correctly according to the test signal.

Second Embodiment

Figure 6:
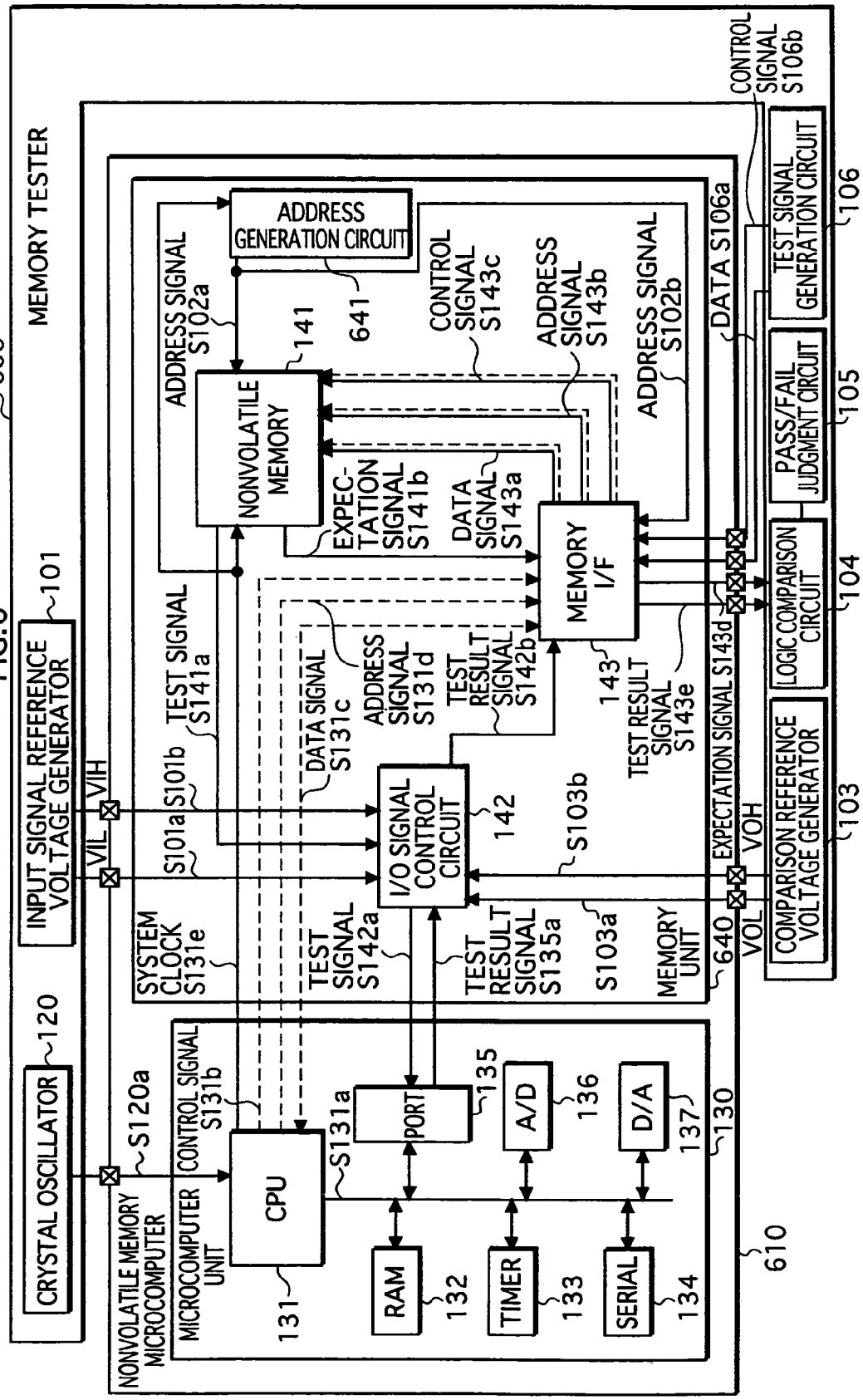
FIG. 6 shows a construction of a nonvolatile memory microcomputer to which the second embodiment of the invention relates.
Figure 7:
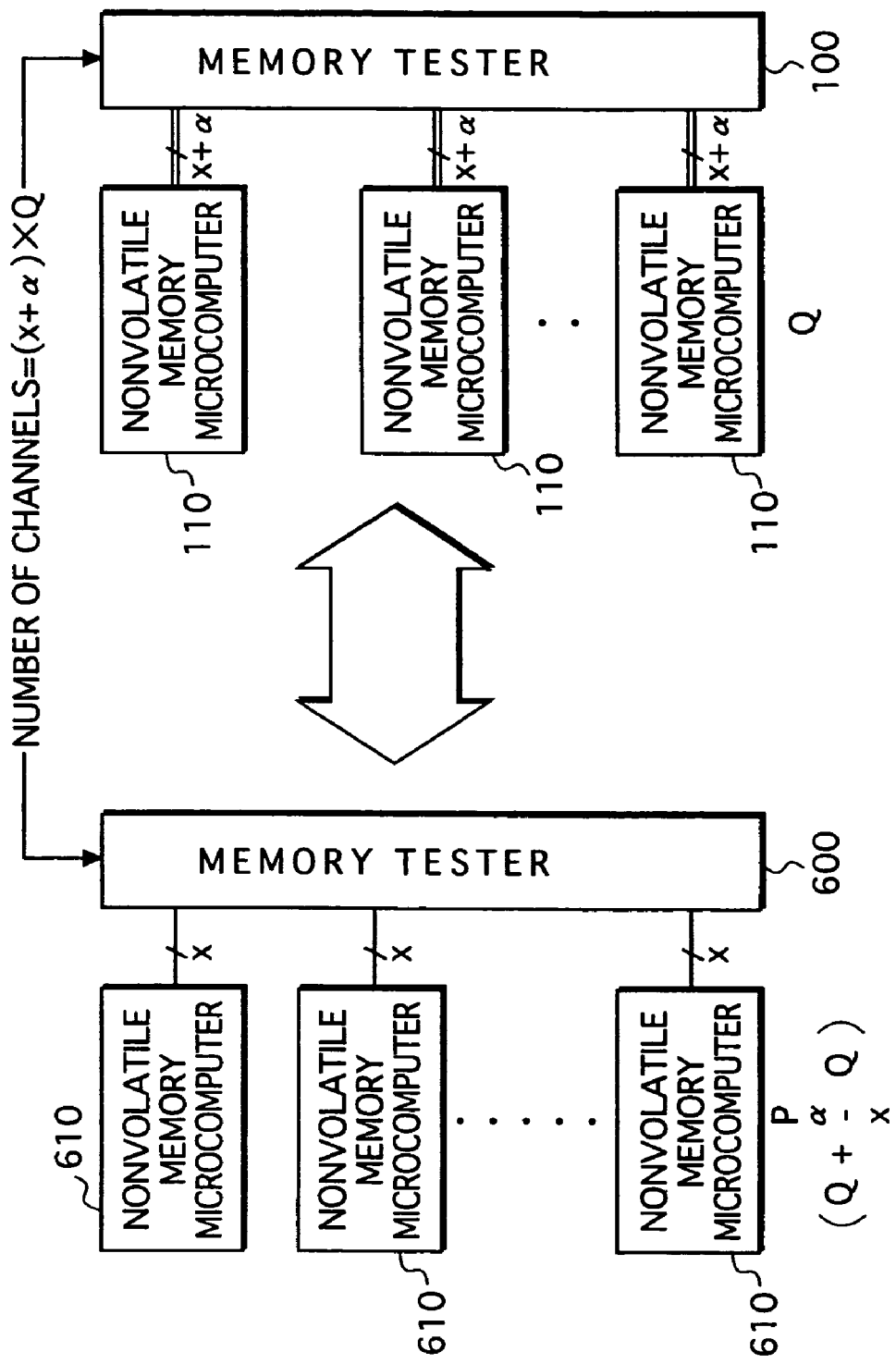
FIG. 7 shows a comparison of the numbers of nonvolatile memory microcomputers that can be tested in parallel by memory testers.

The following describes a nonvolatile memory microcomputer to which the second embodiment of the invention relates, with reference to FIGS. 6 and 7.

FIG. 6 shows a construction of a nonvolatile memory microcomputer 610 in the second embodiment.

FIG. 6 also shows a memory tester 600 that is an external device for testing the nonvolatile memory microcomputer 610. In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

The memory tester 600 differs from the memory tester 100 in the first embodiment shown in FIG. 1, only in that the address generation circuit 102 has been omitted.

The nonvolatile memory microcomputer 610 differs from the nonvolatile memory microcomputer 110 in the first embodiment shown in FIG. 1, only in that the memory unit 140 has been replaced with a memory unit 640 which includes an address generation circuit 641.

In more detail, the nonvolatile memory microcomputer 610 is roughly made up of the microcomputer unit 130 and the memory unit 640. The memory unit 640 includes the nonvolatile memory 141, the I/O signal control circuit 142, the memory I/F 143, and the address generation circuit 641. Components which are the same as those in the nonvolatile memory microcomputer 610 shown in FIG. 1 have been given the same reference numerals and their detailed explanation has been omitted.

The address generation circuit 641 has a counter that increments by 1 in sync with system clock S131e when testing is performed. The address generation circuit 641 outputs the value of the counter to the nonvolatile memory 141 as address signal S102a. When a switch occurs between the microcomputer unit test mode and the memory unit test mode, the address generation circuit 641 resets the counter to 0. The number of bits of the counter is equal to the number of signal lines which are required of address signal S102a by the nonvolatile memory 141.

The nonvolatile memory 141 outputs data stored in the nonvolatile memory cell block 141a at an address shown by address signal S102a that is supplied from the address generation circuit 641 in sync with system clock S131e, as test signal S141a and expectation signal S141b. Based on these signals, the nonvolatile memory microcomputer 610 is tested in the same manner as the nonvolatile memory microcomputer 110 in the first embodiment.

According to this construction, the nonvolatile memory microcomputer 610 can be tested with there being no need to supply an address signal from outside the nonvolatile memory microcomputer 610. Since it is unnecessary to send an address signal from the memory tester 600 to the nonvolatile memory microcomputer 610, the memory tester 600 and the nonvolatile memory microcomputer 610 can be connected with fewer signal lines, i.e. channels, than the memory tester 100 and the nonvolatile memory microcomputer 110 in the first embodiment.

FIG. 7 shows a comparison of the number of nonvolatile memory microcomputers that can be tested in parallel by a memory tester between the first and second embodiments.

Suppose a memory tester has (x+α)×Q signal terminals, i.e., channels. When the memory tester 100 and the nonvolatile memory microcomputer 110 in the first embodiment are connected with a signal lines to transfer an address signal and x signal lines to transfer other signals, then the memory tester 100 can test Q nonvolatile memory microcomputers 110 in parallel. On the other hand, the memory tester 600 and the nonvolatile memory microcomputer 610 in the second embodiment need to be connected with only x signal lines. Accordingly, the memory tester 600 can test Q+Q× (α/x) nonvolatile memory microcomputers 610 in parallel.

According to this embodiment, more nonvolatile memory microcomputers can be tested in parallel by one memory tester having many channel terminals. This has an effect of shortening the total time taken for testing many nonvolatile memory microcomputers.

Third Embodiment

The following describes a nonvolatile memory microcomputer to which the third embodiment of the invention relates, with reference to FIGS. 8 to 11.

Figure 8:
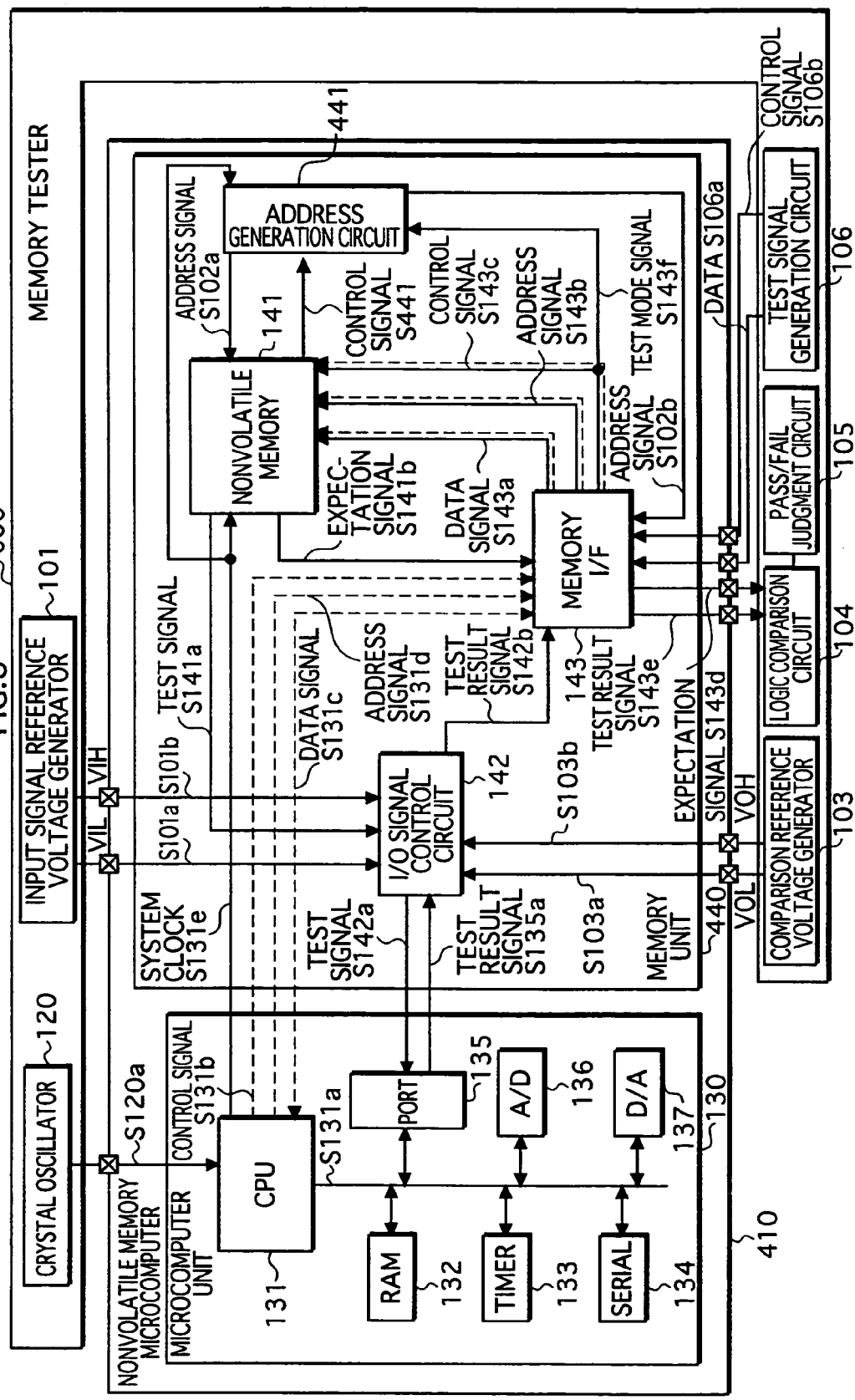
FIG. 8 shows a construction of a nonvolatile memory microcomputer to which the third embodiment of the invention relates.

FIG. 8 shows a construction of a nonvolatile memory microcomputer 410 in the third embodiment.

FIG. 8 also shows the aforedescribed memory tester 600 that is an external device for testing the nonvolatile memory microcomputer 410. In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

The nonvolatile memory microcomputer 410 is fundamentally the same as the nonvolatile memory microcomputer 110 in the first embodiment, but differs in that the memory unit 140 has been replaced with a memory unit 440 which includes an address generation circuit 441.

In more detail, the nonvolatile memory microcomputer 410 is roughly made up of the microcomputer unit 130 and the memory unit 440. The memory unit 440 includes the nonvolatile memory 141, the I/O signal control circuit 142, the memory I/F 143, and the address generation circuit 441. Components which are the same as those in the first embodiment shown in FIG. 1 have been given the same reference numerals and their detailed explanation has been omitted.

Figure 9:
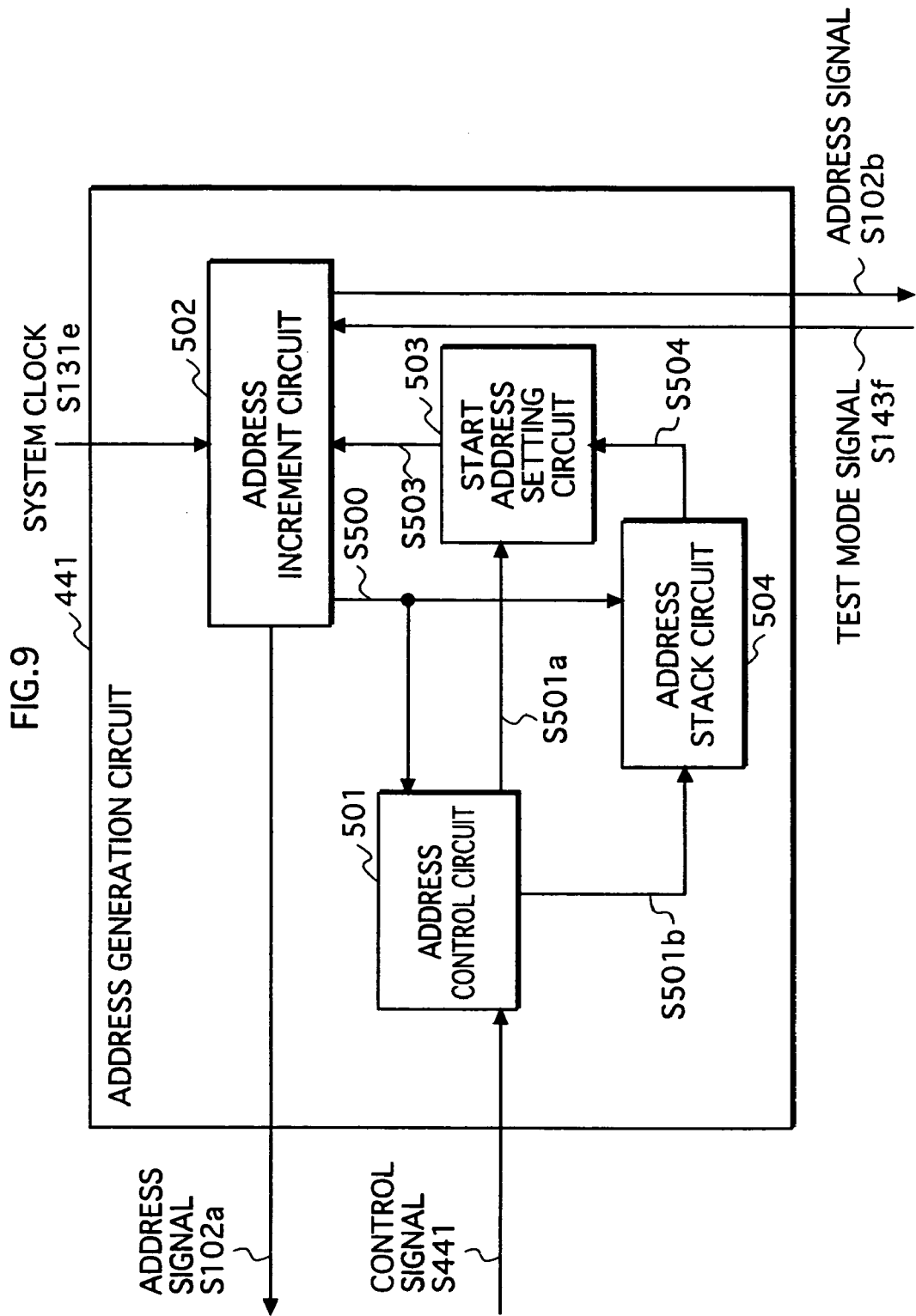
FIG. 9 shows a construction of an address generation circuit shown in FIG. 8.

FIG. 9 shows a construction of the address generation circuit 441.

When testing is performed, the address generation circuit 441 receives control signal S441 from the nonvolatile memory 141, generates address signal S102a according to control signal S441, and outputs it to the nonvolatile memory 141. A main feature of this address generation circuit 441 is the following. The address generation circuit 441 can not only generate a simply incremented address, but also generate an address which has once been generated, to thereby execute a loop.

The address generation circuit 441 includes an address control circuit 501, an address increment circuit 502, a start address setting circuit 503, and an address stack circuit 504, as shown in FIG. 9.

The address control circuit 501 receives 2-bit control signal S441 from the nonvolatile memory 141. The address control circuit 501 outputs the higher-order 1 bit of control signal S441 to the address stack circuit 504 as control signal S501b, and the lower-order 1 bit of control signal S441 to the start address setting circuit 503 as control signal S501a. If control signal S441 is "10", control signal S501b is active, whilst control signal S501a is inactive. If control signal S441 is "01", control signal S501b is inactive, whilst control signal S501a is active. If control signal S441 is "00", control signals S501b and S501a are both inactive.

However, when receiving the same address as a previously received address as address signal S500, the address control circuit 501 sets both control signals S501a and S501b inactive regardless of the value of control signal S441, in order to avoid an infinite loop. Here, the address control circuit 501 can judge whether the address shown by address signal S500 is the same as a previously received address, in the following manner. The address control circuit 501 holds a maximum address. This being so, if the received address is greater than the held address, the address control circuit 501 replaces the held address with the received address. If the received address is not greater than the held address, on the other hand, the address control circuit 501 judges that the received address is the same as a previously received address.

The address increment circuit 502 has a counter with the same number of bits (e.g. 16 bits) as signal lines required of an address signal by the nonvolatile memory 141. Upon receiving start address signal S503 from the start address setting circuit 503, the address increment circuit 502 sets an address shown by start address signal S503 to the counter. The address increment circuit 502 then repeats an operation of outputting the count value to the address control circuit 501 and the address stack circuit 504 as address signal S500 and incrementing the count value by 1, in sync with system clock S131e.

Also, the address increment circuit 502 receives test mode signal S143f which is a part of control signal S143c output from the memory I/F 143 showing a test mode. When test mode signal S143f shows that testing is to be launched, the address increment circuit 502 resets the counter to 0. If test mode signal S143f shows the microcomputer unit test mode, the address increment circuit 502 outputs the count value as address signal S102a, in addition to address signal S500. If test mode signal S143f shows the memory unit test mode, the address increment circuit 502 outputs the count value as address signal S102b, in addition to address signal S500.

The start address setting circuit 503 receives address signal S504 from the address stack circuit 504 and outputs it to the address increment circuit 502 as start address signal S503, when control signal S501a is active.

The address stack circuit 504 has a storage area for storing an address. When control signal S501b is active, the address stack circuit 504 stores an address shown by address signal S500 output from the address increment circuit 504 in the storage area, and outputs the address stored in the storage area as address signal S504.

Figure 10:
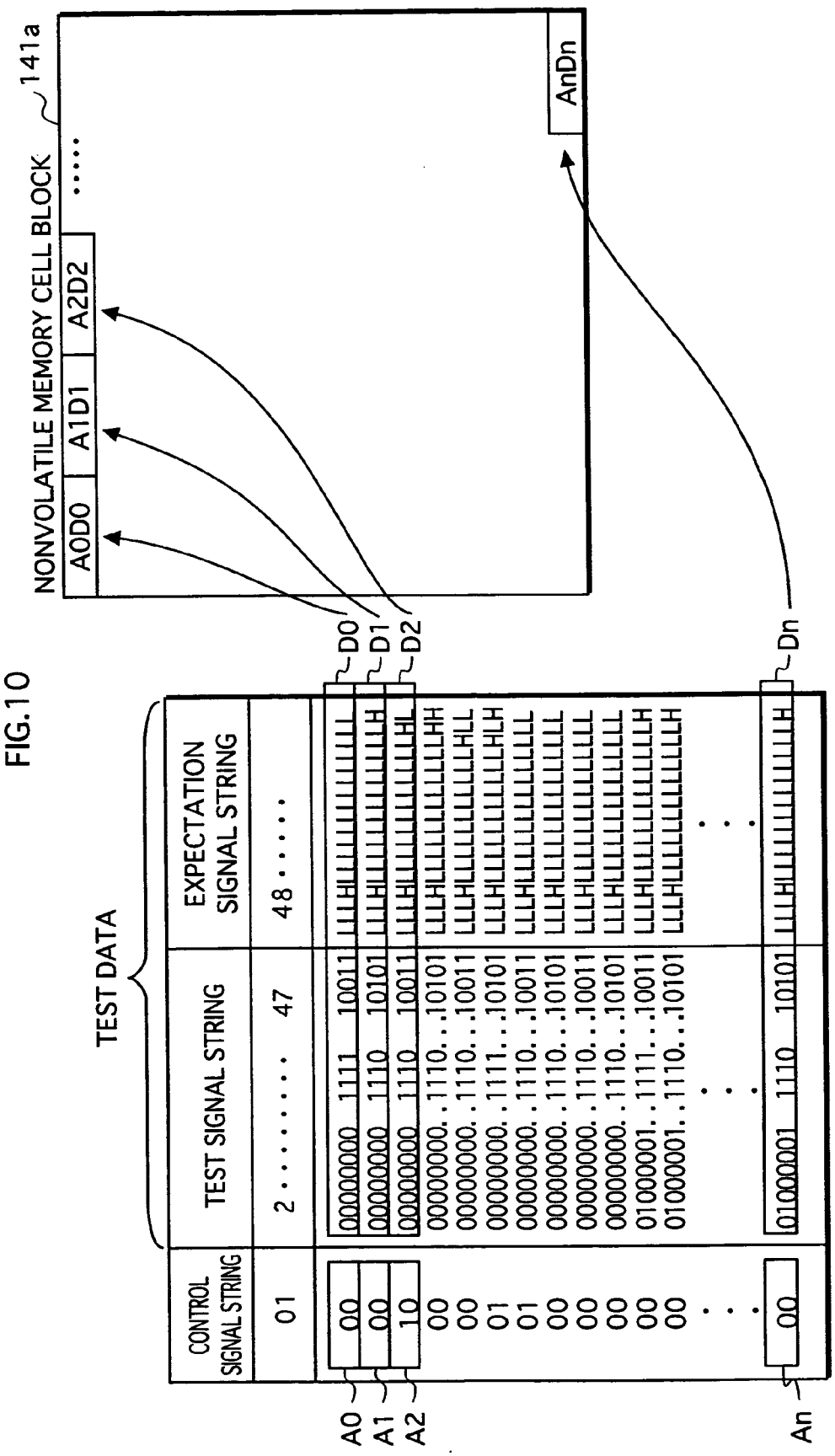
FIG. 10 shows an example of test data and a control signal string stored in a nonvolatile memory shown in FIG. 8, before testing a microcomputer unit shown in FIG. 8.

FIG. 10 shows an example of test data and control signal string stored in the nonvolatile memory 141 shown in FIG. 8.

As shown in the drawing, a control signal string and test data are written to the nonvolatile memory cell block 141a in the nonvolatile memory 141 by the memory tester 600. When testing is performed, these data is output from the nonvolatile memory 141 as control signal S441, test signal S141a, and expectation signal S141b. The meaning of the test data is the same as that in the first embodiment.

Control signal S441 has the following meaning. When the higher-order 1 bit of 2-bit control signal S441 is "1", it indicates that an address of control signal S441 in the nonvolatile memory cell block 141a should be set as a loop start. When the higher-order 1 bit is "0", on the other hand, it indicates that the address should not be set as a loop start. When the lower-order 1 bit of 2-bit control signal S441 is "1", it indicates that control should be shifted to an address which has already been set as a loop start. When the lower-order 1 bit is "0", on the other hand, it indicates that control should not be shifted to such an address.

The test signal generation circuit 106 outputs such a control string and test data to the memory I/F 143, and the memory I/F 143 writes them to the nonvolatile memory cell block 141a in the order of A0D0, A1D1, A2D2, . . . , as shown in FIG. 10.

When the data shown in FIG. 10 is stored in the nonvolatile memory 141, the address generation circuit 441 operates as follows.

After writing the control signal string and the test data to the nonvolatile memory 141, the memory tester 600 outputs test mode signal S143f showing the microcomputer unit test mode, to launch the testing of the microcomputer unit 130.

The address generation circuit 441 resets the counter to 0, and starts incrementing the counter.

Figure 11:
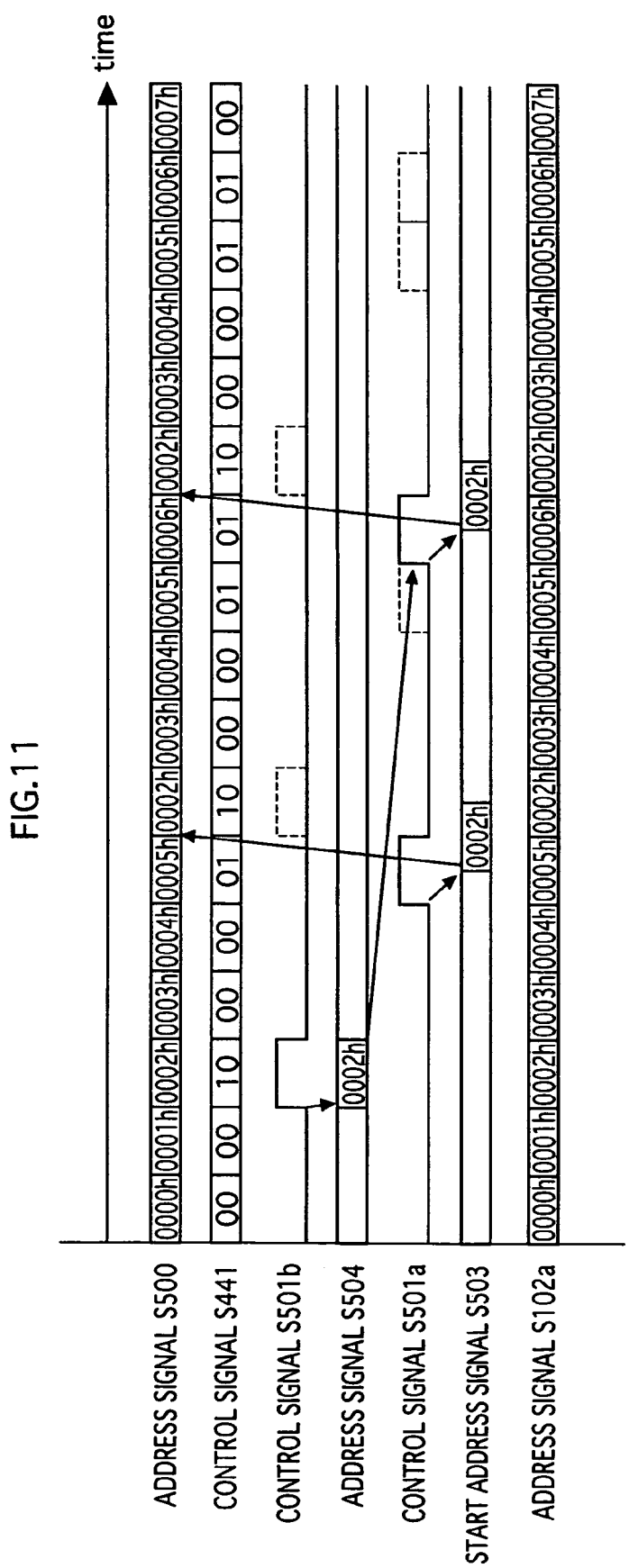
FIG. 11 is a timing chart showing changes of main signals in the address generation circuit.

FIG. 11 is a timing chart showing changes of main signals in the address generation circuit 441.

First, the address increment circuit 502 outputs address signals S500 and S102a showing "0000h".

Upon receipt of address signal S102a showing "1000h", the nonvolatile memory 141 outputs test data D0. Test data D0 is separated into test signal S141a and expectation signal S141b. Thus, each time address signal S102a is input in sync with system clock S131e, the nonvolatile memory 141 outputs test data stored at an address shown by address signal S102a as test signal S141a and expectation signal S141b. Based on these signals, the microcomputer unit 130 is tested according to the procedure explained in the first embodiment.

Upon receipt of address signal S102a showing "0000h", the nonvolatile memory 141 also outputs control signal A0, i.e., 2-bit control signal S441 showing "00", to the address control circuit 501. The address control circuit 501 responsively sets control both signals S501a and S501b inactive.

In the next cycle of system clock S131e, the address increment circuit 502 increments the counter by 1, and outputs address signals S500 and S102a showing "0001h".

Upon receiving address signal S102a showing "0001h", the nonvolatile memory 141 outputs control signal A1, i.e., 2-bit control signal S441 showing "00", to the address control circuit 501. The nonvolatile memory 141 also outputs test data D1 as test signal S141a and expectation signal S141b. Thus, each time address signal S102a is input, the nonvolatile memory 141 outputs test data specified by address signal S102a. A detailed explanation of this process is hereafter omitted.

In the next cycle of system clock S131e, the address increment circuit 502 increments the counter by 1, and outputs address signals S500 and S102a showing "0002h".

Upon receipt of address signal S102a showing "0002h", the nonvolatile memory 141 outputs control signal A2, that is, 2-bit control signal S441 showing "10", to the address control circuit 501. The nonvolatile memory 141 also outputs test data D2 as test signal S141a and expectation signal S141b.

Upon receipt of control signal S441 showing "10", the address control circuit 501 sets control signal S501b to the address stack circuit 504 active. In response, the address stack circuit 504 stores an address "0002h" shown by address signal S500 in the internal storage area, and also outputs the address "0002h" as address signal S504.

Subsequently, the address increment circuit 502 outputs address signals S500 and S102a showing "0003h", "0004h", and "0005h" in sequence, in sync with system clock S131e.

Upon receipt of address signal S102a showing "0005h", the nonvolatile memory 141 outputs 2-bit control signal S441 showing "01", to the address control circuit 501. Upon receiving control signal S441 showing "01", the address control circuit 501 sets control signal S501a to the start address setting circuit 503 active. In response, the start address setting circuit 503 receives address signal S504 showing "0002h" from the address stack circuit 504, and outputs it to the address increment circuit 502 as start address signal S503. The address increment circuit 502 receives start address signal S503 showing "0002h", and outputs address signals S500 and S102a showing "0002h" in the next cycle of system clock S131e.

Upon receiving address signal S102a showing "0002h", the nonvolatile memory 141 outputs control signal A2, i.e. 2-bit control signal S441 showing "10", to the address control circuit 501 again. The address control circuit 501 also receives address signal S500 showing "0002h" from the address increment circuit 502.

Since the address "0002h" shown by address signal S500 is a previously received address, the address control circuit 501 does not set control signal S501b active even though control signal S441 shows "10", so that control signals S501a and S501b both remain inactive. In FIG. 11, broken lines indicate instances where the address control circuit 501 does not set control signal S501a or S501b active since address signal S500 shows a previously received address.

Thus, the address generation circuit 441 generates address signal S102a which sequentially shows "0000h" to "0005h", "0002h" to "0006h", and "0002h" to "0007h" based on the control signal string stored in the nonvolatile memory 141 (see FIG. 11), thereby initiating loops.

According to this embodiment, test data can be repeatedly used, with there being no need to store a plurality of pieces of same test data in the nonvolatile memory 141. This enables a lot of testing to be performed with a smaller amount of data.

Fourth Embodiment

Figure 12:
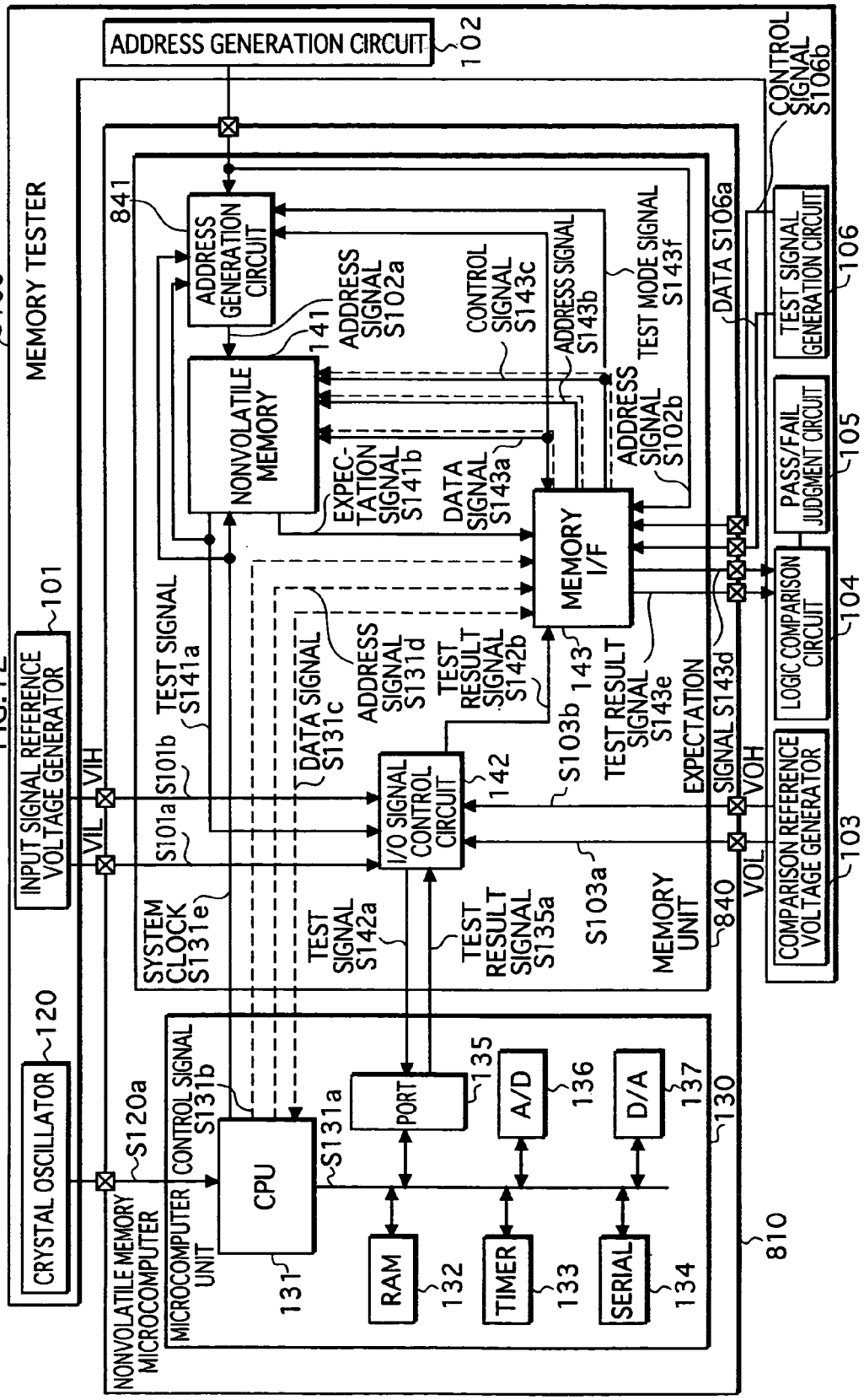
FIG. 12 shows a construction of a nonvolatile memory microcomputer to which the fourth embodiment of the invention relates.
Figure 13:
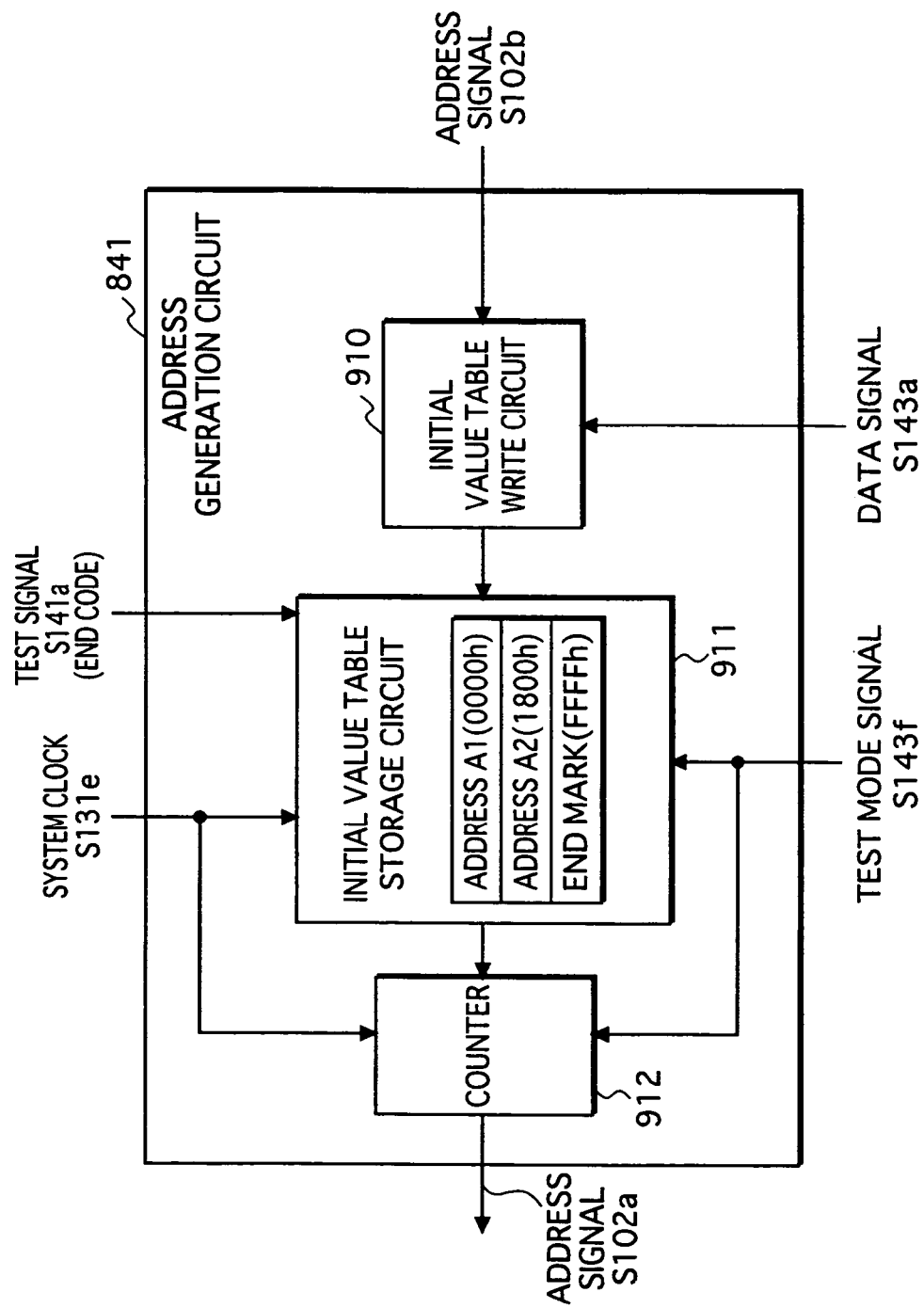
FIG. 13 shows a construction of an address generation circuit shown in FIG. 12.
Figure 14:
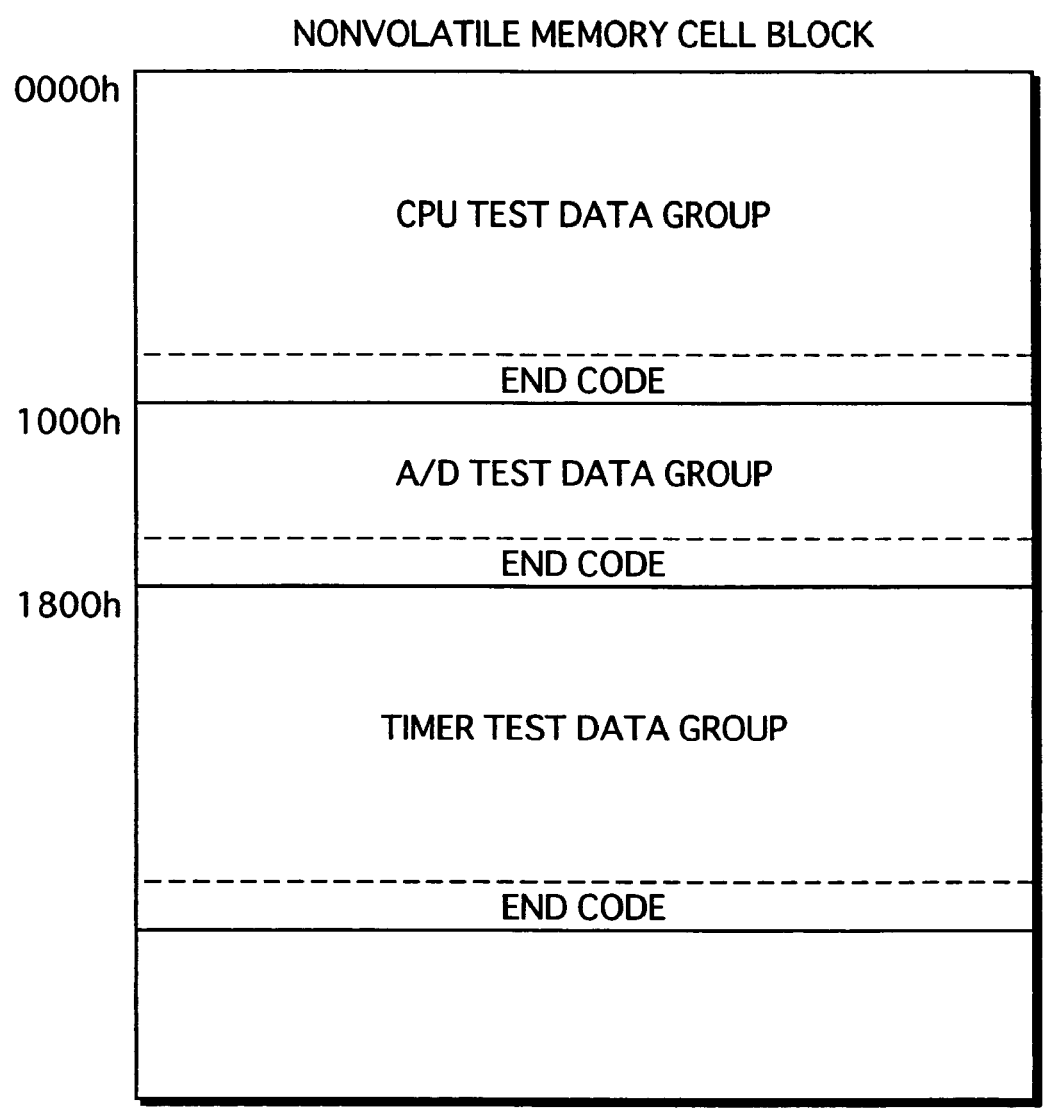
FIG. 14 shows an example of test data stored in a nonvolatile memory shown in FIG. 12, before testing a microcomputer unit shown in FIG. 12.

The following describes a nonvolatile memory microcomputer to which the fourth embodiment of the invention relates, with reference to FIGS. 12 to 14.

FIG. 12 shows a construction of a nonvolatile memory microcomputer 810 in the fourth embodiment.

FIG. 12 also shows the memory tester 100 that is an external device for testing the nonvolatile memory microcomputer 810. In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

The nonvolatile memory microcomputer 810 is fundamentally the same as the nonvolatile memory microcomputer 110 in the first embodiment, and differs only in that the memory unit 140 has been replaced with a memory unit 840 which includes an address generation circuit 841.

In more detail, the nonvolatile memory microcomputer 841 has the microcomputer unit 130 and the memory unit 840. The memory unit 840 includes the nonvolatile memory 141, the I/O signal control circuit 142, the memory I/F 143, and the address generation circuit 841. Components which are the same as those in the first embodiment shown in FIG. 1 have been given the same reference numerals and their detailed explanation has been omitted.

The address generation circuit 841 generates address signal S102a and outputs it to the nonvolatile memory 141, in sync with system clock S131e. After test data for testing the microcomputer unit 130 is stored in the nonvolatile memory 141, the address generation circuit 841 generates address signal S102a in a predetermined order when testing the microcomputer unit 130. This being so, an execution order of test data divided into certain groups is set in advance.

FIG. 13 shows a construction of the address generation circuit 841.

The address generation circuit 841 includes an initial value table write circuit 910, an initial value table storage circuit 911 which contains a rewritable nonvolatile memory, and a counter 912 having the same number of bits (e.g. 16 bits) as signal lines which are required of an address signal by the nonvolatile memory 141.

The initial value table write circuit 910 receives address signal S102b from the address generation circuit 102 and data signal S143a via the memory I/F 143 from the test signal generation circuit 106, and passes them to the initial value table storage circuit 911, under control of the memory tester 100.

The initial value table storage circuit 911 has the following function. If data signal S143a is input from the initial value table write circuit 910 during a period when test mode signal S143f does not show the microcomputer unit test mode, the initial value table storage circuit 911 stores data shown by data signal S143a in the internal memory at an address shown by address signal S102b. In this way, addresses such as A1 and A2 and an end mark (FFFFh) are stored in the internal memory as shown in FIG. 13. Here, the addresses such as A1 and A2 are each a start address of a test data group used for testing a circuit block in the microcomputer unit 130.

When test mode signal S143f is switched to show the microcomputer unit test mode, and subsequently each time test signal S141a shows a predetermined value (end code), the initial value table storage circuit 911 outputs an address stored at the top of the internal memory to the counter 912.

The counter 912 repeats an operation of outputting the count value as address signal S102a and incrementing the count value by 1 in sync with system clock S131e, during a period when test mode signal S143f shows the microcomputer unit test mode.

FIG. 14 shows an example of test data stored in the nonvolatile memory cell block 141a in the nonvolatile memory 141 shown in FIG. 12.

Before testing the microcomputer unit 130, test data having the same basic data structure as that shown in the first embodiment is stored in the nonvolatile memory 141 under control of the memory tester 100. In this embodiment, however, this test data is divided into test data groups for separate circuit blocks in the microcomputer unit 130. A predetermined value indicating the end (end code) is set at the end of each test data group.

In FIG. 14, a CPU test data group, an A/D test data group, and a timer test data group are stored in the nonvolatile memory cell block 141a respectively from addresses 0000h, 1000h, and 1800h. These test data groups are separated from each other by end codes.

Operations of the nonvolatile memory 141 and the address generation circuit 841 when testing the microcomputer unit 130 are explained below.

Once the memory unit 840 has been tested and judged as being nondefective by the memory tester 100 as described in the first embodiment, test data such as that shown in FIG. 14 is stored in the nonvolatile memory 141, and data such as that shown in FIG. 13 is stored in the initial value table storage circuit 911 in the address generation circuit 841.

After this, the test signal generation circuit 106 outputs test mode signal S143f showing the microcomputer unit test mode. As a result, the initial value table storage circuit 911 outputs address A1 (0000h) stored at the top of the internal memory, to the counter 912. The counter 912 outputs the count value to the nonvolatile memory 141 as address signal S102a. Following this, the counter 912 sequentially outputs addresses "0001h", "0002h", . . . which are incremented by 1 in sync with system clock S131e, to the nonvolatile memory 141 as address signal S102a.

As a result, a plurality of pairs of test signal S141a and expectation signal S141b which constitute the CPU test data group are output from the nonvolatile memory 141 in sequence. Based on these signals, the CPU 131 in the microcomputer unit 130 is tested as in the first embodiment. Here, test signal S141a output from the nonvolatile memory 141 is fed not only to the I/O signal control circuit 142 but also to the address generation circuit 841.

When the address generation circuit 841 receives test signal S141a showing an end code, the initial value table storage circuit 911 sets address A2 (1800h) to the counter 912, and the counter 912 outputs the count value to the nonvolatile memory 141 as address signal S102a. Following this, the counter 912 sequentially outputs addresses "1801h", "1802h", . . . which are incremented by 1 in sync with system clock S131e, to the nonvolatile memory 141 as address signal S102a.

As a result, the nonvolatile memory 141 outputs the timer test data group, while skipping the A/D test data group. The timer 133 in the microcomputer unit 130 is tested based on this timer test data group.

Once the entire timer test data group has been output from the nonvolatile memory 141, an end code at the end of the timer test data group is output from the nonvolatile memory 141 to the address generation circuit 841 as test signal S141a. In response, the initial value table storage circuit 911 outputs the end mark (FFFFh) stored in the internal memory to the counter 912, to stop the counter 912 from outputting address signal S102a. Hence the testing of the microcomputer unit 130 ends.

With the provision of the address generation circuit 841, appropriate address signal S102a can be supplied to the nonvolatile memory 141 when testing the microcomputer unit 130, without supply of address signal S102b from outside the nonvolatile memory microcomputer 810. Also, it is possible to omit testing of a particular circuit block.

Consider testing a large number of nonvolatile memory microcomputers 810 which basically have the same construction but some of which do not include the A/D converter 136, in a state where the same test data is stored uniformly in the nonvolatile memory 141 of each nonvolatile memory microcomputer 810. In such a case, the address generation circuit 841 can be effectively used to omit testing the A/D converter 136 for those nonvolatile memory microcomputers 810 which do not include the A/D converter 136.

Fifth Embodiment

Figure 15:
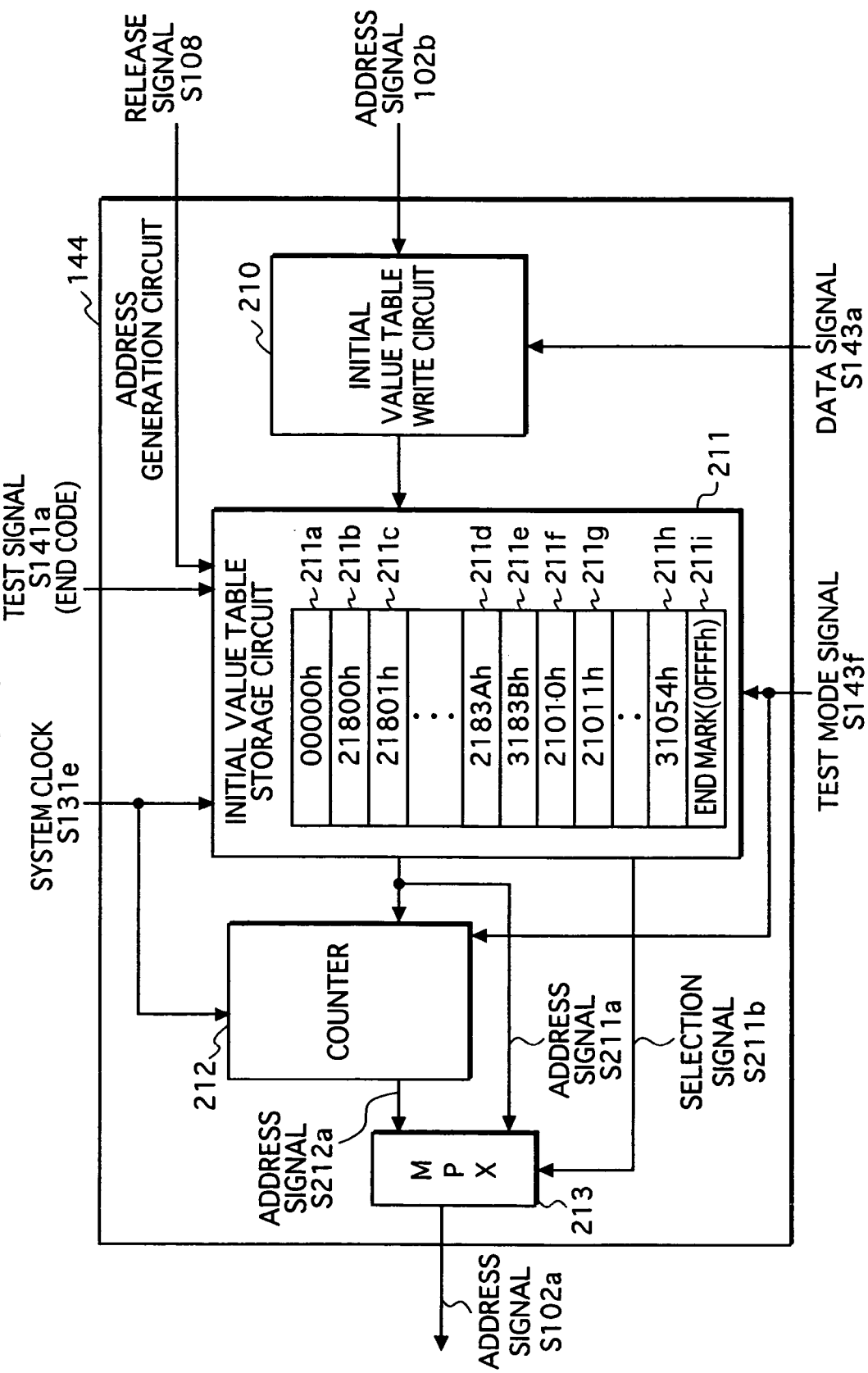
FIG. 15 shows a construction of an address generation circuit to which the fifth embodiment of the invention relates.

The following describes a nonvolatile memory microcomputer to which the fifth embodiment of the invention relates, with reference to FIGS. 12, 14, and 15.

The nonvolatile memory microcomputer of the fifth embodiment is basically the same as the nonvolatile memory microcomputer 810 in the fourth embodiment shown in FIG. 12, and differs only in that the address generation circuit 841 has been replaced with an address generation circuit 144 shown in FIG. 15. Release signal S108 is supplied to this address generation circuit 144 by the user of the memory tester 100 with a given timing.

FIG. 15 shows a construction of the address generation circuit 144.

The address generation circuit 144 includes an initial value table write circuit 210, an initial value table storage circuit 211, a counter 212, and a multiplexer (MPX) 213.

The initial value table write circuit 210 receives address signal S102b from the address generation circuit 102 and data signal S143a via the memory I/F 143 from the test signal generation circuit 106, and outputs them to the initial value table storage circuit 211, under control of the memory tester 100.

The initial value table storage circuit 211 contains are writable nonvolatile memory. The initial value table storage circuit 211 holds addresses 211a–211h of test data groups stored in the nonvolatile memory 141, in this internal memory. In detail, when the initial value table storage circuit 211 receives data signal S143a from the initial value table write circuit 210 during a period where test mode signal S143f does not show the microcomputer unit test mode, the initial value table storage circuit 211 stores data shown by data signal S143a to the internal memory at an address shown by address signal S102b. In this way, addresses 211a–211h and end mark 211i (0FFFFh) are stored in the internal memory as shown in FIG. 15. Here, the lower-order 16 bits of each of addresses 211a–211h are an address of a test data group in the nonvolatile memory 141, and the 18th bit from the least significant bit is a selection value for controlling the MPX 213.

Also, the initial value table storage circuit 211 outputs an address stored at the top of the internal memory, at a predetermined output timing. Here, the lower-order 16 bits of the address are output as address signal S211a, whilst the 18th bit from the least significant bit is output as selection signal S211b.

The predetermined output timing referred to here includes the following (1) to (3):

(1) When test mode signal S143f is switched to show the microcomputer unit test mode.

(2) After (1), each time test signal S141a shows a predetermined value (end code).

(3) When receiving system clock S131e after data in which the 18th bit from the least significant bit is high and the 17th bit from the least significant bit is low is output from the internal memory.

Also, if the initial value table storage circuit 211 receives system clock S131e during a period from when data in which the 18th and 17th bits from the least significant bit are high is output from the internal memory to when release signal S108 is input, the initial value table storage circuit 211 keeps outputting the same data. Upon receiving release signal S108, the initial value table storage circuit 211 outputs the next data.

The counter 212 has the same number of bits (e.g. 16 bits) as signal lines which are required of an address signal by the nonvolatile memory 141. When receiving address signal S211a from the initial value table storage circuit 211 during a period where test mode signal S143f shows the microcomputer unit test mode, the counter 212 sets an address shown by address signal S211a as a count value. The counter 212 then repeats an operation of outputting the count value to the MPX 213 as address signal S212a and incrementing the count value by 1, in sync with system clock S131e.

The MPX 213 selects address signal S211a output from the initial value table storage circuit 211 or address signal S212a output from the counter 212 according to selection signal S211b, and outputs the selected address signal to the nonvolatile memory 141 as address signal S102a. Here, the MPX 213 selects address signal S211a if selection signal S211b is high, and selects address signal S212a if selection signal S211b is low.

Operations of the nonvolatile memory 141 and the address generation circuit 144 when testing the microcomputer unit 130 are explained below.

Once the memory unit 840 has been tested and judged as being nondefective by the memory tester 100 as explained in the first embodiment, test data such as the one shown in FIG. 14 is stored in the nonvolatile memory 141, and data such as the one shown in FIG. 15 is stored in the initial value table storage circuit 211 in the address generation circuit 144. After this, the test signal generation circuit 106 outputs test mode signal S143f showing the microcomputer unit test mode. As a result, the initial value table storage circuit 211 outputs "0000h" which is the lower-order 16 bits of address 211a (00000h) stored at the top of the internal memory, as address signal S211a. The initial value table storage circuit 211 also outputs a low as selection signal S211b, based on the 18th bit from the least significant bit of address 211a.

The counter 212 is set at "0000h". The counter 212 sequentially outputs "0000h", "0001h", "0002h", . . . as address signal S212a, in sync with system clock S131e. Since selection signal S211b is low, the MPX 213 selects address signal S212a and outputs it to the nonvolatile memory 141 as address signal S102a.

As a result, the nonvolatile memory 141 sequentially outputs a plurality of pairs of test signal S141a and expectation signal S141b which constitute the CPU test data group. Based on these signals, the CPU 131 in the microcomputer unit 130 is tested through the I/O signal control circuit 142, the memory I/F 143, and the like. Here, test signal S141a output from the nonvolatile memory 141 is fed not only to the I/O signal control circuit 142 but also to the address generation circuit 144.

Once the entire CPU test data group has been output from the nonvolatile memory 141, the address generation circuit 144 receives test signal S141a showing an end code (see FIG. 14). Upon receipt, the initial value table storage circuit 211 outputs "1800h" which is the lower-order 16 bits of address 211b (21800h) as address signal S211a, and also outputs a high as selection signal S211b based on the 18th bit from the least significant bit of address 211b. The MPX 213 accordingly selects address signal S211a, and outputs it to the nonvolatile memory 141 as address signal S102a.

As a result, the nonvolatile memory 141 outputs the timer test data group, and the timer 133 in the microcomputer unit 130 is tested based on the timer test data group.

Thus, the initial value table storage circuit 211 has output the data in which the 18th bit from the least significant bit is high and the 17th bit from the least significant bit is low. Accordingly, the initial value table storage circuit 211 then outputs "1801h" which is the lower-order 16 bits of address 211c (21801h) as address signal S211a, and also outputs a high as selection signal S211b based on the 18th bit from the least significant bit of address S211c. Accordingly, the MPX 213 selects address signal S211a and outputs it to the nonvolatile memory 141 as address signal S102a.

Subsequently, the initial value table storage circuit 211 outputs the lower-order 16 bits of the next address as address signal S211a, and the MPX 213 selects address signal S211a and outputs it as address signal S102a to the nonvolatile memory 141, in the same manner as above. After this, the initial value table storage circuit 211 outputs "183Bh" which is the lower-order 16 bits of address 211e (3183Bh) as address signal S211a. The 18th and 17th bits from the least significant bit of address 211e are both high. Accordingly, the initial value table storage circuit 211 keeps outputting address signal S211a showing "183Bh", until release signal S108 is received.

Which is to say, until the user of the memory tester 100 outputs release signal S108 to the address generation circuit 144, the address generation circuit 144 continuously outputs address signal S211a showing the same address. Hence the nonvolatile memory 141 keeps outputting the same pair of test signal 141a and expectation signal S141b out of the timer test data group.

Upon receiving release signal S108, the initial value table storage circuit 211 outputs "1010h" which is the lower-order 16 bits of address 211f (21010h) as address signal S211a, and also outputs a high as selection signal S211b based on the 18th bit from the least significant bit of address 211f. The MPX 213 responsively selects address signal S211a and outputs it to the nonvolatile memory 141 as address signal S102a. As a result, the nonvolatile memory 141 outputs a part of the A/D test data group.

Subsequently, when the initial value table storage circuit 211 outputs end mark 211i (0FFFFh), the operation ends.

With the provision of the address generation circuit 144, various control can be exercised on address signal S102a which is supplied to the nonvolatile memory 141.

Sixth Embodiment

Figure 16:
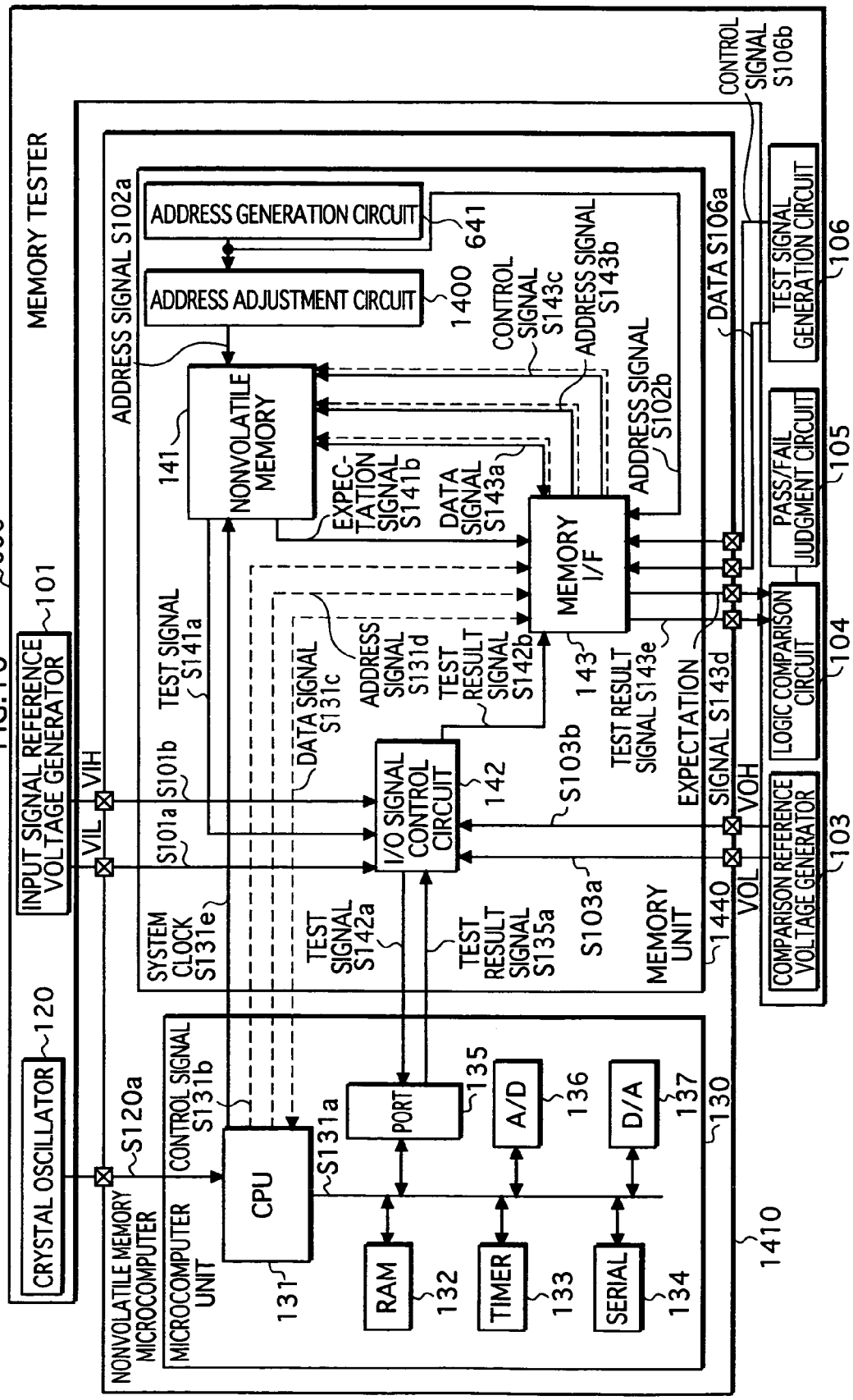
FIG. 16 shows a construction of a nonvolatile memory microcomputer to which the sixth embodiment of the invention relates.
Figure 17:
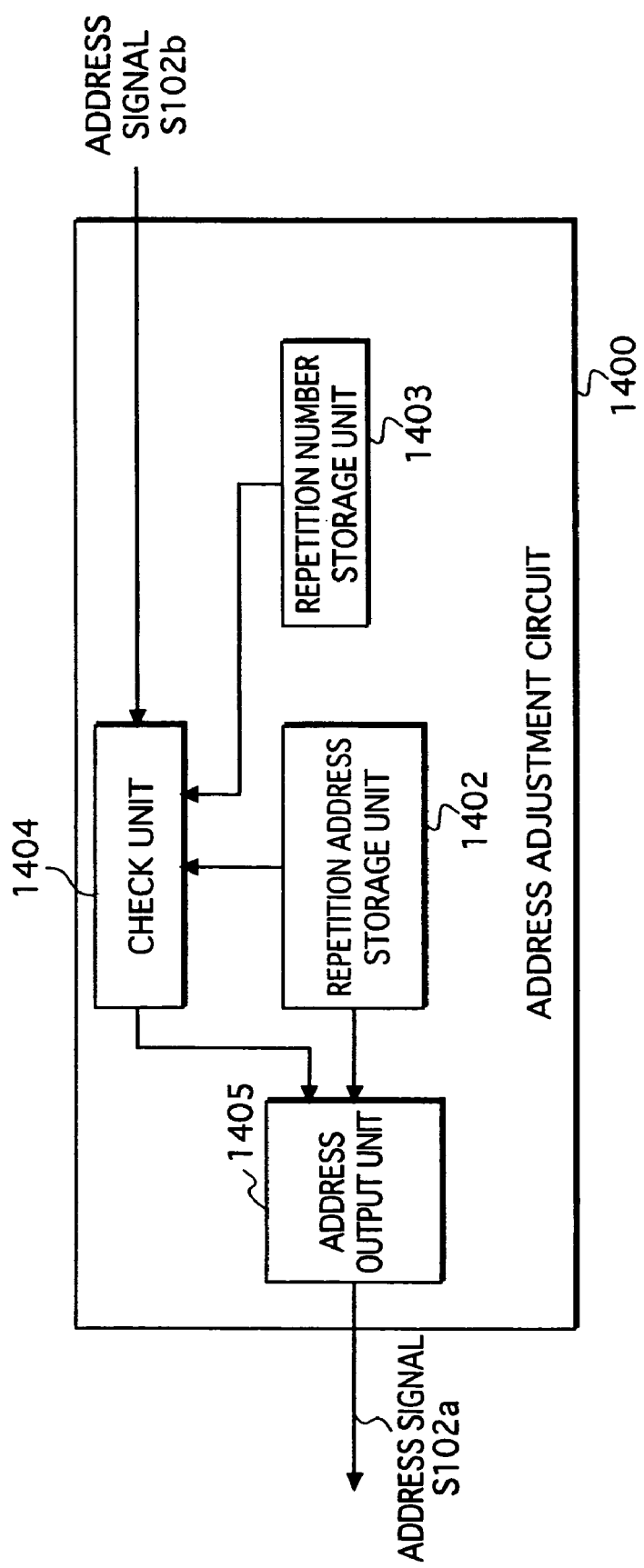
FIG. 17 shows a construction of an address adjustment circuit shown in FIG. 16.

The following describes a nonvolatile memory microcomputer to which the sixth embodiment of the invention relates, with reference to FIGS. 16 and 17.

FIG. 16 shows a construction of a nonvolatile memory microcomputer 1410 in the sixth embodiment.

The nonvolatile memory microcomputer 1410 differs from the nonvolatile memory microcomputer 610 in the second embodiment in that an address adjustment circuit 1400 has been added. The address adjustment circuit 1400 adjusts address signal S102b output from the address generation circuit 641, and outputs a resulting signal as address signal S102a.

FIG. 17 shows a construction of the address adjustment circuit 1400.

The address adjustment circuit 1400 includes a repetition address storage unit 1402, a repetition number storage unit 1403, a check unit 1404, and an address output unit 1405.

The repetition address storage unit 1402 stores a pair of repetition start address and repetition end address in advance.

The repetition number storage unit 1403 stores the number of repetitions to be performed, in advance.

The check unit 1404 receives address signal S102b from the address generation circuit 641, and checks whether an address shown by address signal S102b matches the repetition start address stored in the repetition address storage unit 1402. If they do not match, the check unit 1404 controls the address output unit 1405 to output address signal S102b as address signal S102a. If they match, the check unit 1404 controls the address output unit 1405 to perform an operation of sequentially outputting addresses from the repetition start address to the repetition end address as address signal S102a, one address at a time when address signal S102b is received. The check unit 1404 controls the address output unit 1405 to perform this operation the same number of times as the repetition number stored in the repetition number storage unit 1403.

The address output unit 1405 has a counter, and outputs address signal S102a under control of the check unit 1404.

Suppose a circuit block which needs to be tested regularly, such as the RAM 132, is tested ten times using test data stored in the nonvolatile memory 141 from addresses 0100h to 0150h. In such a case, the repetition start address and the repetition end address in the repetition address storage unit 1402 are set at "0100h" and "0150h" respectively, and the repetition number in the repetition number storage unit 1403 is set at "10". This being so, when the address generation circuit 641 sequentially outputs addresses which are incremented by 1 starting with 0000h as address signal S102b in sync with system clock S131e, the address adjustment circuit 1400 sequentially outputs addresses 0000h to 0150h as address signal S102a in sync with system clock S131e. After outputting address 0150h, the address adjustment circuit 1400 sequentially outputs addresses 0100h to 0150h as address signal S102a again, in sync with system clock S131e. The address adjustment circuit 1400 repeats this sequential output of addresses 0100h to 0150h ten times. Here, if a value such as FFFFh which indicates no limit is set in the repetition number storage unit 1403 beforehand, the address adjustment circuit 1400 indefinitely repeats outputting a fixed set of addresses.

This makes it unnecessary to store a plurality of pieces of same test data in the nonvolatile memory 141, when the same test data is repeatedly used to test the microcomputer unit 130.

Seventh Embodiment

Figure 18:
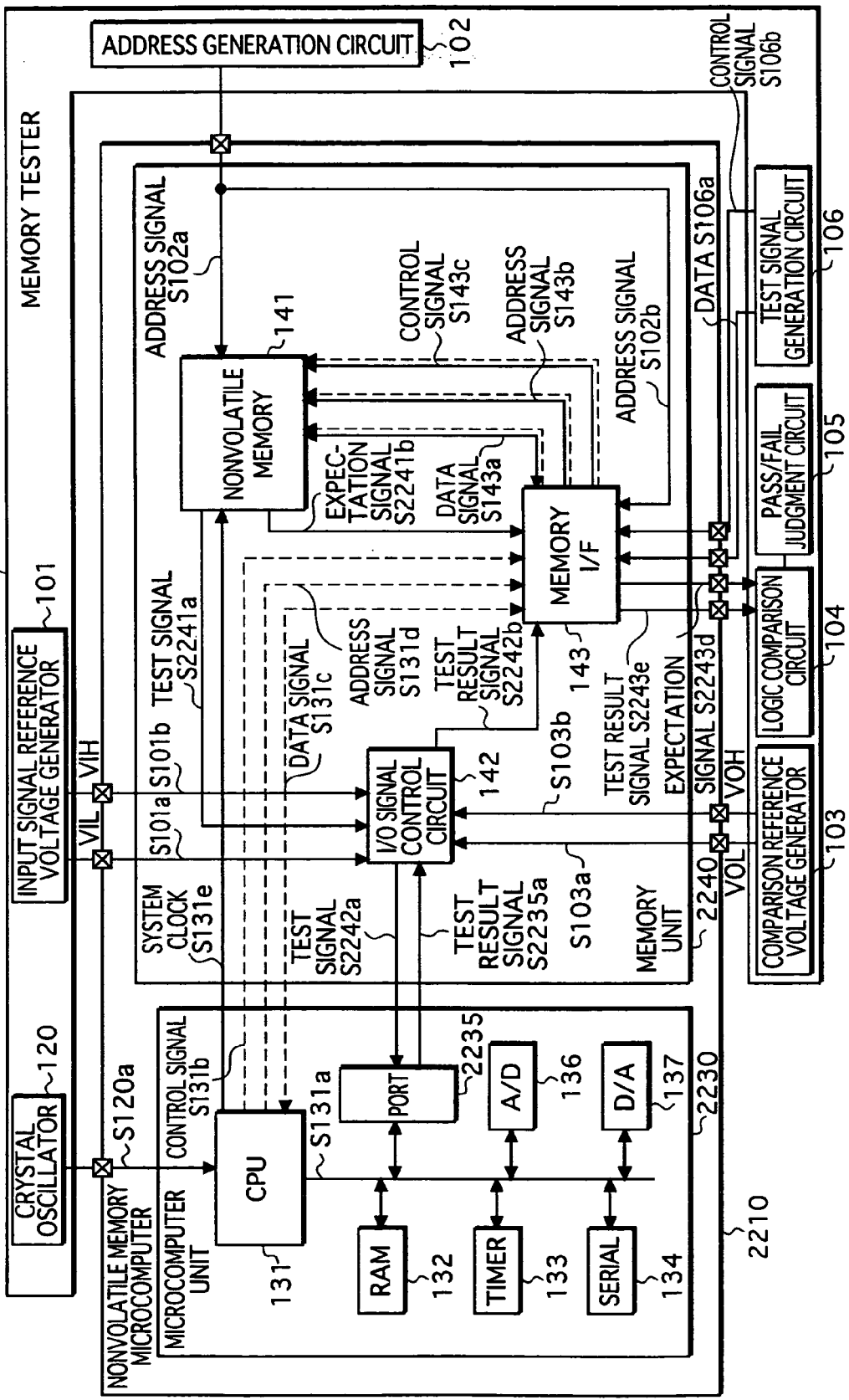
FIG. 18 shows a construction of a nonvolatile memory microcomputer to which the seventh embodiment of the invention relates.
Figure 19:
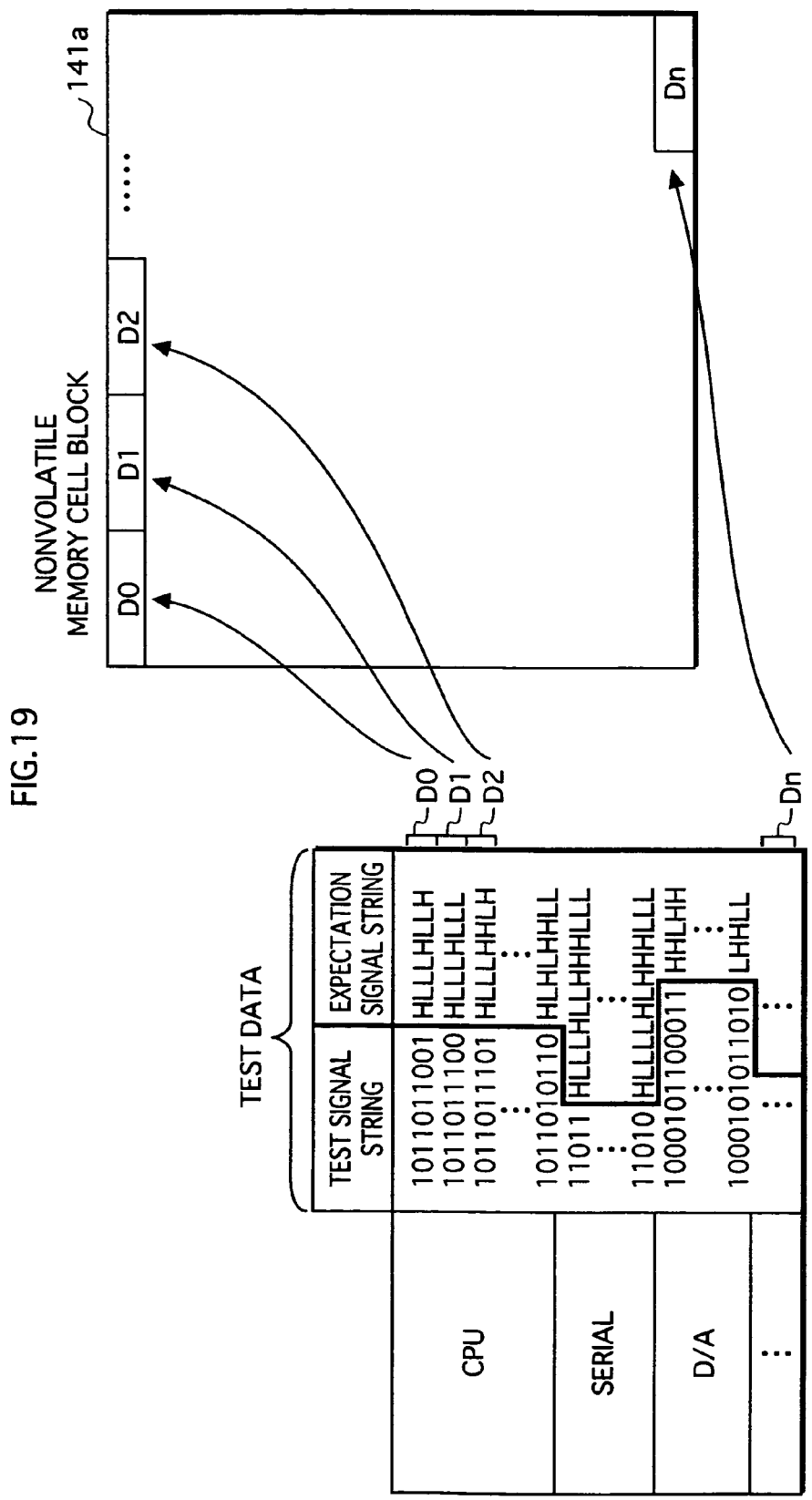
FIG. 19 shows an example of test data stored in a nonvolatile memory shown in FIG. 18, before testing a microcomputer unit shown in FIG. 18.

The following describes a nonvolatile memory microcomputer to which the seventh embodiment of the invention relates, with reference to FIGS. 18 and 19.

FIG. 18 shows a construction of a nonvolatile memory microcomputer 2210 in the seventh embodiment. FIG. 19 shows an example of test data stored in the nonvolatile memory 141 prior to the testing of a microcomputer unit 2230. Note that the test data is expressed with fewer bits in FIG. 19 for convenience's sake.

The nonvolatile memory microcomputer 2210 is a modification to the nonvolatile memory microcomputer 110 in the first embodiment. Components which are the same as those in the first embodiment shown in FIG. 1 have been given the same reference numerals and their explanation has been omitted.

The nonvolatile memory microcomputer 2210 is roughly made up of the microcomputer unit 2230 and a memory unit 2240. The microcomputer unit 2230 includes the CPU 131, the RAM 132, the timer 133, the serial I/F 134, a port 2235, the A/D converter 136, and the D/A converter 137. The memory unit 2240 includes the nonvolatile memory 141, the I/O signal control circuit 142, and the memory I/F 143.

A main feature of the nonvolatile memory microcomputer 2210 lies in that the bit allocation of test data used for testing the microcomputer unit 2230 is not uniform. In other words, the bit allocation between a test signal which is an instruction to a circuit block in the microcomputer unit 2230 and an expectation signal which is to be compared with a test result signal in response to the test signal is not fixed in this embodiment.

This being so, the nonvolatile memory 141 outputs the maximum number of bits that can be used as a test signal from the nonvolatile memory cell block 141a at an address shown by address signal S102a, to the I/O signal control circuit 142 as test signal S2241a. The nonvolatile memory 141 also outputs the maximum number of bits that can be used as an expectation signal from the nonvolatile memory cell block 141a at the address shown by address signal S102a, to the memory I/F 143 as expectation signal S2241b.

Suppose test data which is composed of a pair of test signal and expectation signal is 64 bits. In this case, the nonvolatile memory 141 outputs the 64-bit test data to the I/O signal control circuit 142 via a 64-bit signal line as test signal S2241a, and also outputs the same 64-bit test data to the memory I/F 143 via a 64-bit signal line as expectation signal S2241b.

The I/O signal control circuit 142 changes a voltage level of test signal S2241a output from the nonvolatile memory 141 to drive a circuit block in the microcomputer unit 2230, into a high voltage or a high voltage that are determined based on an input signal reference voltage applied from the memory tester 100. The I/O signal control circuit 142 outputs a resulting signal to the port 2235 as test signal S2242a. The I/O signal control circuit 142 then receives test result signal S2235a showing an operation result from the port 2235, and converts it into a high voltage or a low voltage that are determined based on a comparison reference voltage applied from the memory tester 100. The I/O signal control circuit 142 outputs a resulting signal to the memory I/F 143 as test result signal S2242b.

As shown in FIG. 19, the bit allocation between a test signal and an expectation signal differs for a different circuit block. The port 2235 prestores information showing the bit allocation for each circuit block. In detail, the port 2235 prestores information showing a correspondence between bit patterns and bit lengths of test signals. This being so, upon receiving test signal S2242a, the port 2235 compares test data shown by test signal S2242a with each stored bit pattern, to identify a circuit block that is to be tested using the test data. The port 2235 supplies a test signal of a corresponding bit length included in the test data, to the circuit block. The port 2235 then receives an operation result from the circuit block, writes the operation result in the test data over an expectation signal, and outputs a 64-bit result to the I/O signal control circuit 142 as test result signal S2235a.

The memory I/F 143 receives 64-bit expectation signal S2241b from the nonvolatile memory 141, and 64-bit test result signal S2242b from the I/O signal control circuit 142. The memory I/F 143 outputs them to the logic comparison circuit 104 in the memory tester 100 as expectation signal S2243d and test result signal S2243e. The logic comparison circuit 104 compares expectation signal S2243d and test result signal S2243e.

In the first embodiment, the bit allocation between a test signal and an expectation signal is fixed, and the test signal and the expectation signal are sent through separate signal lines under hardware control. In the seventh embodiment, on the other hand, the bit allocation between a test signal and an expectation signal is software-controlled. This allows the bit allocation between a test signal and an expectation signal to be varied for each circuit block in the microcomputer unit 2230.

Eighth Embodiment

Figure 20:
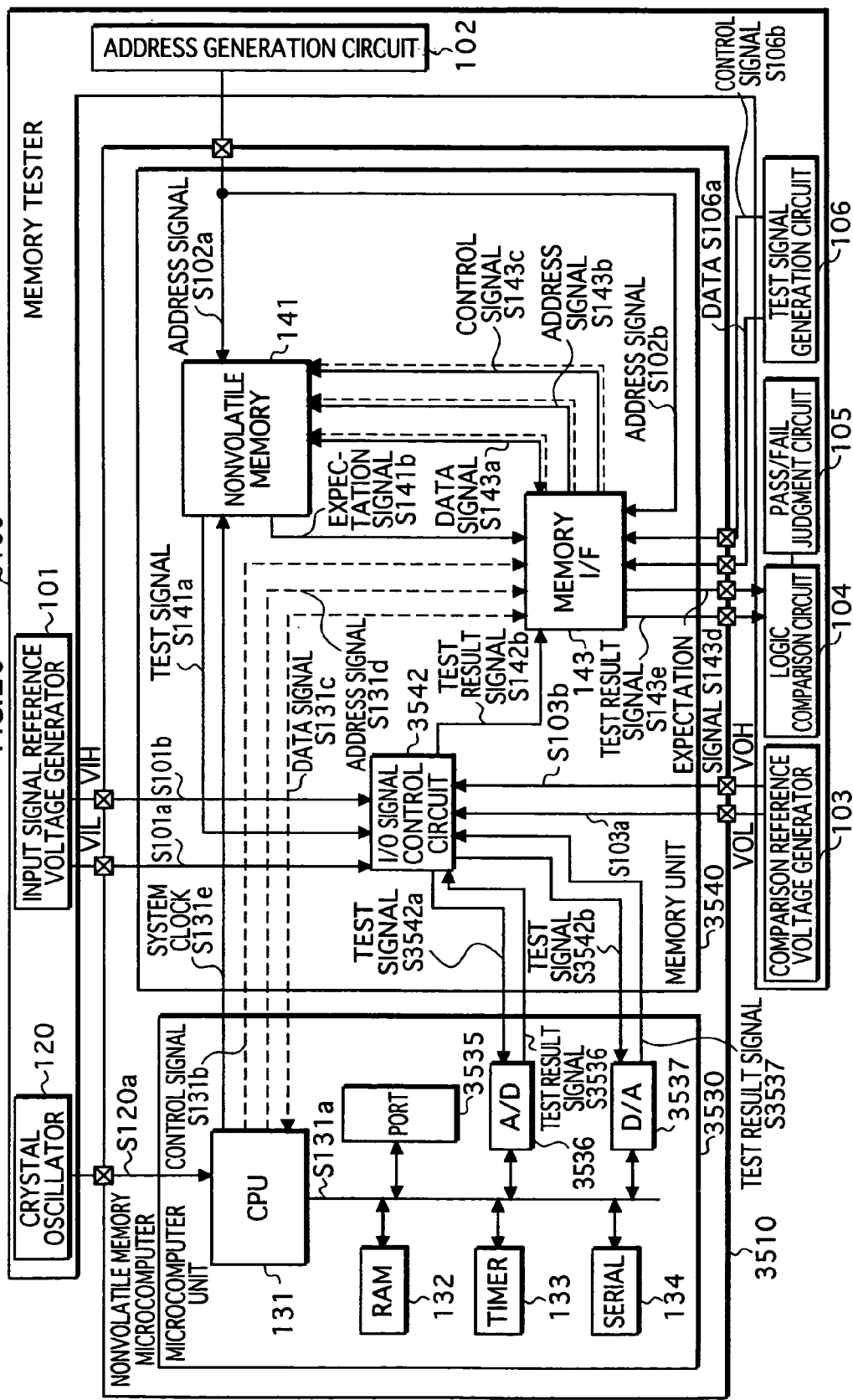
FIG. 20 shows a construction of a nonvolatile memory microcomputer to which the eighth embodiment of the invention relates.
Figure 21:
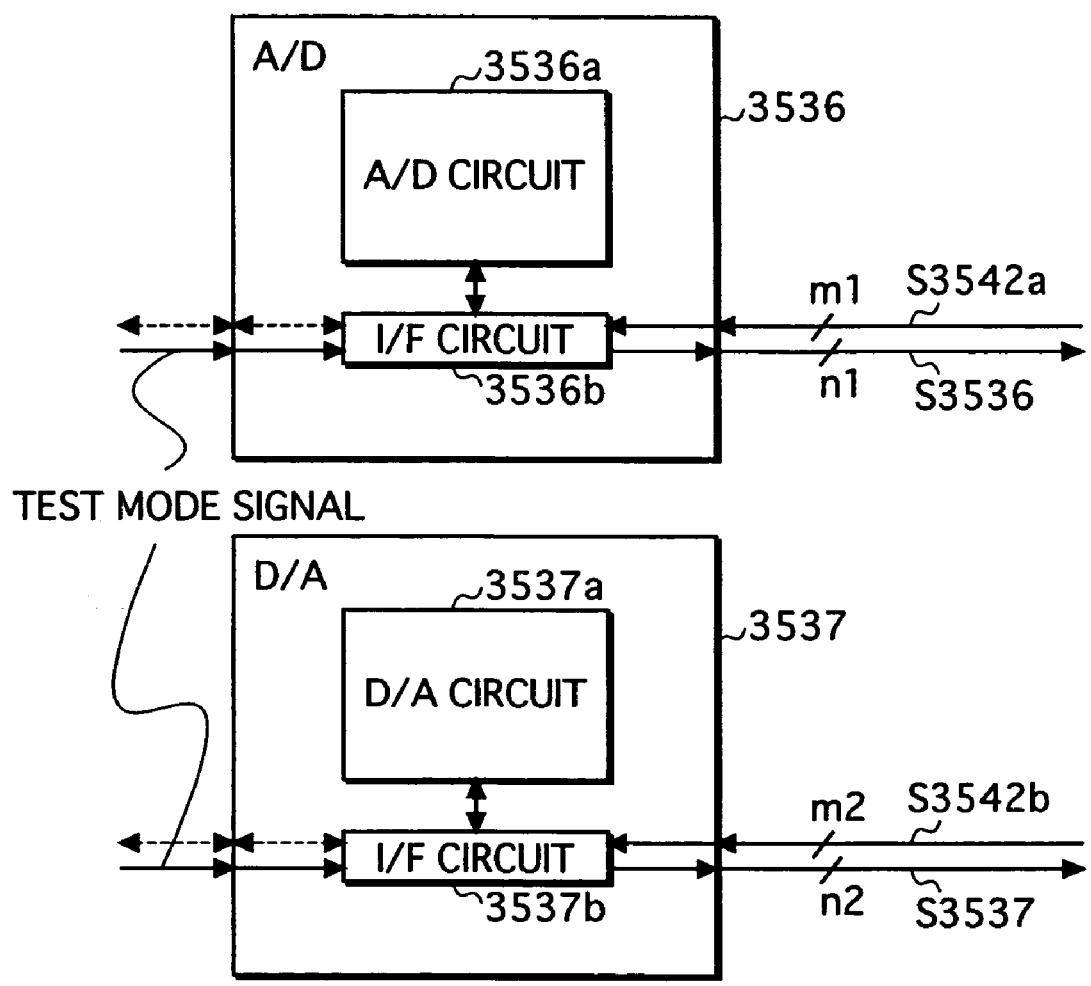
FIG. 21 shows constructions of an A/D converter and D/A converter shown in FIG. 20.

The following describes a nonvolatile memory microcomputer to which the eighth embodiment of the invention relates, with reference to FIGS. 20 and 21.

FIG. 20 shows a construction of a nonvolatile memory microcomputer 3510 in the eighth embodiment.

The nonvolatile memory microcomputer 3510 is a modification to the nonvolatile memory microcomputer 110 in the first embodiment. In detail, the nonvolatile memory microcomputer 3510 is roughly made up of a microcomputer unit 3530 and a memory unit 3540. The microcomputer unit 3530 includes the CPU 131, the RAM 132, the timer 133, the serial I/F 134, a port 3535, an A/D converter 3536, and a D/A converter 3537. The memory unit 3540 includes the nonvolatile memory 141, an I/O signal control circuit 3542, and the memory I/F 143. A main feature of the nonvolatile memory microcomputer 3510 lies in that the I/O signal control circuit 3542 sends/receives data directly to/from a circuit block in the microcomputer unit 3530 such as the A/D converter 3536 or the D/A converter 3537, without involving the port 3535. Components which are the same as those in the first embodiment shown in FIG. 1 have been given the same reference numerals and their explanation has been omitted.

It should be noted here that FIG. 20 merely shows one construction example, and other constructions such as connecting the I/O signal control circuit 3542 directly with circuit blocks other than the A/D converter 3536 or the D/A converter 3537 are equally applicable.

FIG. 21 shows constructions of the A/D converter 3536 and the D/A converter 3537.

The A/D converter 3536 includes an A/D circuit 3536a and an I/F circuit 3536b, and the D/A converter 3537 includes a D/A circuit 3537a and an I/F circuit 3537b. The I/F circuits 3536b and 3537b receive a test mode signal. If the test mode signal shows the microcomputer unit test mode, the I/F circuits 3536b and 3537b disconnect from a bus that is connected to the CPU 131. The I/F circuits 3536b and 3537b respectively receive test signals S3542a and S3542b from the I/O signal control circuit 3542, and pass them to the A/D circuit 3536a and the D/A circuit 3537a. The I/F circuits 3536b and 3537b then receive operation results respectively from the A/D circuit 3536a and the D/A circuit 3537, and output them to the I/O signal control circuit 3542 as test result signals S3536 and S3537. In this way, the A/D converter 3536 and the D/A converter 3537 can be tested directly.

In this embodiment, a test signal in test data which is stored in the nonvolatile memory 141 prior to the testing of the microcomputer unit 3530 (see FIG. 3) is made up of a m1-bit test signal for the A/D converter 3536 and a m2-bit test signal for the D/A converter 3537. Likewise, an expectation signal in test data is made up of a n1-bit expectation signal for the A/D converter 3536 and a n2-bit expectation signal for the D/A converter 3537.

The I/O signal control circuit 3542 changes a voltage level of test signal S141a output from the nonvolatile memory 141, into a low voltage or a high voltage that are determined based on an input signal reference voltage applied from the memory tester 100. The I/O signal control circuit 3542 sends m1-bit test signal S3542a out of a resulting signal to the A/D converter 3536, and m2-bit test signal S3542b out of the resulting signal to the D/A converter 3537. The I/O signal control circuit 3542 then receives n1-bit test result signal S3536 showing an operation result from the A/D converter 3536 and n2-bit test result signal S3537 showing an operation result from the D/A converter 3537. The I/O signal control circuit 3542 combines them, and changes a voltage level of a combination result into a low voltage or a high voltage that are determined based on a comparison reference voltage applied from the memory tester 100. The I/O signal control circuit 3542 outputs a resulting signal to the memory I/F 143 as test result signal S142b.

According to this embodiment, a test signal such as a control instruction can be directly sent to each circuit block in the microcomputer unit 3530, to test the circuit block. This makes it possible to conduct elaborate testing that cannot be done through the port 3535. As a result, the defect detection ratio can be improved.

This embodiment describes the case where test signal S3542a and test result signal S3536 are respectively m1 bits and n1 bits, and test signal S3542b and test result signal S3537 are respectively m2 bits and n2 bits. Here, test signal S3542a and test result signal S3536 may be transferred over the same signal line. Likewise, test signal S3542b and test result signal S3537 may be transferred over the same signal line.

Ninth Embodiment

Figure 22:
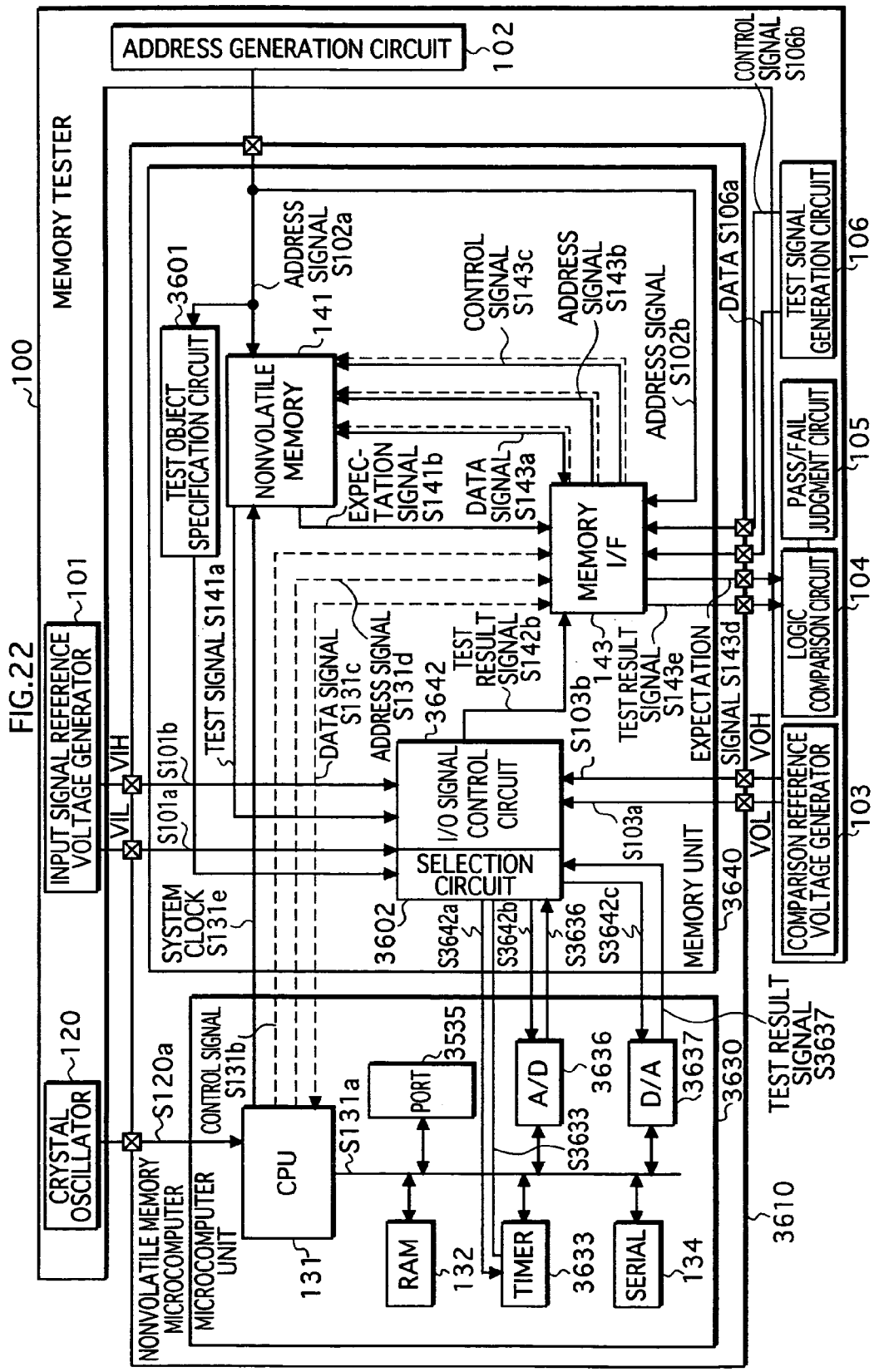
FIG. 22 shows a construction of a nonvolatile memory microcomputer to which the ninth embodiment of the invention relates.
Figure 23:
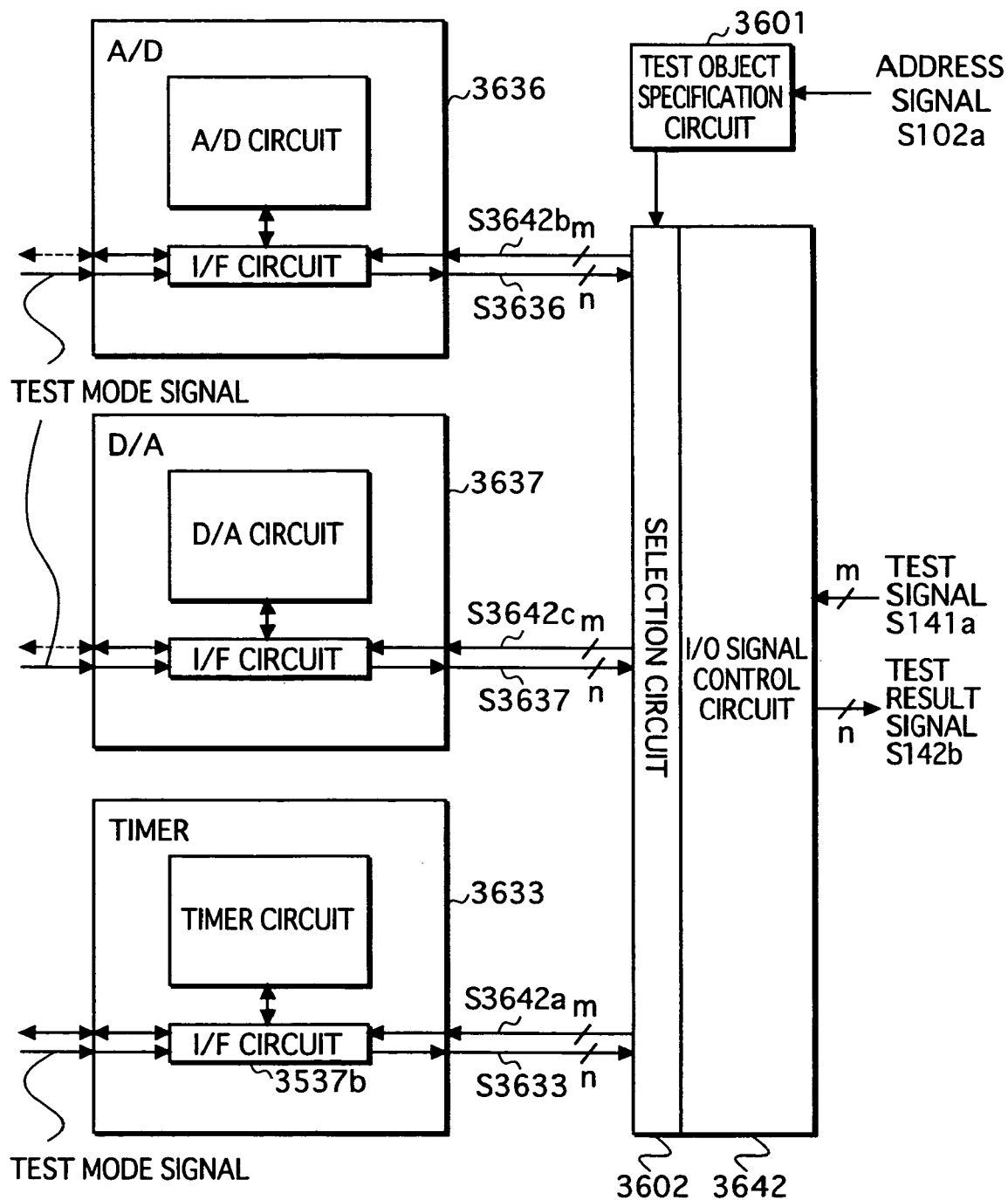
FIG. 23 shows a connection relationship between a selection circuit and each of an A/D converter, a D/A converter, and a timer shown in FIG. 22.

The following describes a nonvolatile memory microcomputer to which the ninth embodiment of the invention relates, with reference to FIGS. 22 and 23.

FIG. 22 shows a construction of a nonvolatile memory microcomputer 3610 in the ninth embodiment.

The nonvolatile memory microcomputer 3610 is a modification to the nonvolatile memory microcomputer 3510 in the eighth embodiment shown in FIG. 20. The nonvolatile memory microcomputer 3610 is roughly made up of a microcomputer unit 3630 and a memory unit 3640. The microcomputer unit 3630 includes the CPU 131, the RAM 132, a timer 3633, the serial I/F 134, the port 3535, an A/D converter 3636, and a D/A converter 3637. The memory unit 3640 includes the nonvolatile memory 141, an I/O signal control circuit 3642, the memory I/F 143, a test object specification circuit 3601, and a selection circuit 3602. A main feature of the nonvolatile memory microcomputer 3610 lies in that the I/O signal control circuit 3642 directly sends a test signal to a circuit block in the microcomputer unit 3630 without involving the port 3535, through the use of the test object specification circuit 3601 and the selection circuit 3602 that specify the circuit block as the test object based on an address of test data which includes the test signal in the nonvolatile memory 141. Components which are the same as those in the preceding embodiments have been given the same reference numerals and their explanation has been omitted.

The test object specification circuit 3601 holds information showing a correspondence between addresses of test data in the nonvolatile memory 141 and circuit blocks which are to be tested using the test data. The test object specification circuit 3601 receives address signal S102a from the address generation circuit 102, and specifies the test object according to address signal S102a. The test object specification circuit 3601 sends a signal for identifying the test object, to the selection circuit 3602. Suppose an A/D test data group is stored in addresses 0000h to 17FFh of the nonvolatile memory cell block 141a, and a timer test data group is stored in addresses 1800h to 1FFFFh of the nonvolatile memory cell block 141a. In such a case, the test object specification circuit 3601 holds information which associates addresses 0000h to 17FFh with the A/D converter 3636 and addresses 1800h to 1FFFh with the timer 3633, in advance. If address signal S102a shows any of 0000h to 17FFh, the test object specification circuit 3601 specifies the A/D converter 3636 as the test object.

The selection circuit 3602 selects a circuit block in the microcomputer unit 3630 such as the timer 3633, the A/D converter 3636, or the D/A converter 3637, based on the signal sent from the test object specification circuit 3601. The selection circuit 3602 connects the selected circuit block with the I/O signal control circuit 3642. Meanwhile, the selection circuit 3602 sends a low to each unselected circuit block, to prevent the unselected circuit blocks from malfunctioning.

FIG. 23 shows a connection relationship between the selection circuit 3602 and each of the A/D converter 3636, the D/A converter 3637, and the timer 3633.

Suppose test data in the nonvolatile memory 141 is made up of a 46-bit test signal and a 18-bit expectation signal. In this case, the I/O signal control circuit 3642 receives 46-bit test signal S141a. Based on this, the I/O signal control circuit 3642 outputs a 46-bit signal to a circuit block, such as the timer 3633 or the A/D converter 3636, that is specified as the test object, via the selection circuit 3602. The I/O signal control circuit 3642 then receives a 18-bit signal from the circuit block via the selection circuit 3602, and outputs it to the memory I/F 143 as test result signal S142b.

According to this embodiment, a test signal such as a control instruction can be selectively and directly sent to a circuit block in the microcomputer unit 3630 to test the circuit block. This makes it possible to conduct elaborate testing that cannot be done through the port 3535. As a result, the defect detection ratio can be improved.

Tenth Embodiment

Figure 24:
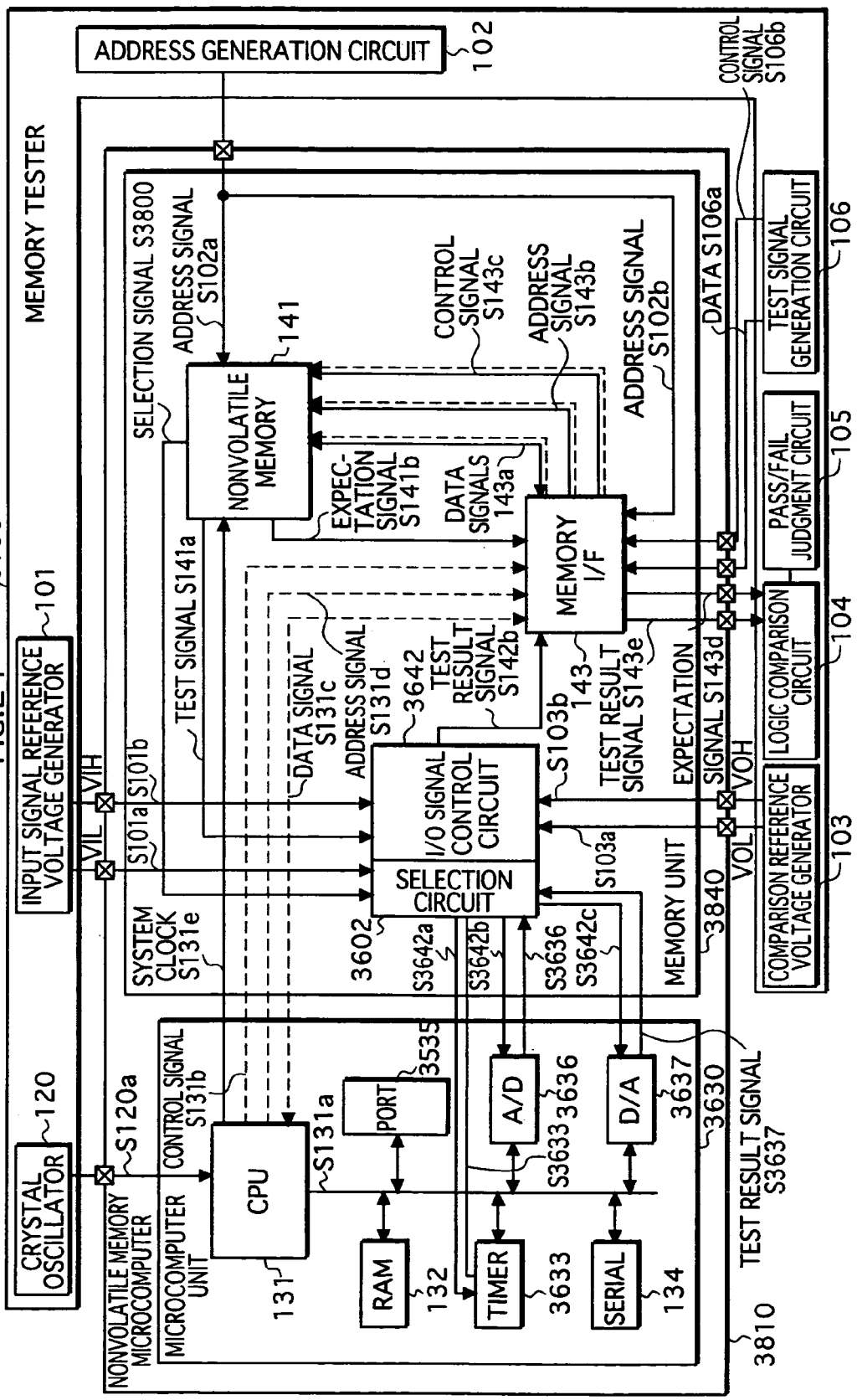
FIG. 24 shows a construction of a nonvolatile memory microcomputer to which the tenth embodiment of the invention relates.

The following describes a nonvolatile memory microcomputer to which the tenth embodiment of the invention relates, with reference to FIG. 24.

FIG. 24 shows a construction of a nonvolatile memory microcomputer 3810 in the tenth embodiment.

The nonvolatile memory microcomputer 3810 is a modification to the nonvolatile memory microcomputer 3610 of the ninth embodiment shown in FIG. 22. In the nonvolatile memory microcomputer 3810, the test object specification circuit 3601 has been omitted so that the nonvolatile memory 141 supplies selection signal S3800 for identifying the test object to the selection circuit 3602. The nonvolatile memory microcomputer 3810 is roughly made up of the microcomputer unit 3630 and a memory unit 3840. The memory unit 3840 includes the nonvolatile memory 141, the I/O signal control circuit 3642, the memory I/F 143, and the selection circuit 3602. Components which are the same as those in the preceding embodiments have been given the same reference numerals and their explanation has been omitted.

In this embodiment, a selection signal identifying a circuit block is stored in each address of the nonvolatile memory 141 together with test data made up of a test signal and an expectation signal, prior to the testing of the microcomputer unit 3630.

When testing the microcomputer unit 3630, the nonvolatile memory 141 outputs a test signal stored at an address shown by address signal S102a to the I/O signal control circuit 3642 as test signal S141a, and also outputs a selection signal stored at the same address to the selection circuit 3602 as selection signal S3800, in sync with system clock S131e. The selection circuit 3602 selects a circuit block identified by selection signal S3800, and connects the selected circuit block with the I/O signal control circuit 3642.

The I/O signal control circuit 3642 changes a voltage level of test signal S141a into a low voltage or a high voltage that are determined based on an input signal reference voltage applied from the memory tester 100, and sends a resulting signal to the circuit block through the selection circuit 3602. The I/O signal control circuit 3642 then receives a test result signal showing an operation result from the circuit block through the selection circuit 3602. The I/O signal control circuit 3642 changes a voltage level of the test result signal into a low voltage or a high voltage that are determined based on a comparison reference voltage applied from the memory tester 100. The I/O signal control circuit 3642 outputs a resulting signal to the memory I/F 143 as test result signal S142b.

According to this embodiment, each circuit block in the microcomputer unit 3630 can be tested directly. Also, the amount and contents of test data used for testing each circuit block can be changed with relative ease, by rewriting the nonvolatile memory.

Eleventh Embodiment

Figure 25:
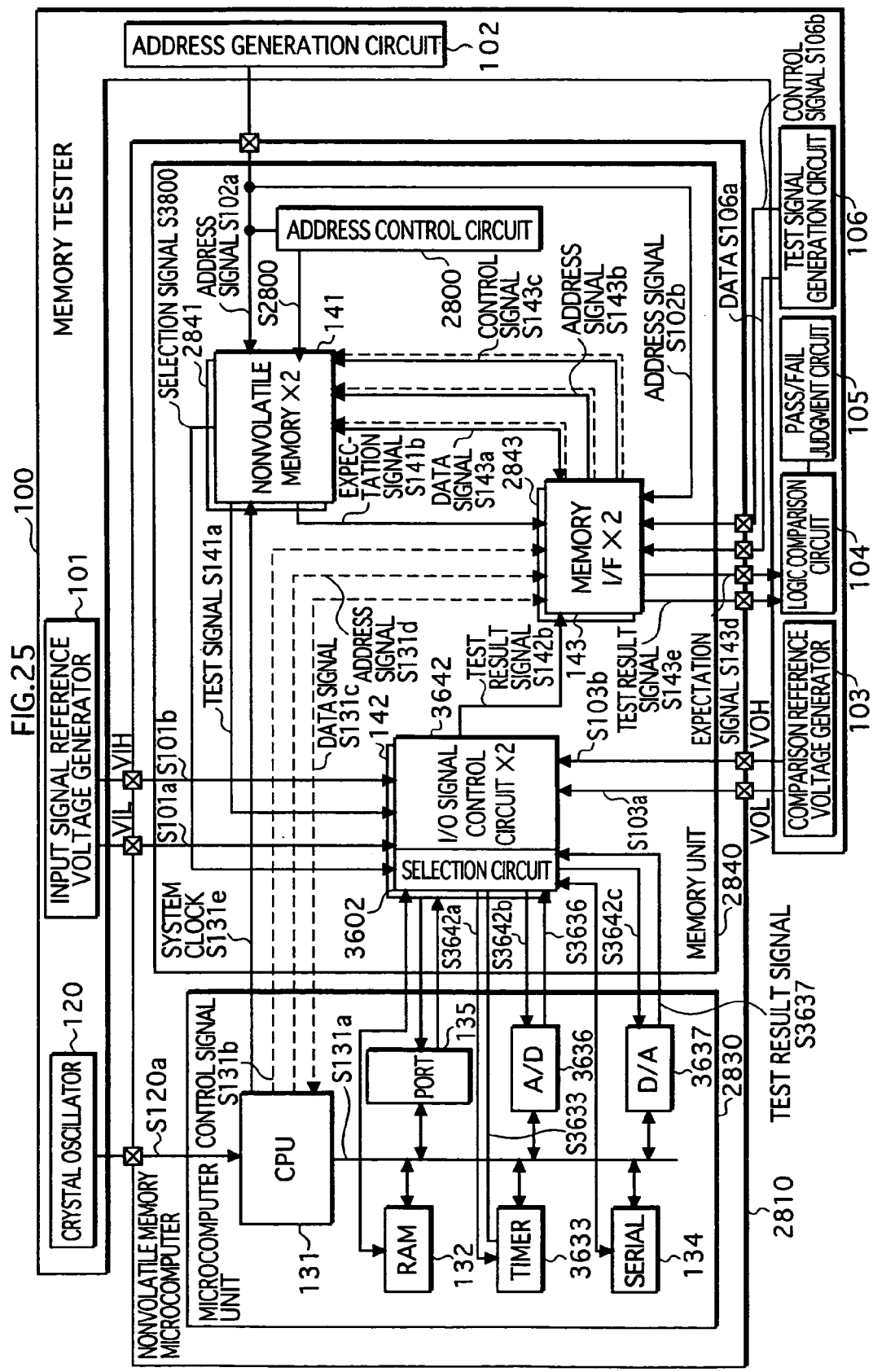
FIG. 25 shows a construction of a nonvolatile memory microcomputer to which the eleventh embodiment of the invention relates.
Figure 26:
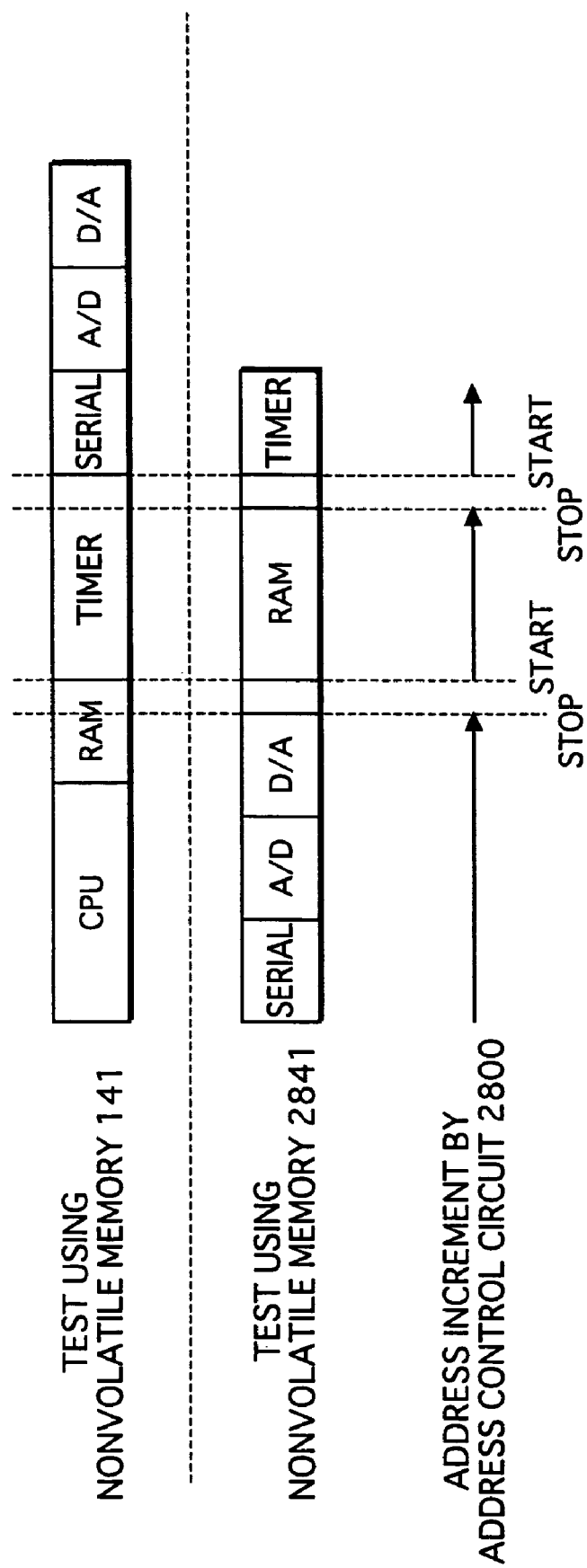
FIG. 26 is a timing chart showing a relationship between changes of the test object based on test data stored in each nonvolatile memory and timings with which an address control circuit stops/resumes address increment, in FIG. 25.

The following describes a nonvolatile memory microcomputer to which the eleventh embodiment of the invention relates, with reference to FIGS. 25 and 26.

FIG. 25 shows a construction of a nonvolatile memory microcomputer 2810 in the eleventh embodiment.

The nonvolatile memory microcomputer 2810 is a modification to the nonvolatile memory microcomputer 3810 of the tenth embodiment shown in FIG. 24, in that two nonvolatile memories, two I/O signal control circuits, and two memory I/Fs are included. The nonvolatile memory microcomputer 2810 is roughly made up of a microcomputer unit 2830 and a memory unit 2840. The microcomputer unit 2830 includes the CPU 131, the RAM 132, the timer 3633, the serial I/F 134, the port 135, the A/D converter 3636, and the D/A converter 3637. The memory unit 2840 includes the nonvolatile memory 141 and a nonvolatile memory 2841, the I/O signal control circuit 142 and the I/O signal control circuit 3642, the selection circuit 3602, the memory I/F 143 and a memory I/F 2843, and an address control circuit 2800. Components which are the same as those in the preceding embodiments have been given the same reference numerals and their explanation has been omitted.

The two nonvolatile memories 141 and 2841 store different test data. For instance, the nonvolatile memory 141 stores CPU test data, RAM test data, timer test data, serial test data, A/D test data, and D/A test data in this order, to perform basic testing on the microcomputer unit 2830 via the port 135. Meanwhile, the nonvolatile memory 2841 stores serial test data, A/D test data, D/A test data, RAM test data, and timer test data in this order, to perform more detailed testing directly on each individual circuit block.

The nonvolatile memory 141 receives address signal S102a from the address generation circuit 102, whilst the nonvolatile memory 2841 receives address signal S2800 from the address control circuit 2800.

The address control circuit 2800 has a counter. The address control circuit 2800 holds information showing a correspondence between addresses of test data stored in each nonvolatile memory and circuit blocks which are to be tested using the test data. The address control circuit 2800 receives address signal S102a, and checks which circuit block is to be tested using test data stored in each nonvolatile memory at an address shown by address signal S102a. Basically, upon receiving address signal S102a showing address 0000h from the address generation circuit 102, the address control circuit 2800 sequentially outputs addresses 0000h, 0001h, 0002h, . . . which are incremented by 1 to the nonvolatile memory 2841 as address signal S2800, in sync with system clock S131e. During this, if a circuit block which is to be tested using test data stored in the nonvolatile memory 141 at an address shown by address signal S102a is the same as a circuit block which is to be tested using test data stored in the nonvolatile memory 2841 at an address shown by address signal S102a, the address control circuit 2800 stops incrementing the counter and outputting address signal S2800. After this, when the test object of test data stored in the nonvolatile memory 141 at an address shown by address signal S102a changes, the address control circuit 2800 resumes incrementing the counter and outputting address signal S2800.

As a result, basically two circuit blocks are tested in parallel using test data output from the nonvolatile memory 141 and test data output from the nonvolatile memory 2841. Note here that two signals output from the two nonvolatile memories 141 and 2841 are processed by two separate processing systems. For example, the two signals are transferred via separate signal lines.

The I/O signal control circuit 142 outputs a test signal output from the nonvolatile memory 141, to a circuit block via the port 135. The I/O signal control circuit 142 then receives a test result signal from the circuit block via the port 135, and outputs it to the memory I/F 143. The memory I/F 143 outputs the test result signal and an expectation signal output from the nonvolatile memory 141, to the logic comparison circuit 104. The logic comparison circuit 104 compares the test result signal and the expectation signal. Meanwhile, the I/O signal control circuit 3642 outputs a test signal output from the nonvolatile memory 2841, to a circuit block through the selection circuit 3602. The I/O signal control circuit 3642 then receives a test result signal from the circuit block, and outputs it to the memory I/F 2843. The memory I/F 2843 outputs the test result signal and an expectation signal output from the nonvolatile memory 2841, to the logic comparison circuit 104. The logic comparison circuit 104 compares the test result signal and the expectation signal. Here, the logic comparison circuit 104 has a function of comparing two pairs of input signal individually.

FIG. 26 is a timing chart showing a relationship between changes of the test object in each nonvolatile memory and timings with which the address control circuit 2800 stops/resumes address increment.

So long as the test object of test data in the nonvolatile memory 141 is different from the test object of test data in the nonvolatile memory 2841, the address control circuit 2800 continues address increment by 1 in sync with system clock S131e. However, for example while the RAM 132 is tested using test data in the nonvolatile memory 141, the address control circuit 2800 suspends the operation of incrementing an address by 1 and supplying it to the nonvolatile memory 2841, to delay the start of testing the RAM 132 based on test data in the nonvolatile memory 2841. When the testing of the RAM 132 based on the test data in the nonvolatile memory 141 ends, the address control circuit 2800 resumes the operation of incrementing the address by 1 and supplying it to the nonvolatile memory 2841, to launch the testing of the RAM 132 based on the test data in the nonvolatile memory 2841.

Twelfth Embodiment

The following describes a nonvolatile memory microcomputer to which the twelfth embodiment of the invention relates, with reference to FIGS. 27 to 31.

Figure 27:
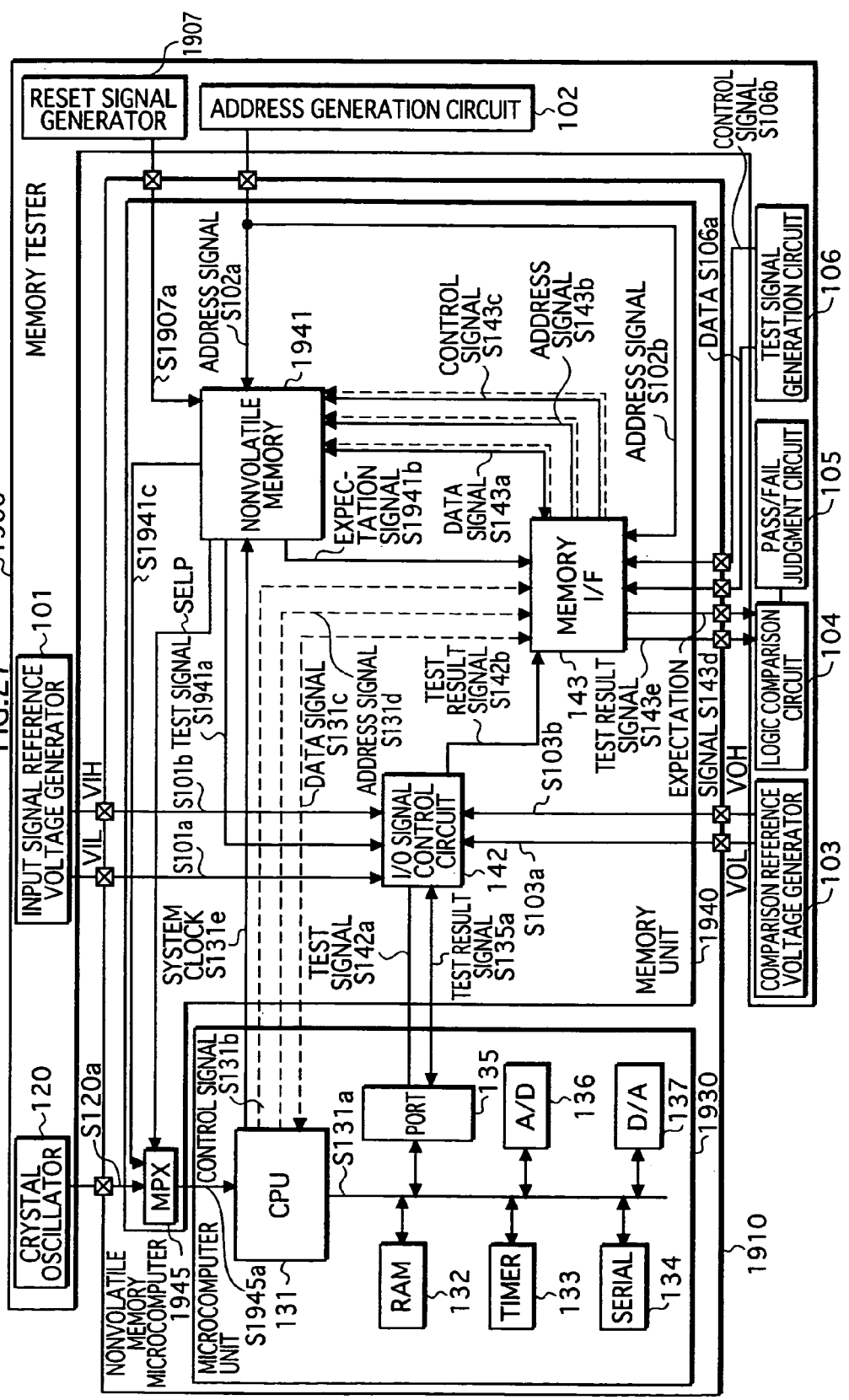
FIG. 27 shows a construction of a nonvolatile memory microcomputer to which the twelfth embodiment of the invention relates.

FIG. 27 shows a construction of a nonvolatile memory microcomputer 1910 in the twelfth embodiment.

The nonvolatile memory microcomputer 1910 is roughly made up of a microcomputer unit 1930 and a memory unit 1940. The microcomputer unit 1930 includes the CPU 131, the RAM 132, the timer 133, the serial I/F 134, the port 135, the A/D converter 136, and the D/A converter 137. The memory unit 1940 includes a nonvolatile memory 1941, the I/O signal control circuit 142, the memory I/F 143, and a multiplexer (MPX) 1945. The nonvolatile memory microcomputer 1910 differs from the nonvolatile memory microcomputer 110 in the first embodiment shown in FIG. 1, in that the MPX 1945 selects clock signal S120a generated from the crystal oscillator 120 or clock signal S1941c generated from the nonvolatile memory 1941 and supplies the selected clock signal to the CPU 131.

FIG. 27 also shows a memory tester 1900 that is an external device for testing the nonvolatile memory microcomputer 1910. The memory tester 1900 differs from the memory tester 100 in the first embodiment in that a reset signal generator 1907 for supplying reset signal S1907a to the nonvolatile memory 1941 has been added.

In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

Figure 28:
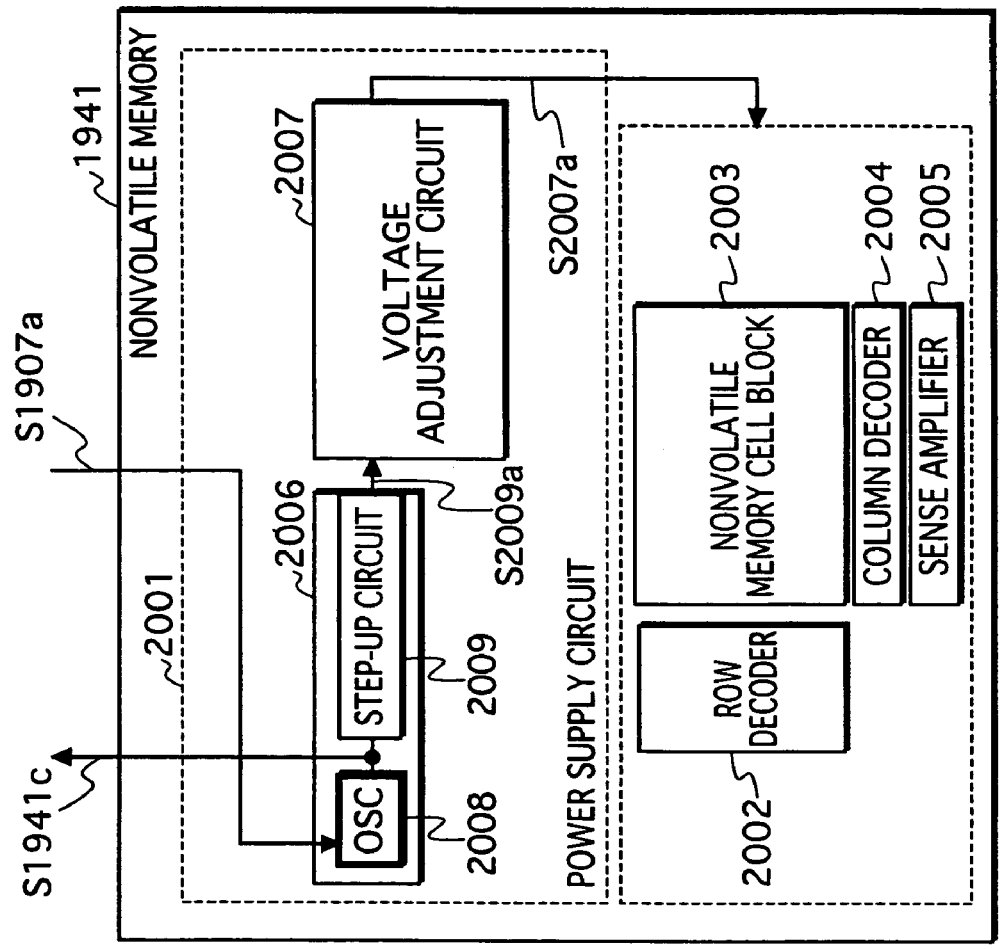
FIG. 28 shows a construction of a nonvolatile memory shown in FIG. 27.
Figure 29:
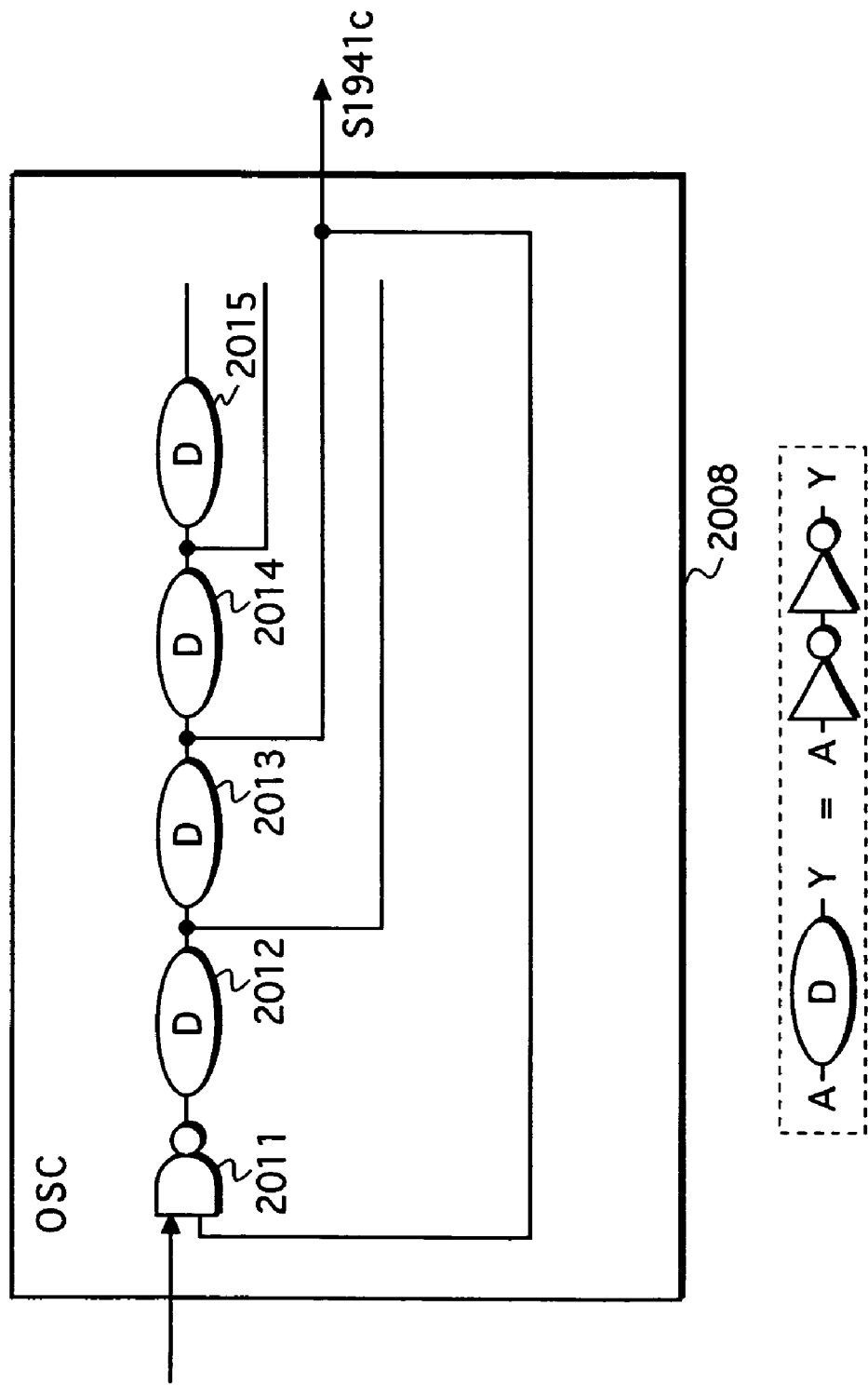
FIG. 29 shows a construction of an oscillation circuit shown in FIG. 28.

FIG. 28 shows a construction of the nonvolatile memory 1941. FIG. 29 shows a construction of an oscillation circuit (OSC) 2008 in the nonvolatile memory 1941.

The nonvolatile memory 1941 includes a power supply circuit 2001, a row decoder 2002, a nonvolatile memory cell block 2003, a column decoder 2004, and a sense amplifier 2005, like a typical nonvolatile memory. The power supply circuit 2001 includes the OSC 2008, a step-up circuit 2009, and a voltage adjustment circuit 2007, like a power supply circuit equipped in a typical nonvolatile memory.

A main feature of the OSC 2008 lies in the logic circuit construction shown in FIG. 29. With this construction, the OSC 2008 generates a pulse by oscillation and outputs it as clock signal S1941c, so long as reset signal S1907a is high. Clock signal S1941c has a longer period than clock signal S120a generated from the crystal oscillator 120.

Though FIG. 29 shows an example of obtaining clock signal S1941c from a delay circuit 2013, clock signal S1941c may instead be obtained from any of delay circuits 2012, 2014, and 2015.

The MPX 1945 selects clock signal S1941c output from the nonvolatile memory 1941 and supplies it to the CPU 131, if SELP signal shows "1". The MPX 1945 selects clock signal S120a output from the crystal oscillator 120 and supplies it to each circuit block in the microcomputer unit 1930 via the CPU 131, if SELP signal shows "0".

FIG. 30 shows an example of data stored in the nonvolatile memory 1941 prior to the testing of the microcomputer unit 1930.

As shown in the drawing, a 1-bit SELP value and test data are stored in each address of the nonvolatile memory 1941. The SELP value defines SELP signal which indicates whether clock signal S1941c should be selected by the MPX 1945. The meaning of the test data has already been explained in the first and fourth embodiments.

In FIG. 30, a SELP value corresponding to a CPU test data group is "0", to test the CPU 131 at normal speed. A SELP value corresponding to a D/A test data group is "1", to test the D/A converter 137 at low speed to reduce the number of steps of the test data. This is because output and comparison of analog voltages take time due to factors such as parasitic capacitance. A SELP value corresponding to a timer test data group is "0", to test the timer 133 at normal speed.

When receiving address signal S102a from the address generation circuit 102, the nonvolatile memory 1941 outputs a SELP value, a test signal, and an expectation signal stored at an address shown by address signal S102a, respectively as SELP signal, test signal S1941a, and expectation signal S1941b.

Figure 31:
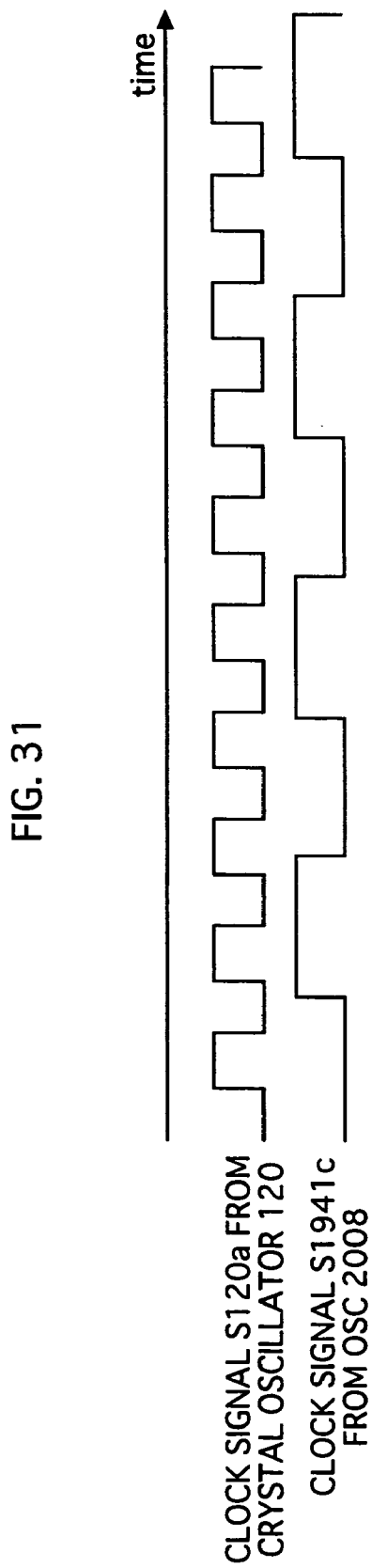
FIG. 31 shows a clock signal output from a crystal oscillator and a clock signal output from the nonvolatile memory.

FIG. 31 shows clock signal S120a output from the crystal oscillator 120 and clock signal S1941c output from the nonvolatile memory 1941.

As can be seen from the drawing, clock signal S1941c output from the nonvolatile memory 1941 is slower than clock signal S120a output from the crystal oscillator 120.

Operations of the nonvolatile memory 1941, the MPX 1945, and the like when testing the microcomputer unit 1930 are explained below.

Prior to the testing of the microcomputer unit 1930, the memory tester 1900 writes data such as the one shown in FIG. 30 to the nonvolatile memory 1941. At the start of the testing, the reset signal generator 1907 outputs reset signal S1907a of high level, and the address generation circuit 102 outputs address signal S102a showing "0000h".

The nonvolatile memory 1941 outputs SELP signal showing the SELP value "0" which is stored at address 0000h in the nonvolatile memory cell block 2003. The MPX 1945 responsively selects clock signal S120a output from the crystal oscillator 120, and outputs it to the microcomputer unit 1930 as clock signal S1945a.

As a result, the CPU 131 is tested at normal speed, in the same way as in the first embodiment and the like.

Subsequently, the address generation circuit 102 sequentially outputs addresses which are incremented by 1, as address signal S102a. When the address generation circuit 102 outputs address signal S102a showing "1000h", the nonvolatile memory 1941 outputs SELP signal showing the SELP value "1" which is stored at address 1000h. The MPX 1945 responsively selects clock signal S1941c generated from the OSC 2008 in the nonvolatile memory 1941, and outputs it to the microcomputer unit 1930 as clock signal S1945a.

As a result, the D/A converter 137 is tested at low speed. Here, while testing is performed at low speed, the address generation circuit 102 performs address increment in accordance with that speed based on a predetermined test schedule.

After this, when the address generation circuit 102 outputs address signal S102a showing "1800h", the nonvolatile memory 1941 outputs SELP signal showing the SELP value "0" which is stored at address 1800h. The MPX 1945 responsively selects clock signal S120a generated from the crystal oscillator 120, and outputs it to the microcomputer unit 1930 as clock signal S1945a. As a result, the timer 133 is tested at normal speed.

Thirteenth Embodiment

Figure 32:
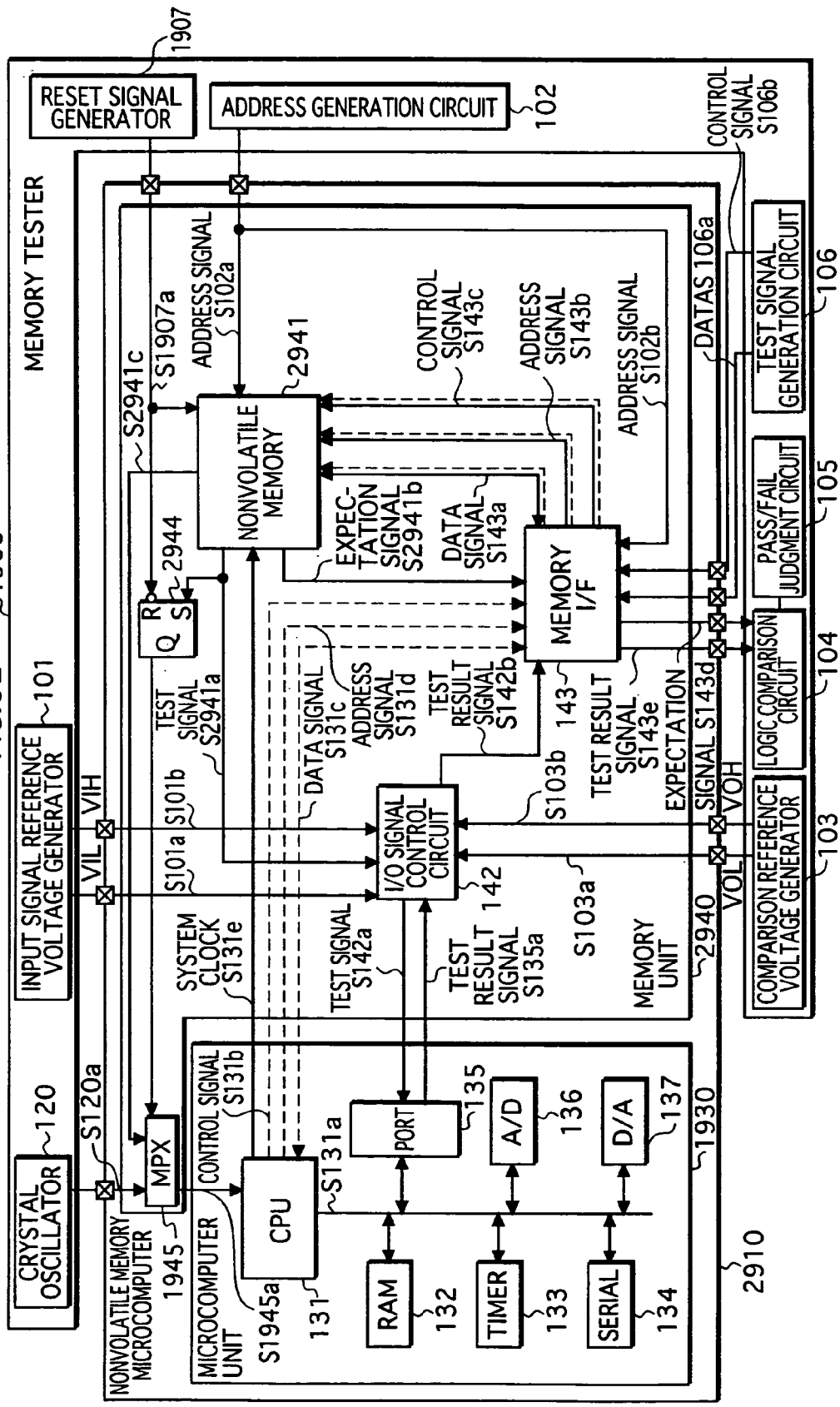
FIG. 32 shows a construction of a nonvolatile memory microcomputer to which the thirteenth embodiment of the invention relates.
Figure 33:
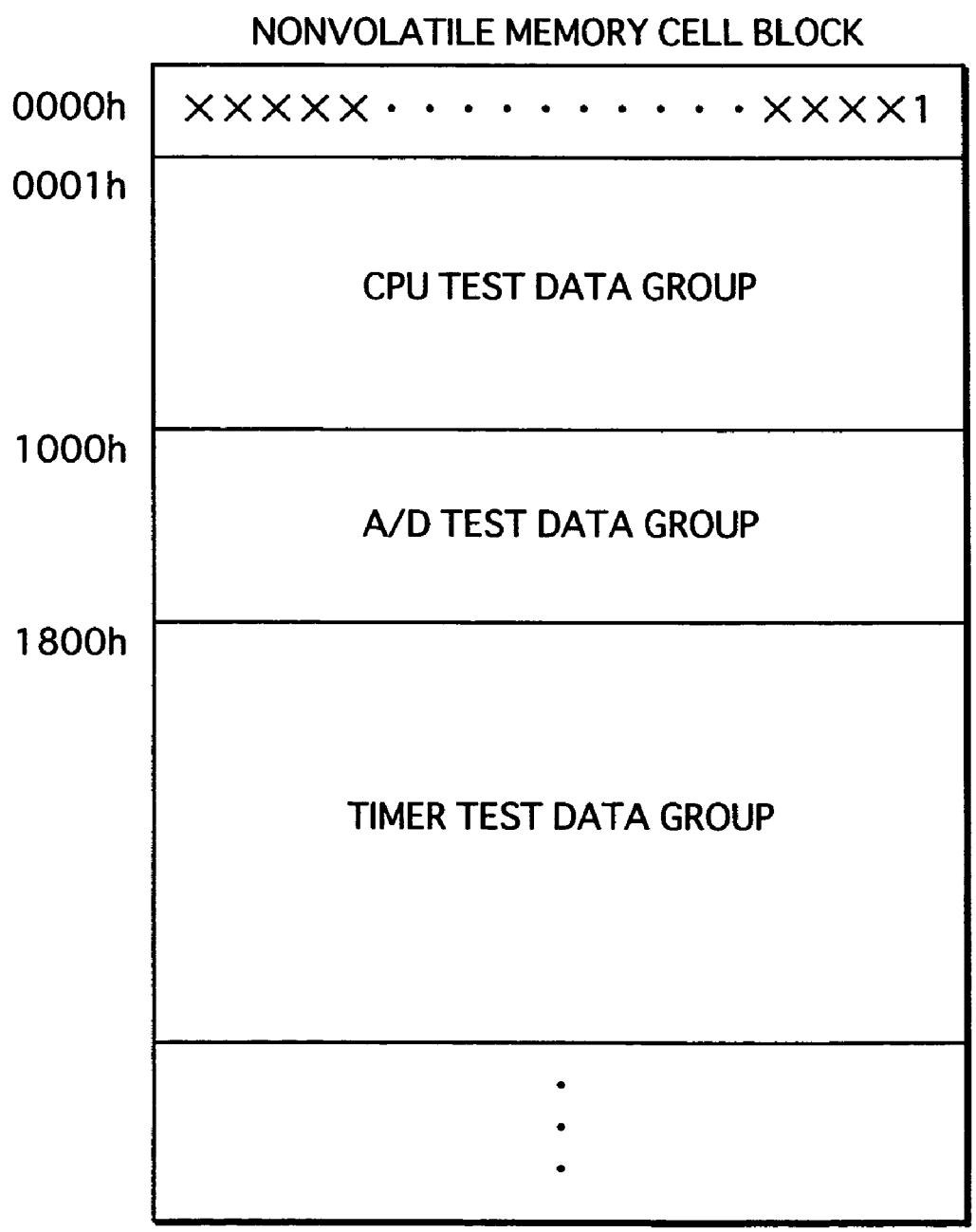
FIG. 33 shows an example of test data stored in a nonvolatile memory shown in FIG. 32, before testing a microcomputer unit shown in FIG. 32.

The following describes a nonvolatile memory microcomputer to which the thirteenth embodiment of the invention relates, with reference to FIGS. 32 and 33.

FIG. 32 shows a construction of a nonvolatile memory microcomputer 2910 in the thirteenth embodiment.

The nonvolatile memory microcomputer 2910 is a modification to the nonvolatile memory microcomputer 1910 in the twelfth embodiment. In detail, the nonvolatile memory microcomputer 2910 is roughly made up of the microcomputer unit 1930 and a memory unit 2940. The memory unit 2940 includes a nonvolatile memory 2941, the I/O signal control circuit 142, the memory I/F 143, the MPX 1945, and a flip-flop 2944. Components which are the same as those in the twelfth embodiment shown in FIG. 27 have been given the same reference numerals and their explanation has been omitted.

The flip-flop 2944 has the following function. When a 1-bit signal showing the value "1" is output from the nonvolatile memory 2941 during when reset signal S1907a output from the reset signal generator 1907 is high, the flip-flop 2944 holds the value "1" and keeps outputting the value "1" to the MPX 1945.

FIG. 33 shows an example of test data stored in the nonvolatile memory 2941 prior to the testing of the microcomputer unit 1930.

In the drawing, the least significant bit of data stored at address 0000h is set at 1. At the start of the testing of the microcomputer unit 1930, the address generation circuit 102 outputs address signal S102a showing "0000h". The nonvolatile memory 2941 responsively outputs this least significant bit showing "1" to the flip-flop 2944. In the meantime, the reset signal generator 1907 begins outputting reset signal S1907a of high level to the flip-flop 2944. As a result, the flip-flop 2944 keeps outputting a signal showing "1" to the MPX 1945, until the reset signal generator 1907 outputs reset signal S1907a of low level at the end of the testing of the microcomputer unit 1930. As a result, the CPU 131, the A/D converter 136, and the timer 133 are tested in sequence using not clock signal S120a output from the crystal oscillator 120 but clock signal S2941c output from the nonvolatile memory 2941.

Fourteenth Embodiment

The following describes a nonvolatile memory microcomputer to which the fourteenth embodiment of the invention relates, with reference to FIGS. 34 to 37.

Figure 34:
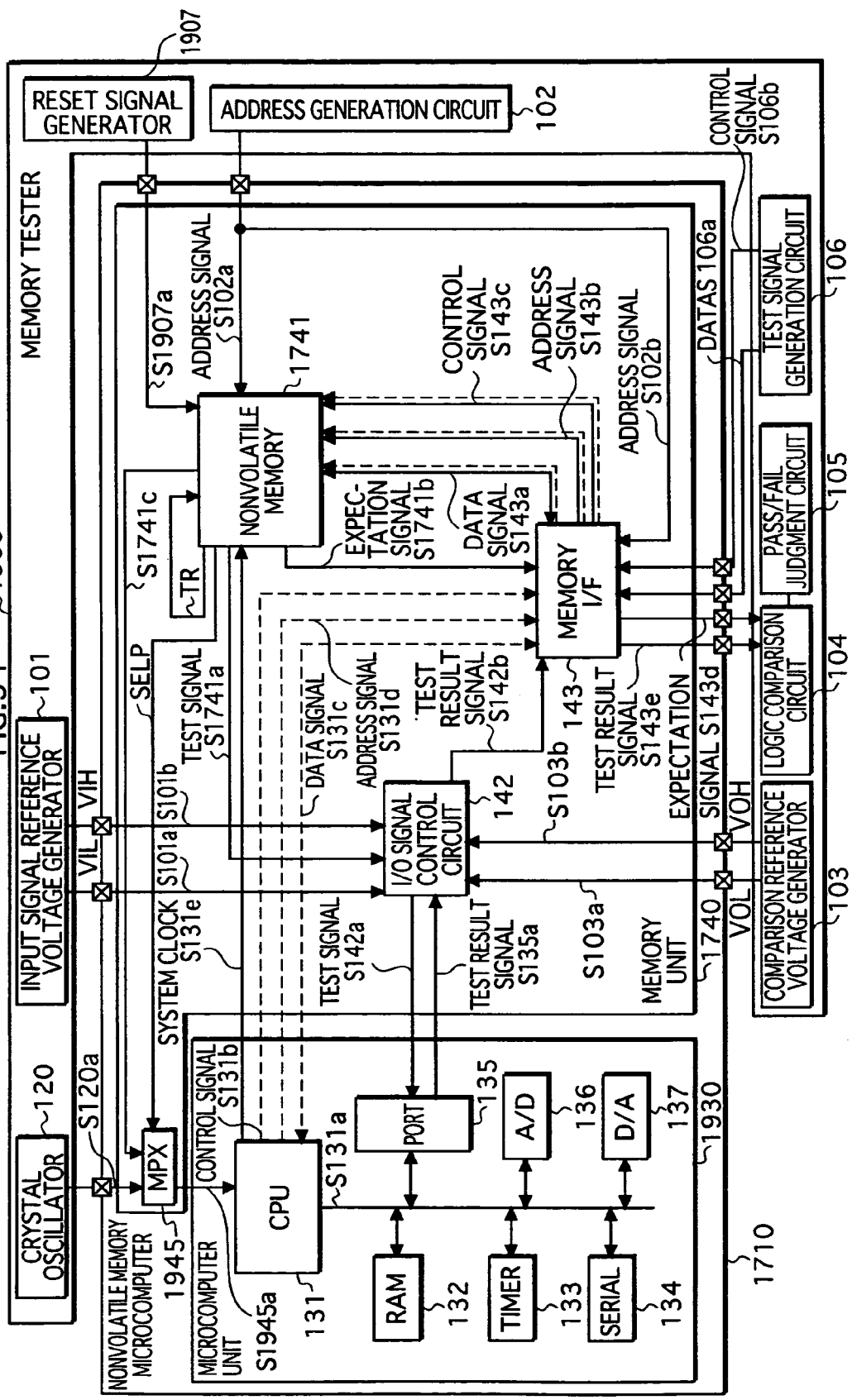
FIG. 34 shows a construction of a nonvolatile memory microcomputer to which the fourteenth embodiment of the invention relates.

FIG. 34 shows a construction of a nonvolatile memory microcomputer 1710 in the fourteenth embodiment.

The nonvolatile memory microcomputer 1710 is a modification to the nonvolatile memory microcomputer 1910 in the twelfth embodiment. In detail, the nonvolatile memory microcomputer 1710 is roughly made up of the microcomputer unit 1930 and a memory unit 1740. The memory unit 1740 includes a nonvolatile memory 1741, the I/O signal control circuit 142, the memory I/F 143, and the MPX 1945. A feature of the nonvolatile memory microcomputer 1710 is that the frequency of clock signal S1741c output from the nonvolatile memory 1741 can be varied in four levels based on data stored in the nonvolatile memory 1741. Components which are the same as those in the twelfth embodiment shown in FIG. 27 have been given the same reference numerals and their explanation has been omitted.

Figure 35:
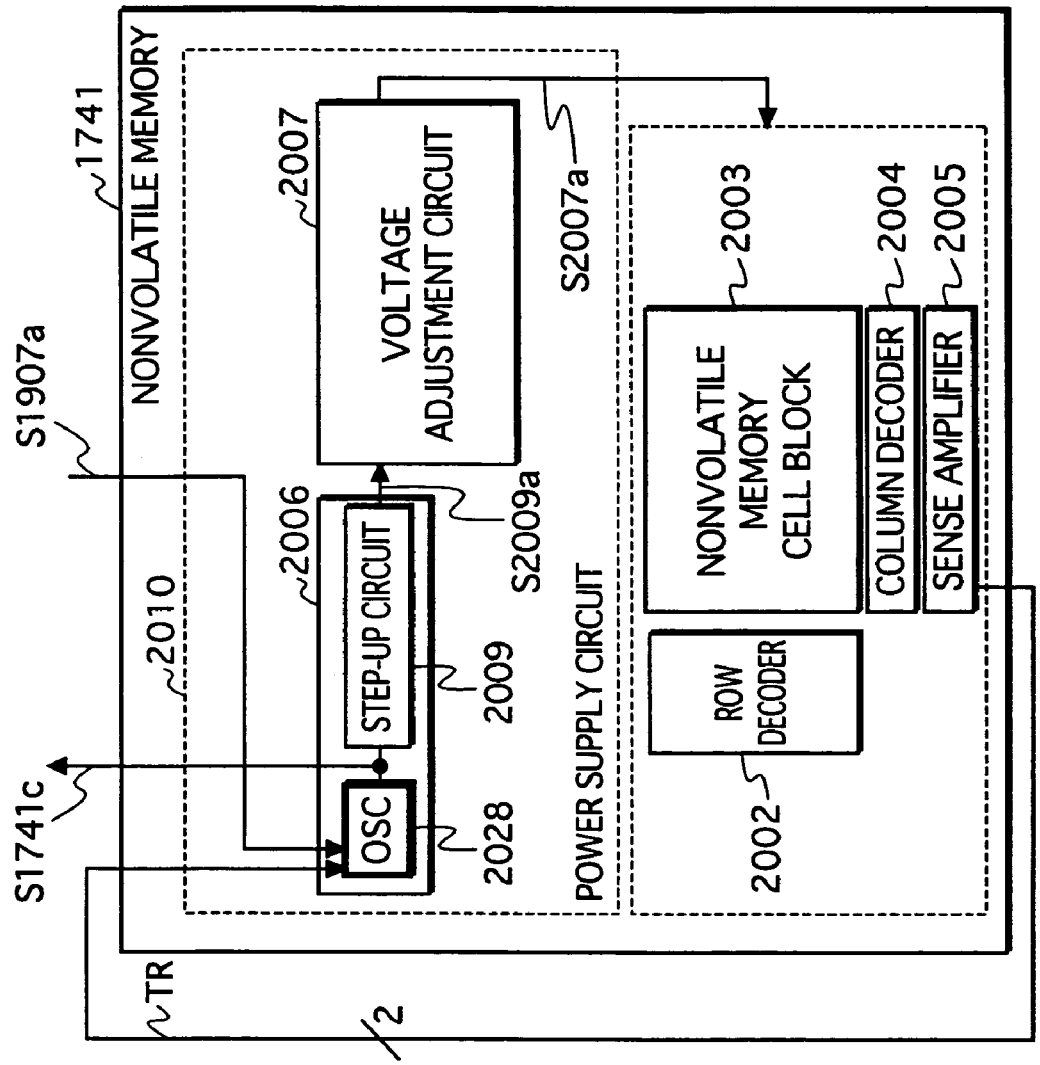
FIG. 35 shows a construction of a nonvolatile memory shown in FIG. 34.
Figure 36:
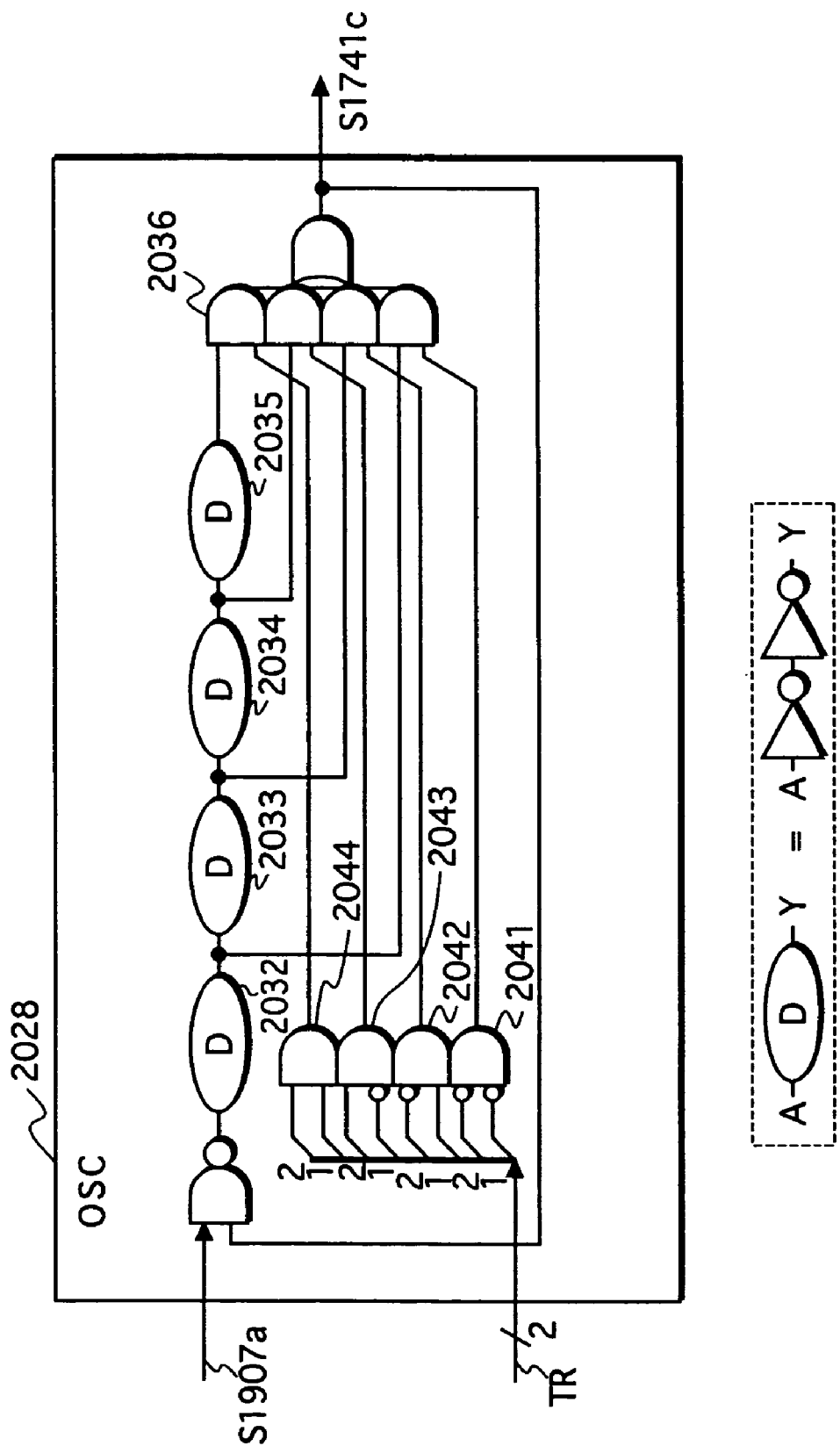
FIG. 36 shows a construction of an oscillation circuit shown in FIG. 35.

FIG. 35 shows a construction of the nonvolatile memory 1741. FIG. 36 shows a construction of an oscillation circuit (OSC) 2028 in the nonvolatile memory 1741.

The nonvolatile memory 1741 includes a power supply circuit 2010, the row decoder 2002, the nonvolatile memory cell block 2003, the column decoder 2004, and the sense amplifier 2005, like a typical nonvolatile memory. The power supply circuit 2010 includes the OSC 2028, the step-up circuit 2009, and the voltage adjustment circuit 2007, like a power supply circuit equipped in a typical nonvolatile memory.

A feature of the OSC 2028 lies in the logic circuit construction shown in FIG. 36. With this construction, the OSC 2028 generates a pulse of a period that corresponds to TR signal having a TR value shown by the second and third bits from the most significant bit of data stored at an address shown by address signal S102a and outputs it as clock signal S1741c, during when reset signal S1907a output from the reset signal generator 1907 is high.

If TR signal shows "00b", a gate 2036 selects an output of a delay circuit 2032. As a result, a pulse having a period that corresponds to a propagation delay time caused by the delay circuit 2032 is output as clock signal S1741c.

If TR signal shows "01b", the gate 2036 selects an output of a delay circuit 2033. As a result, a pulse having a period that corresponds to propagation delay times caused by the delay circuits 2032 and 2033 is output as clock signal S1741c.

If TR signal shows "10b", the gate 2036 selects an output of a delay circuit 2034. As a result, a pulse having a period that corresponds to propagation delay times caused by the delay circuits 2032 to 2034 is output as clock signal S1741c.

If TR signal shows "11b", the gate 2036 selects an output of a delay circuit 2035. As a result, a pulse having a period that corresponds to propagation delay times caused by the delay circuits 2032 to 2035 is output as clock signal S1741c.

Figure 37:
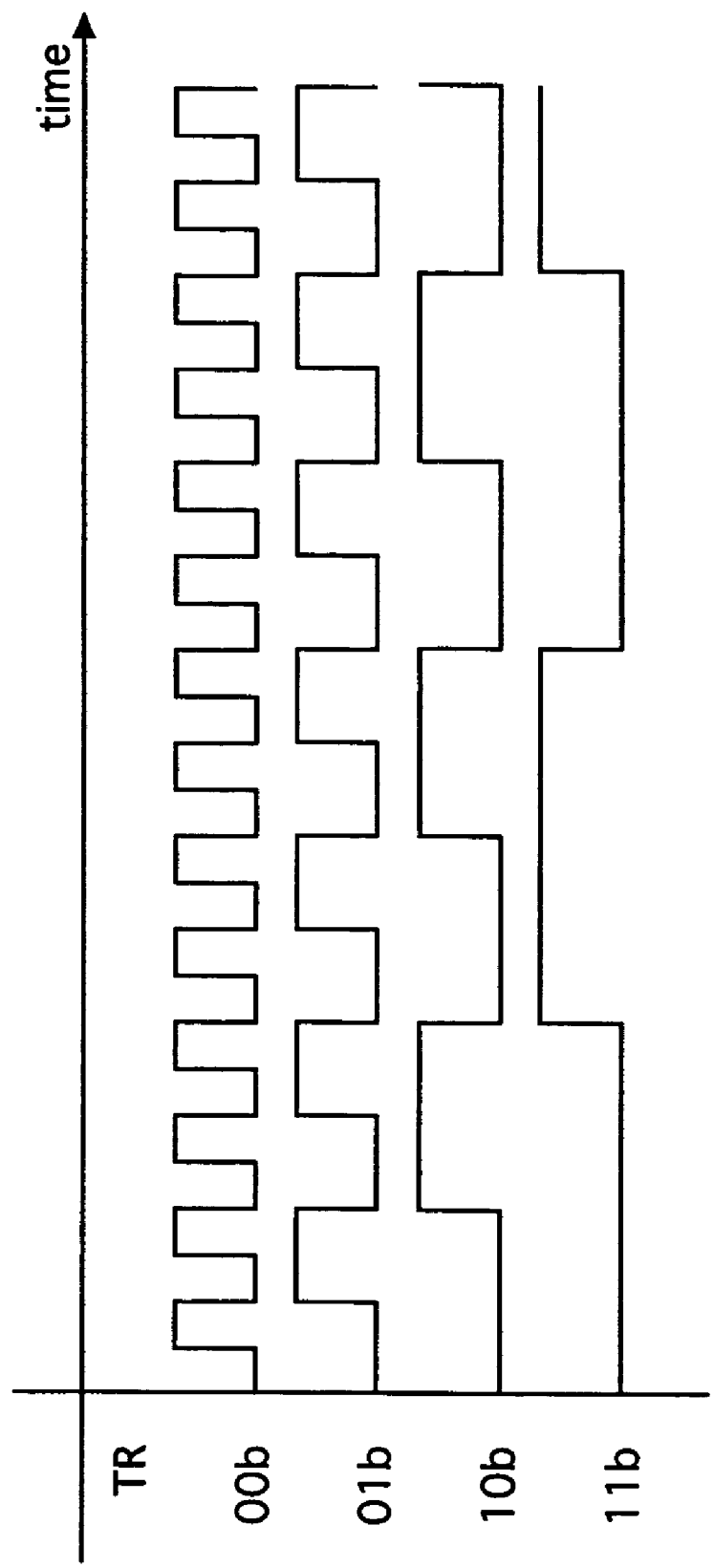
FIG. 37 shows a correspondence between TR signal and a clock signal output from the nonvolatile memory.

FIG. 37 shows a correspondence between TR signal and clock signal S1741c that is output from the nonvolatile memory 1741.

As illustrated, one of a clock signal with a shortest period, a clock signal with a twofold period, a clock signal with a fourfold period, and a clock signal with an eightfold period is output from the nonvolatile memory 1741 as clock signal S1741c, in accordance with TR signal.

FIG. 38 shows an example of data stored in the nonvolatile memory 1741 prior to the testing of the microcomputer unit 1930.

As shown in the drawing, a 1-bit SELP value which defines SELP signal indicating whether clock signal S1741c should be selected by the MPX 1945, a 2-bit TR value which defines TR signal, and test data are stored at each address in the nonvolatile memory 1741. The meaning of the test data has already been explained in the first and fourth embodiments.

In FIG. 38, a TR value corresponding to a CPU test data group is "11b", a TR value corresponding to another CPU test data group is "01b", a TR value corresponding to a D/A test data group is "11b", and a TR value corresponding to a timer test data group is "01b".

This being so, when the testing of the microcomputer unit 1930 begins, the reset signal generator 1907 outputs reset signal S1907a of high level, and the address generation circuit 102 sequentially outputs addresses which are incremented by 1 starting with "0000h" as address signal S102a. In response, the nonvolatile memory 1741 outputs SELP signal, TR signal, test signal S1741a, and expectation signal S1741b according to address signal S102a. Here, test signal S1741a and expectation signal S1741b each reflect data of a predetermined number of bits in test data which is stored at an address shown by address signal S102a.

In detail, the nonvolatile memory 1741 outputs SELP signal showing "1" to the MPX 1945. The MPX 1945 responsively selects clock signal S1741c generated from the nonvolatile memory 1741, and outputs it to each circuit block in the microcomputer unit 1930 via the CPU 131.

Meanwhile, TR signal is fed to the OSC 2028 in the nonvolatile memory 1741. Accordingly, the CPU 131 is initially tested at a low speed, and then tested at a fourfold speed. Following this, the D/A converter 137 is tested at the low speed. Lastly, the timer 133 is tested at the fourfold speed.

According to this embodiment, each circuit block in the microcomputer unit 1930 can easily be tested at various clock speeds.

Fifteenth Embodiment

The following describes a nonvolatile memory microcomputer to which the fifteenth embodiment of the invention relates, with reference to FIGS. 39 to 42.

Figure 39:
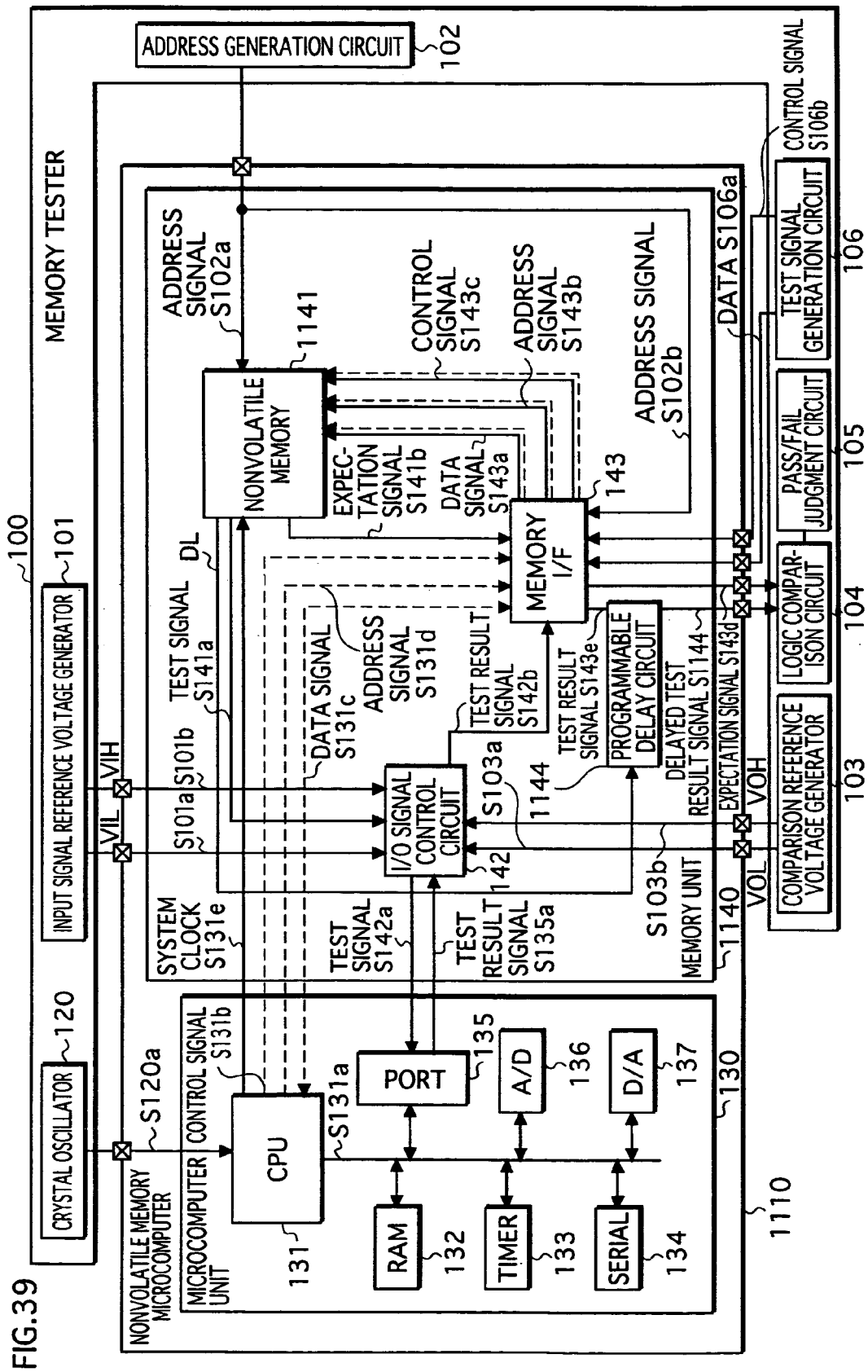
FIG. 39 shows a construction of a nonvolatile memory microcomputer to which the fifteenth embodiment of the invention relates.

FIG. 39 shows a construction of a nonvolatile memory microcomputer 1110 in the fifteenth embodiment.

The nonvolatile memory microcomputer 1110 is roughly made up of the microcomputer unit 130 and a memory unit 1140. The memory unit 1140 includes a nonvolatile memory 1141, the I/O signal control circuit 142, the memory I/F 143, and a programmable delay circuit 1144. The nonvolatile memory microcomputer 1110 is different form the nonvolatile memory microcomputer 110 of the first embodiment shown in FIG. 1 in the following point. The programmable delay circuit 1144 delays test result signal S143e output from the memory I/F 143, and outputs a resulting signal to the logic comparison circuit 104 as delayed test result signal S1144.

In the drawing, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

Figure 40:
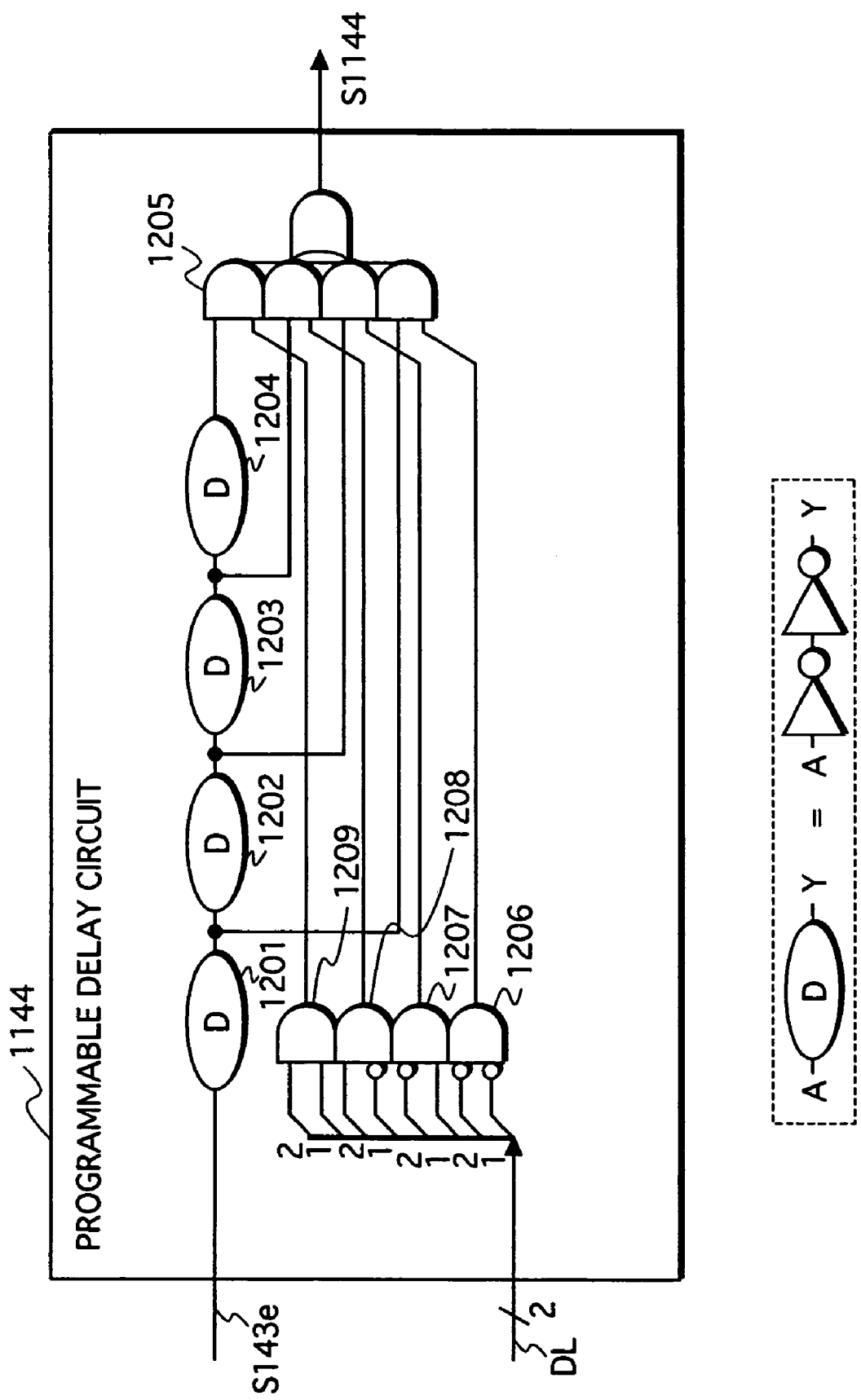
FIG. 40 shows a construction of a programmable delay circuit shown in FIG. 39.

FIG. 40 shows a construction of the programmable delay circuit 1144. With this construction, the programmable delay circuit 1144 delays test result signal S143e according to DL signal having a DL value which is shown by the higher-order 2 bits of data stored in the nonvolatile memory 1141 at an address shown by address signal S102a. The programmable delay circuit 1144 outputs a resulting signal as delayed test result signal S1144.

If DL signal shows "00b", a gate 1205 selects an output of a delay circuit 1201. As a result, test result signal 143e delayed by the delay circuit 1201 is output as delayed test result signal S1144.

If DL signal shows "01b", the gate 1205 selects an output of a delay circuit 1202. As a result, test result signal S143e delayed by the delay circuits 1201 and 1202 is output as delayed test result signal S1144.

If DL signal shows "10b", the gate 1205 selects an output of a delay circuit 1203. As a result, test result signal S143e delayed by the delay circuits 1201 to 1203 is output as delayed test result signal S1144.

If DL signal shows "11b", the gate 1205 selects an output of a delay circuit 1204. As a result, test result signal S143e delayed by the delay circuits 1201 to 1204 is output as delayed test result signal S1144.

FIG. 41 shows an example of data stored in the nonvolatile memory 1141 prior to the testing of the microcomputer unit 130.

As shown in the drawing, a 2-bit DL value which defines DL signal and test data are stored in the nonvolatile memory 1141 at each address. The meaning of the test data has already been explained in the first and fourth embodiments.

In FIG. 41, a DL value corresponding to a CPU test data group is "11b", and a DL value corresponding to a D/A test data group is "00b".

This being so, when the testing of the microcomputer unit 130 begins, the address generation circuit 102 sequentially outputs addresses which are incremented by 1 starting with "0000h", as address signal S102a. In response, the nonvolatile memory 1141 outputs DL signal, test signal S141a, and expectation signal S141b. Here, test signal S141a and expectation signal S141b each reflect data of a predetermined number of bits in test data stored at an address shown by address signal S102a.

DL signal is fed to the programmable delay circuit 1144. As a result, the CPU 131 is tested based on delayed test result signal S1144 that is obtained by delaying test result signal S143e by a first time period by the delay circuits 1201 to 1204. Following this, the D/A converter 137 is tested based on delayed test result signal S1144 that is obtained by delaying test result signal S143e by a second time period by the delay circuit 1201.

The following explains timings of main signals which relate to the above testing of the CPU 131 and the D/A converter 137.

Figure 42:
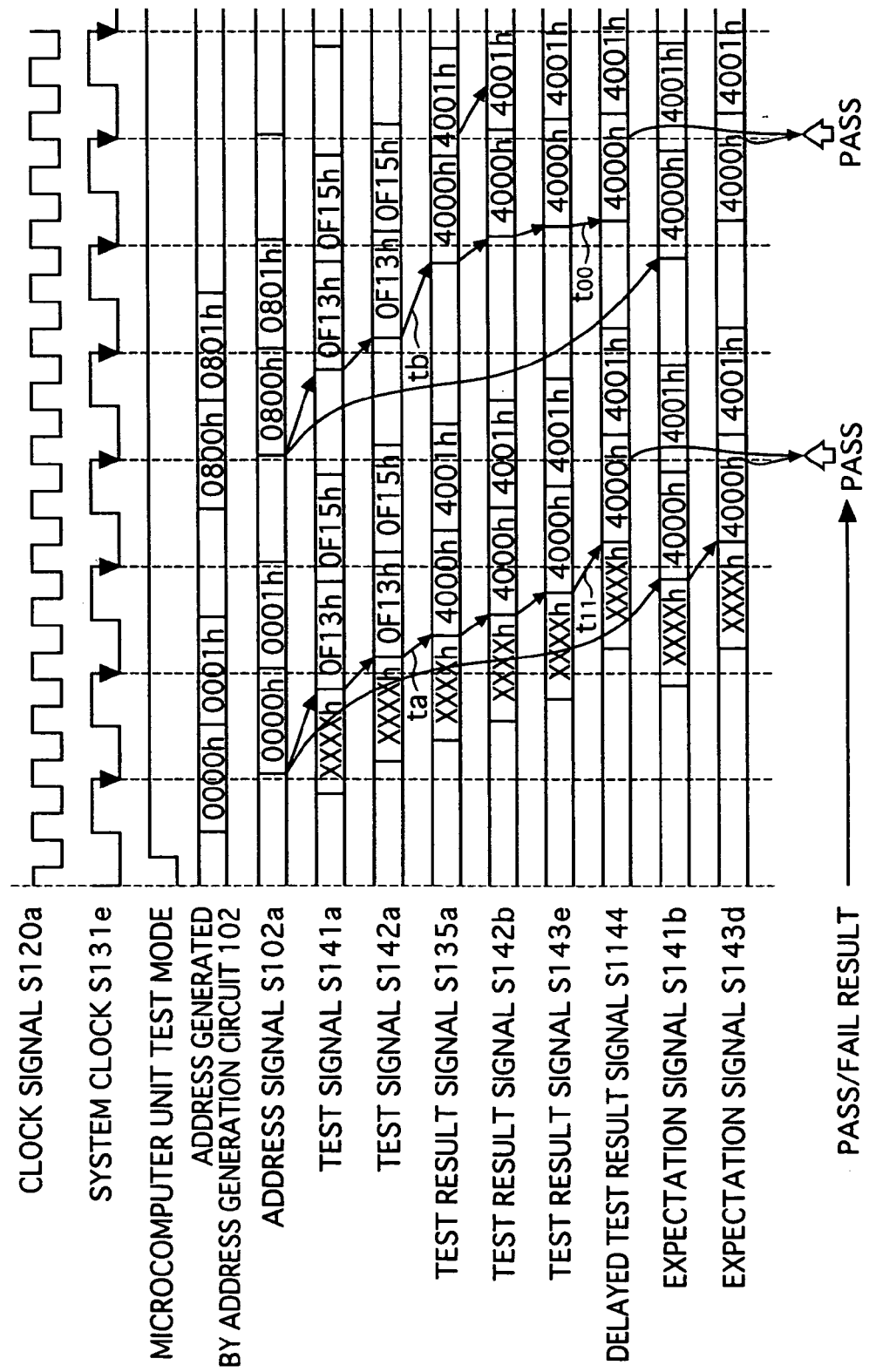
FIG. 42 is a timing chart showing an occurrence relationship of main signals when testing the microcomputer unit.

FIG. 42 is a timing chart showing an occurrence relationship of such signals. When compared with the timing chart in the first embodiment shown in FIG. 5, a main difference lies in that expectation signal S141b is output one clock cycle after corresponding test signal S141a, and that the pass/fail judgment is made based on delayed test result signal S1144 and expectation signal S143d.

Such a delay of expectation signal S141b can be made by arranging test data so that an expectation signal is paired with a test signal immediately following a corresponding test signal, as mentioned in the first embodiment.

Also, test result signal S143e is delayed so as to make delayed test result signal S1144 perfectly synchronized with expectation signal S143d, as explained below.

In the first half period of FIG. 42, the CPU 131 receives test signal S142a, and returns test result signal S135a after delay time ta. Test result signal S135a is passed to the programmable delay circuit 1144 as test result signal S143e. The programmable delay circuit 1144 provides delay time t11 which reflects the DL value "11" used during this period, to test result signal S143e. This generates delayed test result signal S1144. Here, delay time t11 is set so as to make delayed test result signal S1144 perfectly synchronized with expectation signal S143d if delay time ta is a correct delay time based on a test standard. The logic comparison circuit 104 compares delayed test result signal S1144 and expectation signal S143d with a trailing edge of system clock S131e, and the pass/fail judgment circuit 105 judges that the nonvolatile memory microcomputer 1110 is nondefective.

In the latter half period of FIG. 42, the D/A converter 137 receives test signal S142a, and returns test result signal S135a after delay time tb. Test result signal S135a is passed to the programmable delay circuit 1144 as test result signal S143e. The programmable delay circuit 1144 provides delay time t00 which reflects the DL value "00" used during this period, to test result signal S143e. This generates delayed test result signal S1144. Here, delay time t00 is set so as to make delayed test result signal S1144 perfectly synchronized with expectation signal S143d if delay time tb is a correct delay time based on a test standard. The logic comparison circuit 104 compares delayed test result signal S1144 with expectation signal S143d with a trailing edge of system clock S131e, and the pass/fail judgment circuit 105 judges that the nonvolatile memory microcomputer 1110 is nondefective.

The above pass/fail judgment may be made with a timing other than a trailing edge of system clock S131e. For example, the pass/fail judgment can be made immediately before or after expectation signal S143d transitions.

According to this embodiment, a test result signal returned from a circuit block of the microcomputer unit 130 is delayed by a delay time that corresponds to a period from when the test result signal should be returned if the circuit block operates correctly to when the next clock cycle begins, so as to generate a delayed test result signal that perfectly synchronizes with an expectation signal which is output with a delay of one clock cycle. This delayed test result signal is compared with the expectation signal. In so doing, even a slight deviation of less than one clock cycle from the timing at which the test result signal should be returned if the circuit block operates correctly can be detected.

Sixteenth Embodiment

The following describes a nonvolatile memory microcomputer to which the sixteenth embodiment of the invention relates, with reference to FIGS. 43 to 46.

Figure 43:
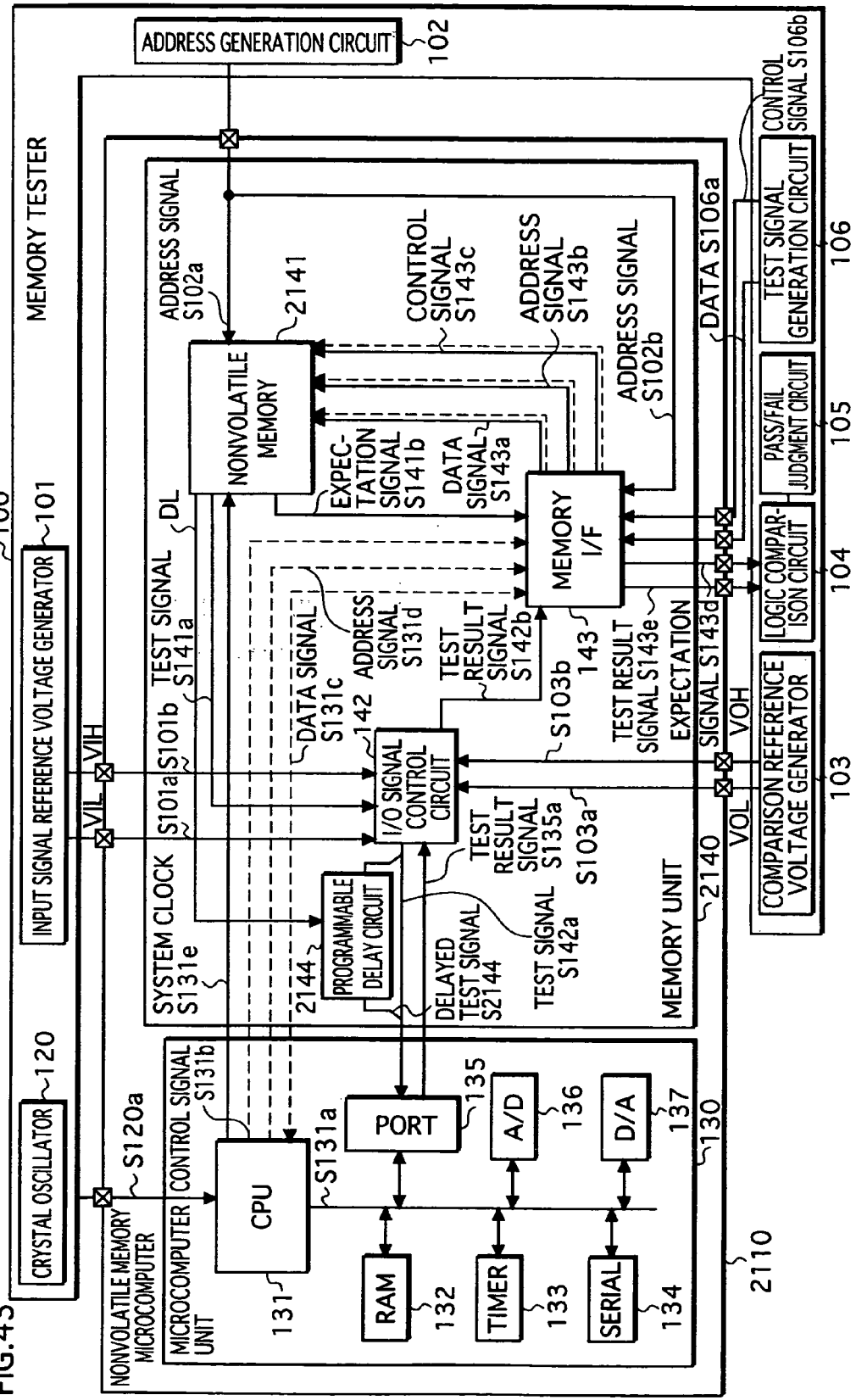
FIG. 43 shows a construction of a nonvolatile memory microcomputer to which the sixteenth embodiment of the invention relates.

FIG. 43 shows a construction of a nonvolatile memory microcomputer 2110 in the sixteenth embodiment.

The nonvolatile memory microcomputer 2110 is roughly made up of the microcomputer unit 130 and a memory unit 2140. The memory unit 2140 includes a nonvolatile memory 2141, the I/O signal control circuit 142, the memory I/F 143, and a programmable delay circuit 2144. The nonvolatile memory microcomputer 2110 is different from the nonvolatile memory microcomputer 110 of the first embodiment shown in FIG. 1, in that one of test signal S142a and delayed test signal S2144 which is obtained by delaying test signal S142a by the programmable delay circuit 2144 is supplied to the port 135.

In FIG. 43, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

Figure 44:
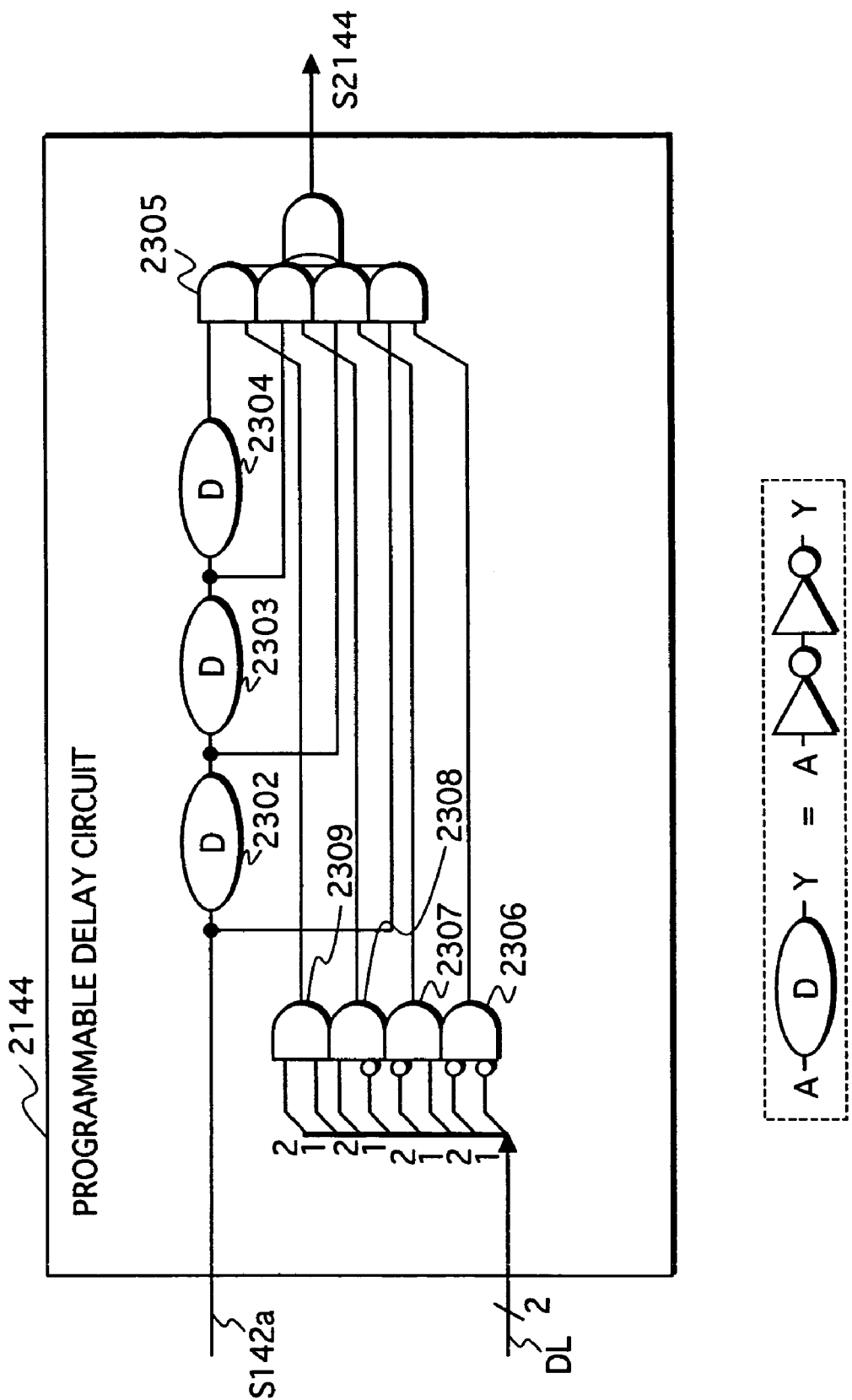
FIG. 44 shows a construction of a programmable delay circuit shown in FIG. 43.

FIG. 44 shows a construction of the programmable delay circuit 2144. With this construction, the programmable delay circuit 2144 delays test signal S142a according to DL signal having a DL value that is shown by the higher-order 2 bits of data stored in the nonvolatile memory 2141 at an address shown by address signal S102a, to generate delayed test signal S2144.

The programmable delay circuit 2144 has roughly the same construction as the programmable delay circuit 1144 in the fifteenth embodiment, and differs only in that the first delay circuit has been omitted.

FIG. 45 shows an example of data stored in the nonvolatile memory 2141 prior to the testing of the microcomputer unit 130.

As shown in the drawing, a 2-bit DL value which defines DL signal and test data are stored in the nonvolatile memory 2141 at each address. The meaning of the test data has already been explained in the first and fourth embodiments.

In FIG. 45, DL values corresponding to a serial test data group are "00b", "01b", "10b", and "11b".

This being so, when the testing of the microcomputer unit 130 begins, the address generation circuit 102 sequentially outputs addresses which are incremented by 1 starting with "0000h", as address signal S102a. In response, the nonvolatile memory 2141 outputs DL signal, test signal S141a, and expectation signal S141b. Here, test signal S141a and expectation signal S141b each reflect data of a predetermined number of bits in test data stored at an address shown by address signal S102a.

DL signal is fed to the programmable delay circuit 2144. As a result, the serial I/F 134 is initially tested using test signal S142a, i.e., delayed test signal S2144 which is obtained by delaying test signal S142a by a first delay time by a gate 2305. Following this, the serial I/F 134 is tested using delayed test signal S2144 which is obtained by delaying test signal S142a by a second delay time by a delay circuit 2302. Following this, the serial I/F 134 is tested using delayed test signal S2144 which is obtained by delaying test signal S142a by a third delay time by delay circuits 2302 and 2303. Following this, the serial I/F 134 is tested using delayed test signal S2144 which is obtained by delaying test signal S142a by a fourth delay time by delay circuits 2302 to 2304.

The following explains timings of main signals which relate to the above testing of the serial I/F 134.

Figure 46:
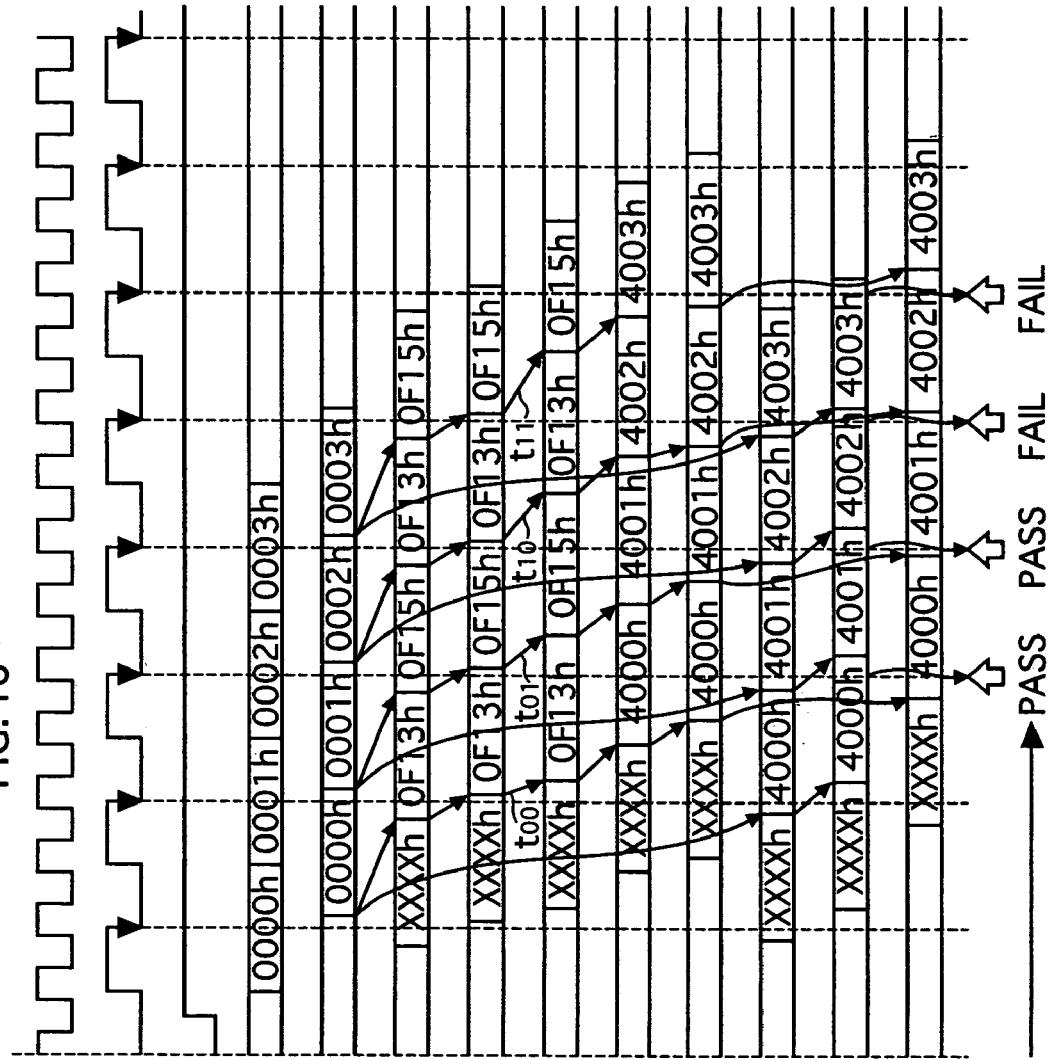
FIG. 46 is a timing chart showing an occurrence relationship of main signals when testing the microcomputer unit.

FIG. 46 is a timing chart showing an occurrence relationship of such signals. When compared with the timing chart of the first embodiment shown in FIG. 5, a main difference lies in that the pass/fail judgment is made based on test result signal S135a which is returned in response to delayed test signal S2144.

First, the programmable delay circuit 2144 provides delay time t00 corresponding to the DL value "00", to test signal S142a corresponding to address 0000h shown by address signal S102a. The programmable delay circuit 2144 outputs a resulting signal as delayed test signal S2144. Test result signal S135a is returned in response to delayed test signal S2144, and passed to the logic comparison circuit 104 as test result signal S143e. Since test result signal S143e reaches the logic comparison circuit 104 before a trailing edge of system clock S131e that is a pass/fail judgment timing, the nonvolatile memory microcomputer 2110 is judged as being nondefective.

Following this, the pass/fail judgment is made based on delayed test signal S2144 which is obtained by delaying test signal S142a by delay time t01. Since test result signal S143e reaches the logic comparison circuit 104 before a pass/fail judgment timing, the nonvolatile memory microcomputer 2110 is judged as being nondefective.

Following this, the pass/fail judgment is made based on delayed test signal S2144 which is obtained by delaying test signal S142a by delay time t10, and then based on delayed test signal S2144 which is obtained by delaying test signal S142a by delay time t11. In these cases, test result signal S143e does not reach the logic comparison circuit 104 before a pass/fail judgment timing, so that the nonvolatile memory microcomputer 2110 is judged as being defective.

According to this embodiment, a circuit block in the microcomputer unit 130 is tested using a delayed test signal obtained by delaying a test signal by various delay times. This makes it easier to evaluate an upper limit to a permissible delay time of a test signal, i.e., an input signal in actual use.

A time difference (i.e. an amount of delay provided by the programmable delay circuit 2144) between an original test signal without delay and a delayed test signal is called a skew. Take an example of evaluating the serial I/F 134 in asynchronous communication. By testing the serial I/F 134 using a delayed test signal with various skews as an asynchronous input signal in actual use, a maximum permissible skew of the serial I/F 134 can easily be identified.

Seventeenth Embodiment

Figure 47:
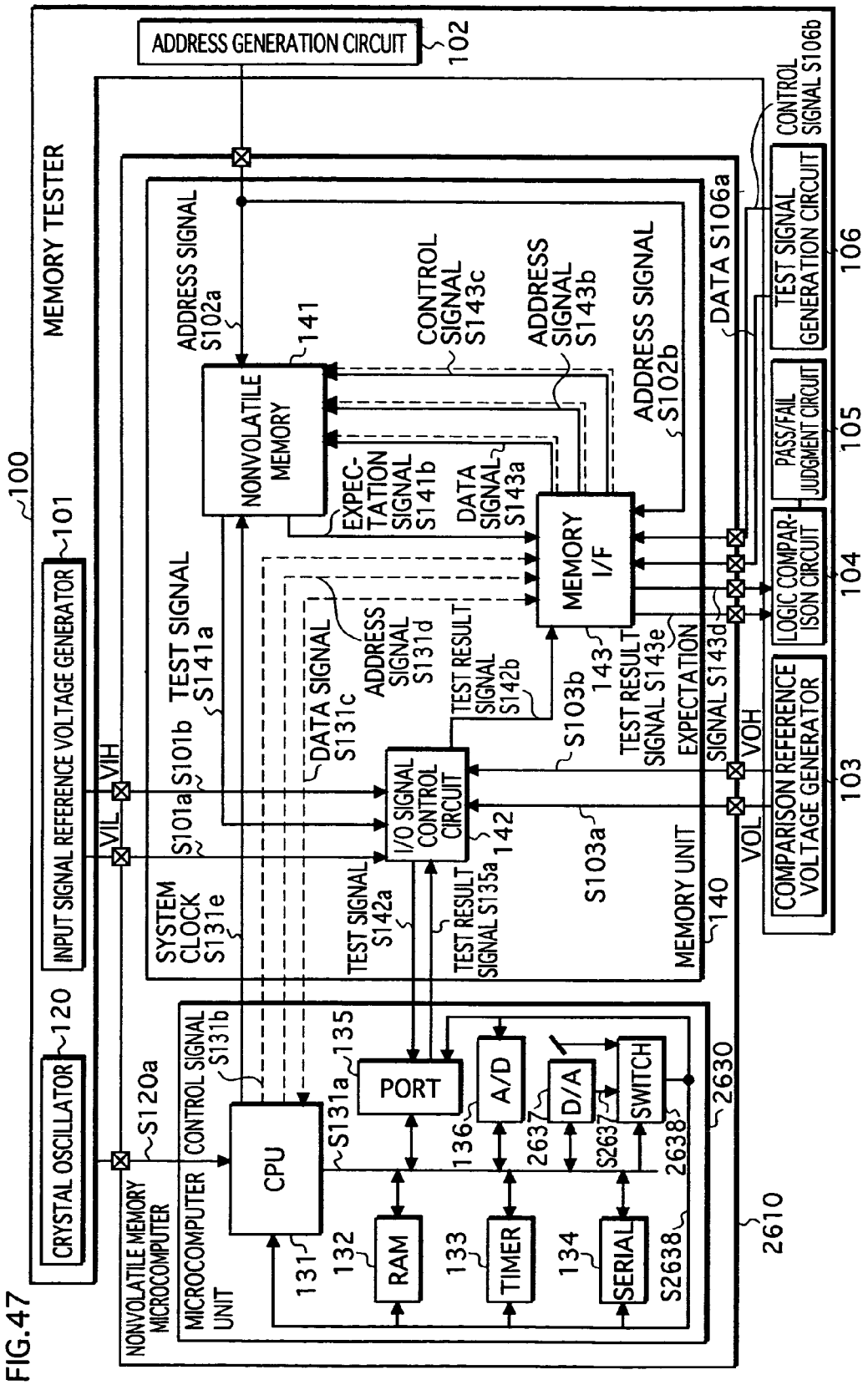
FIG. 47 shows a construction of a nonvolatile memory microcomputer to which the seventeenth embodiment of the invention relates.

The following describes a nonvolatile memory microcomputer to which the seventeenth embodiment of the invention relates, with reference to FIGS. 47 and 48.

FIG. 47 shows a construction of a nonvolatile memory microcomputer 2610 in the seventeenth embodiment.

The nonvolatile memory microcomputer 2610 is roughly made up of a microcomputer unit 2630 and the memory unit 140. The microcomputer unit 2630 includes the CPU 131, the RAM 132, the timer 133, the serial I/F 134, the port 135, the A/D converter 136, a D/A converter 2637, and a switch 2638. The nonvolatile memory microcomputer 2610 differs from the nonvolatile memory microcomputer 110 of the first embodiment shown in FIG. 1, mainly in that one out of output S2637 of the D/A converter 2637 and external power applied from outside the nonvolatile memory microcomputer 2610 is supplied via the switch 2638 to each circuit block in the microcomputer unit 2630 other than the D/A converter 2637, as operating power S2638.

The D/A converter 2637 adjusts a voltage of the external power to one out of four voltages according to 2-bit TR signal, and outputs a result as output S2637. The switch 2638 supplies one of output S2637 of the D/A converter 2637 and the external power to each circuit block other than the D/A converter 2637, according to 1-bit SELP signal. TR signal and SELP signal referred to here are input to the port 135 as part of test signal S142a, and supplied respectively to the D/A converter 2637 and the switch 2638.

In FIG. 47, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 48 shows an example of data stored in the nonvolatile memory 141 prior to the testing of the microcomputer unit 2630.

As shown in the drawing, a 1-bit SELP value which defines SELP signal, a 2-bit TR value which defines TR signal, and test data are stored in the nonvolatile memory 141 at each address. The meaning of the test data has already been explained in the first and fourth embodiments.

In FIG. 48, a SELP value corresponding to a test data group using the external power is "1b". A SELP value and a TR value corresponding to a test data group using power of a first voltage are "0b" and "01b", respectively. A SELP value and a TR value corresponding to a test data group using power of a second voltage are "0b" and "11b", respectively. A SELP value corresponding to a test data group using power of a varying voltage is "0b", and TR values corresponding to the same test data group are "00b", "01b", "10b", "11b", . . . .

This being so, when the testing of the microcomputer unit 2630 begins, the address generation circuit 102 sequentially outputs addresses which are incremented by 1 starting with 0000h, as address signal S102a. In response, the nonvolatile memory 141 outputs test signal S141a including SELP signal and TR signal and expectation signal S141b. Here, test signal S141a and expectation signal S141b each reflect data of a predetermined number of bits stored at an address shown by address signal S102a.

The switch 2638 receives SELP signal showing the SELP value "1b", and supplies the external power to a circuit block in the microcomputer unit 2630 as operating power S2638. Hence the microcomputer unit 2630 is tested using the external power.

Following this, the D/A converter 2637 receives TR signal showing the TR value "01b", and generates a first voltage as output S2637. Meanwhile, the switch 2638 receives SELP signal showing the SELP value "0b". The switch 2638 responsively supplies output S2637 to a circuit block in the microcomputer unit 2630 as operating power S2638. Hence the microcomputer unit 2630 is tested using power of the first voltage.

Following this, the microcomputer unit 2630 is tested using power of the second voltage, based on TR signal showing the TR value "11b" and SELP signal showing the SELP value "0b".

Following this, the D/A converter 2637 receives TR signal showing the TR values "00b" to "11b" in sequence. The D/A converter 2637 responsively generates four voltages in turn as output S2637. Meanwhile, the switch 2638 receives SELP signal showing the SELP value "0b". The switch 2638 responsively supplies output S2637 to a circuit block in the microcomputer unit 2630 as operating power S2638. As a result, the microcomputer unit 2630 is tested using power of varying voltage.

For example, this construction enables the following test to be conducted.

First, the microcomputer unit 2630 is tested using power of the first voltage, before a chip is taken from a wafer. In this case, the address generation circuit 102 sequentially generates addresses which are incremented by 1 starting with 0800h, as address signal S102a.

Next, the microcomputer unit 2630 is tested using power of the second voltage after packaging. In this case, the address generation circuit 102 sequentially generates addresses which are incremented by 1 starting with 1000h, as address signal S102a.

Furthermore, the microcomputer unit 2630 is tested using power of a varying voltage, to evaluate the power supply voltage dependence of the microcomputer unit 2630 (i.e. SHMOO measurements). This is performed by varying a power supply voltage by, for example, 0.2V. In this case, the address generation circuit 102 sequentially generates addresses which are incremented by 1 starting with 1800h, as address signal S102a.

According to this embodiment, each circuit block in the microcomputer unit 2630 can easily be tested using various power supply voltages.

Eighteenth Embodiment

Figure 49:
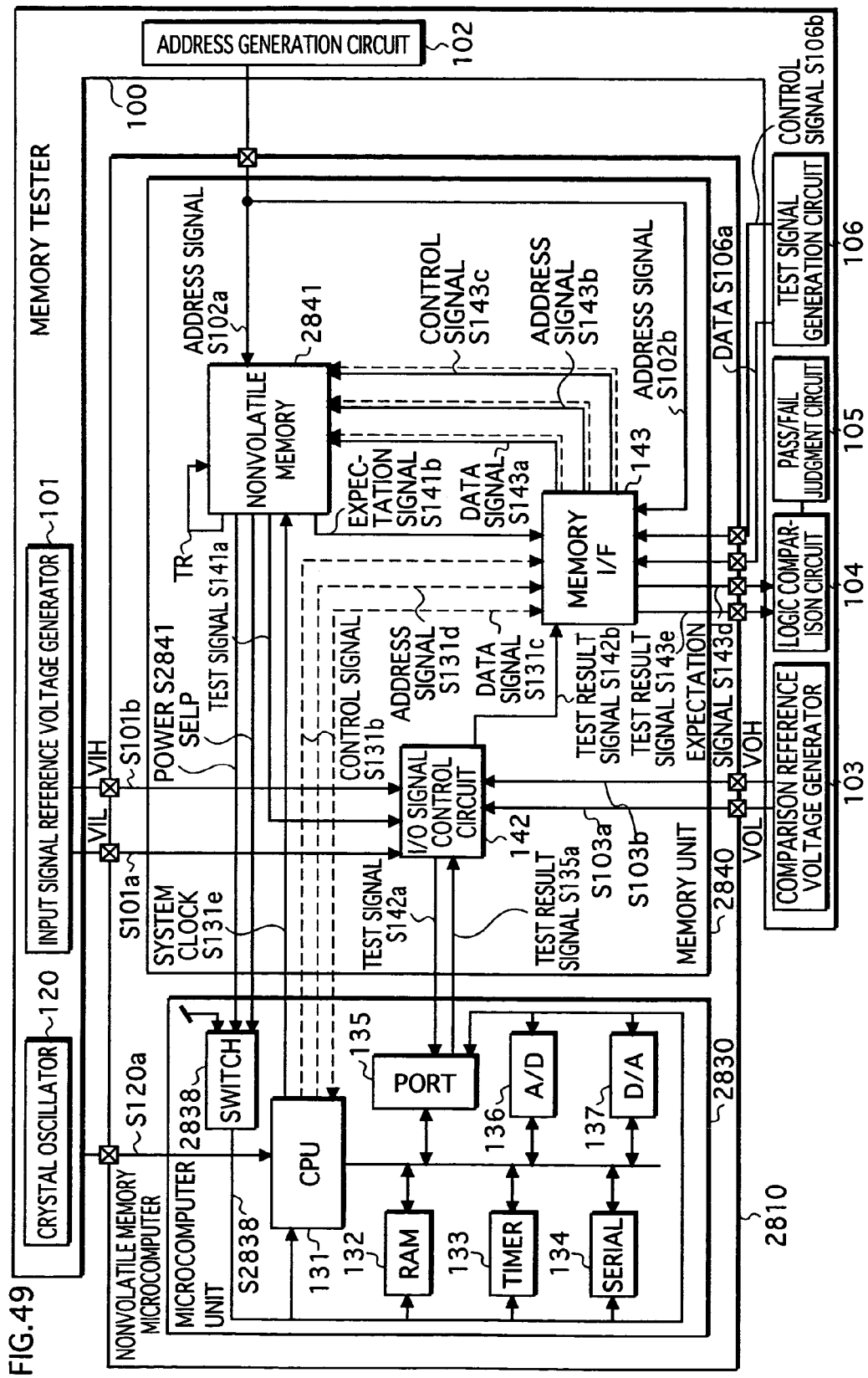
FIG. 49 shows a construction of a nonvolatile memory microcomputer to which the eighteenth embodiment of the invention relates.
Figure 50:
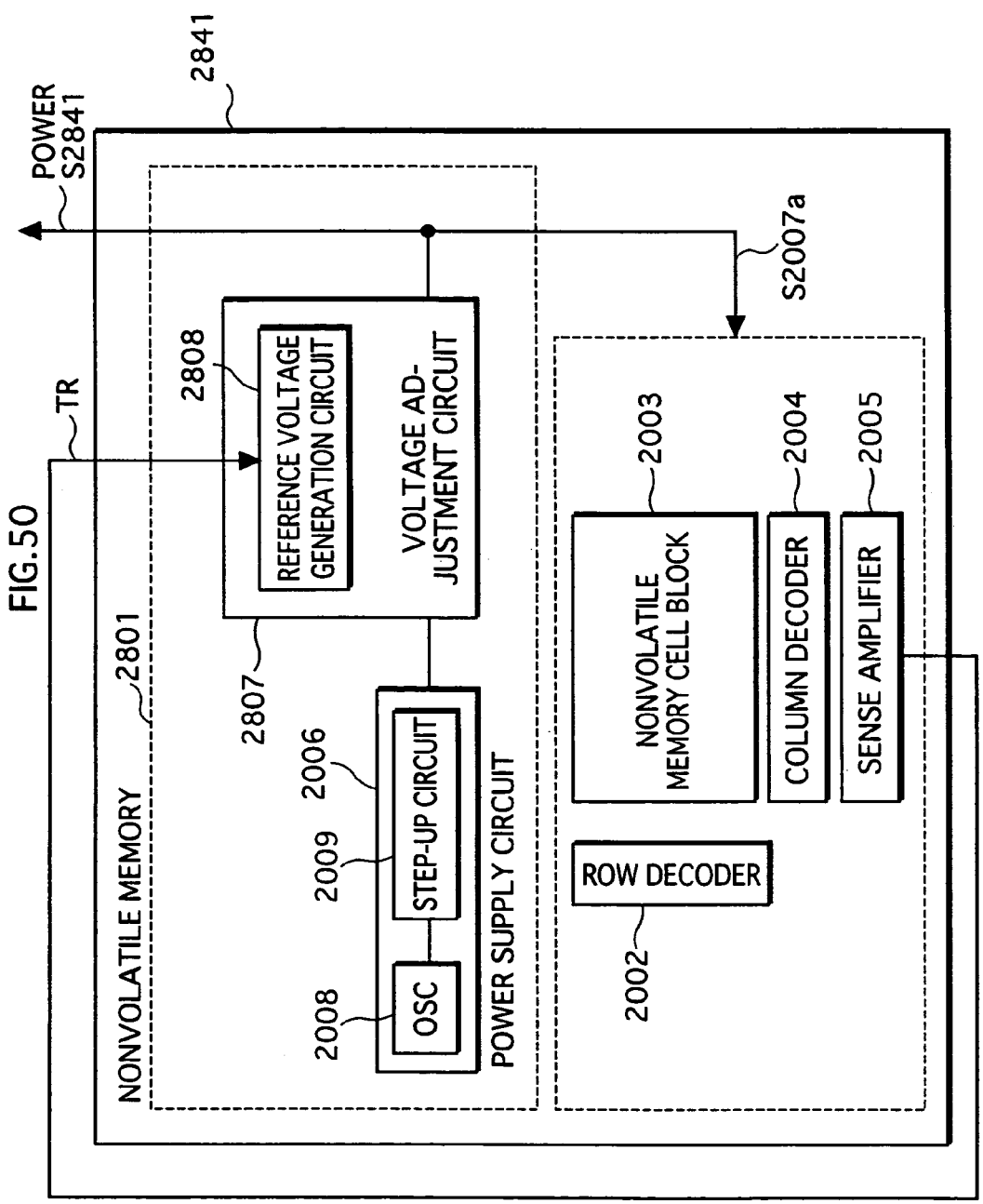
FIG. 50 shows a construction of a nonvolatile memory shown in FIG. 49.

The following describes a nonvolatile memory microcomputer to which the eighteenth embodiment of the invention relates, with reference to FIGS. 49 and 50.

FIG. 49 shows a construction of a nonvolatile memory microcomputer 2810 in the eighteenth embodiment.

The nonvolatile memory microcomputer 2810 is roughly made up of a microcomputer unit 2830 and a memory unit 2840. The microcomputer unit 2830 includes the CPU 131, the RAM 132, the timer 133, the serial I/F 134, the port 135, the A/D converter 136, the D/A converter 137, and a switch 2838. The memory unit 2840 includes a nonvolatile memory 2841, the I/O signal control circuit 142, and the memory I/F 143. The nonvolatile memory microcomputer 2810 differs from the nonvolatile memory microcomputer 110 of the first embodiment shown in FIG. 1, mainly in that one of power S2841 output from the nonvolatile memory 2841 and external power is supplied to a circuit block in the microcomputer unit 2830 via the switch 2838, as operating power S2838.

The switch 2838 supplies one of power S2841 and the external power to a circuit block in the microcomputer unit 2830, according to 1-bit SELP signal output from the nonvolatile memory 2841.

In FIG. 49, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 50 shows a construction of the nonvolatile memory 2841. The nonvolatile memory 2841 differs from the nonvolatile memory 1941 of the twelfth embodiment shown in FIG. 28, in that the power supply circuit 2001 has been replaced with a power supply circuit 2801. A main difference is the following. A reference voltage generation circuit 2808 in a voltage adjustment circuit 2807 generates one of four reference voltages, according to TR signal having a TR value that is shown by the second and third bits from the most significant bit of data stored in the nonvolatile memory cell block 2003 at an address shown by address signal S102a. The voltage adjustment circuit 2807 generates one of four adjusted voltages based on the reference voltage generated by the reference voltage generation circuit 2808, and outputs it as power S2841.

Since the power supply circuit 2801 includes the step-up circuit 2009, the voltage adjustment circuit 2807 can generate power S2841 that is higher than a normal power supply voltage.

Suppose the data shown in FIG. 48 in the seventeenth embodiment is stored in the nonvolatile memory 2841.

This being so, when the testing of the microcomputer unit 2830 begins, the address generation circuit 102 sequentially outputs addresses which are incremented by 1 starting with "0000h", as address signal S102a. In response, the nonvolatile memory 2841 outputs SELP signal, TR signal, test signal S141a, and expectation signal S141b. Here, test signal S141a and expectation signal S141b each reflect data of a predetermined number of bits in test data which is stored at an address shown by address signal S102a.

As a result, the switch 2838 receives SELP signal showing the SELP value "1b". The switch 2838 responsively supplies the external power to a circuit block in the microcomputer unit 2830 as operating power S2838. Hence the microcomputer unit 2830 is tested using the external power.

Following this, the reference voltage generation circuit 2808 receives TR signal showing the TR value "01b". The reference voltage generation circuit 2808 responsively generates a first reference voltage. The voltage adjustment circuit 2807 generates a first voltage based on the first reference voltage, and outputs it as power S2841. In the meantime, the switch 2838 receives SELP signal showing the SELP value "0b". The switch 2838 responsively supplies power S2841 to each circuit block in the microcomputer unit 2830 as operating power S2838. Hence the microcomputer unit 2830 is tested using the power of the first voltage.

Following this, the microcomputer unit 2830 is tested using power of a second voltage based on TR signal showing "11b" and SELP signal showing "0b", in the same way as above.

Following this, the reference voltage generation circuit 2808 receives TR signal which shows the TR values "00b" to "11b" in sequence. The reference voltage generation circuit 2808 responsively generates four reference voltages in sequence, The voltage adjustment circuit 2807 generates four voltages based on the four reference voltages and outputs them as power S2841, in sequence. In the meantime, the switch 2838 receives SELP signal showing the SELP value "0b". The switch 2838 responsively supplies power S2841 to a circuit block in the microcomputer unit 2830 as operating power S2838. Hence the microcomputer unit 2830 is tested using the power of the varying voltage.

According to this embodiment, each circuit block in the microcomputer unit 2830 can easily be tested using various power supply voltages that are higher than a power supply voltage given from outside the nonvolatile memory microcomputer 2810.

Nineteenth Embodiment

Figure 51:
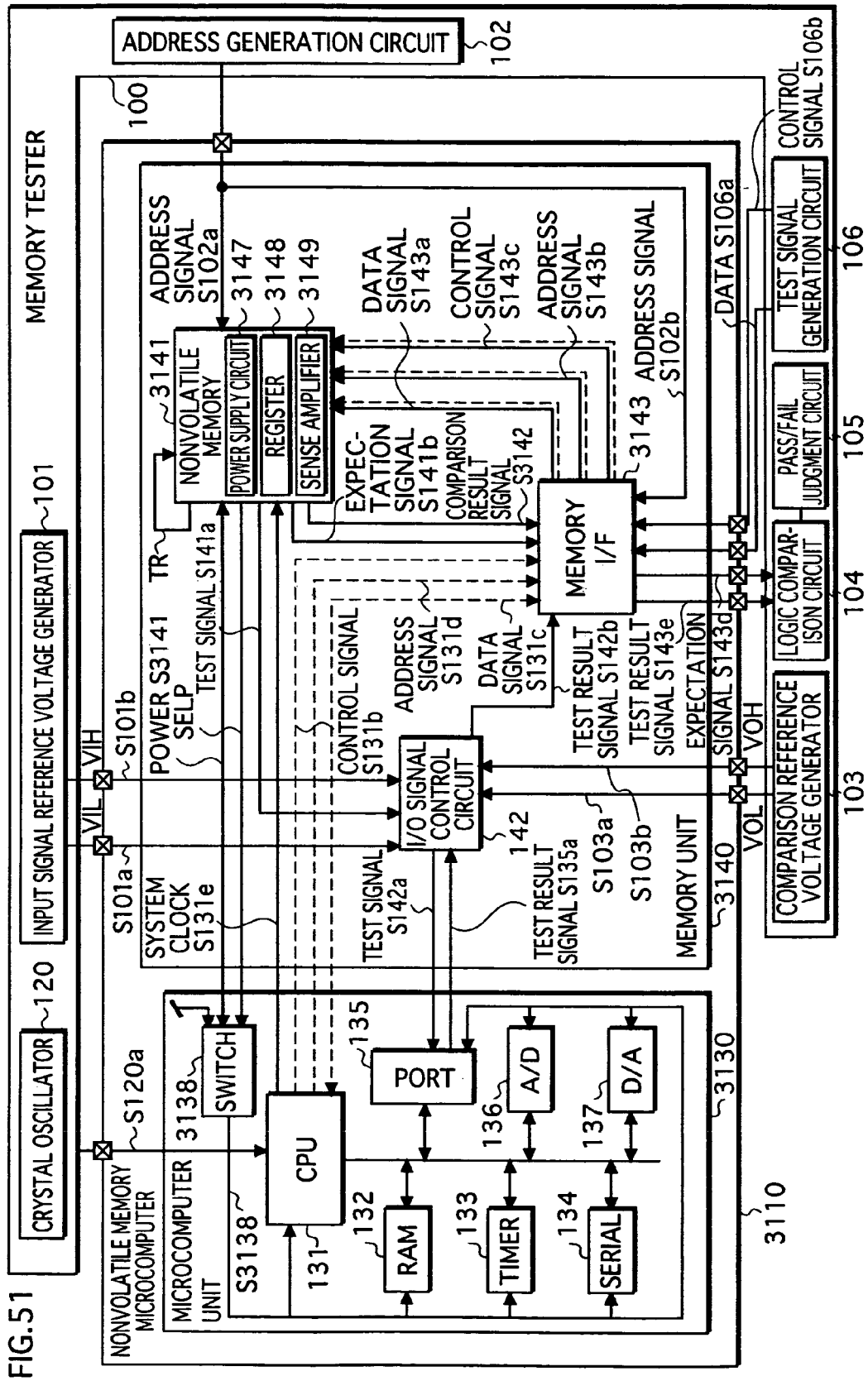
FIG. 51 shows a construction of a nonvolatile memory microcomputer to which the nineteenth embodiment of the invention relates.
Figure 52:
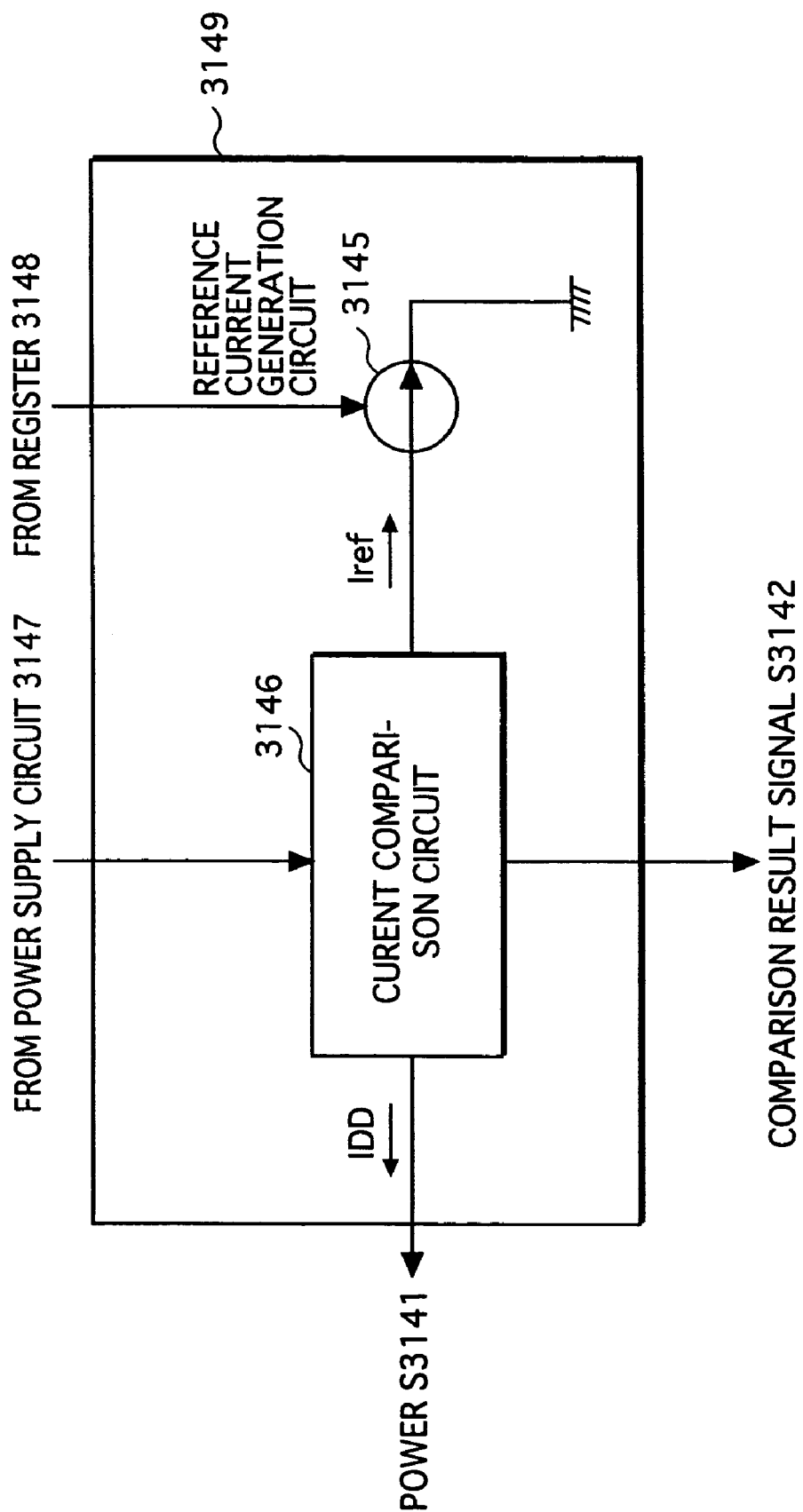
FIG. 52 shows a construction of a sense amplifier shown in FIG. 51.

The following describes a nonvolatile memory microcomputer to which the nineteenth embodiment of the invention relates, with reference to FIGS. 51 to 53.

FIG. 51 shows a construction of a nonvolatile memory microcomputer 3110 in the nineteenth embodiment.

The nonvolatile memory microcomputer 3110 is a modification to the nonvolatile memory microcomputer 2810 of the eighteenth embodiment shown in FIG. 49. In detail, the nonvolatile memory microcomputer 3110 is roughly made up of a microcomputer unit 3130 and a memory unit 3140. The microcomputer unit 3130 includes the CPU 131, the RAM 132, the timer 133, the serial I/F 134, the port 135, the A/D converter 136, the D/A converter 137, and a switch 3138. The memory unit 3140 includes a nonvolatile memory 3141, the I/O signal control circuit 142, and a memory I/F 3143.

The nonvolatile memory 3141 includes a power supply circuit 3147, a register 3148, a sense amplifier 3149, and a nonvolatile memory cell block (not illustrated).

The nonvolatile memory microcomputer 3110 differs from the nonvolatile memory microcomputer 2810 mainly in the following point. Power S3141 is supplied from the power supply circuit 3147 to the microcomputer unit 3130 through the sense amplifier 3149. The sense amplifier 3149 judges whether a current of power S3141 exceeds an upper limit shown by TR signal, and outputs comparison result signal S3142 showing a judgment result to the memory I/F 3143. The memory I/F 3143 outputs comparison result signal S3142 to the logic comparison circuit 104 as part of test result signal S143e.

The pass/fail judgment circuit 105 judges the nonvolatile memory microcomputer 3110 as being defective, if comparison result signal S3142 shows that the current of power S3141 exceeds the upper limit. Otherwise, the pass/fail judgment circuit 105 judges the nonvolatile memory microcomputer 3110 as being nondefective.

The register 3148 stores a TR value shown by TR signal. In this embodiment, a TR value is used to indicate an upper limit to a power supply current, and the power supply circuit 3147 generates a single fixed voltage.

Components which are the same as those in the preceding embodiments have been given the same reference numerals and their explanation has been omitted.

FIG. 52 shows a construction of the sense amplifier 3149. The sense amplifier 3149 includes a reference current generation circuit 3145 and a current comparison circuit 3146. The reference current generation circuit 3145 generates one of four reference currents according to the TR value of, for example, 2 bits stored in the register 3148. The current comparison circuit 3146 outputs comparison result signal S3142 showing whether current IDD of power S3141 output from the power supply circuit 3147 exceeds an upper limit determined according to reference current Iref generated by the reference current generation circuit 3145.

For example, when the register 3148 stores the TR value "01b", the upper limit is set at 6 μA that meets a STOP current standard for the microcomputer unit 3130. When the register 3148 stores the TR value "11b", the upper limit is set at 100 mA that meets an operating current standard for the microcomputer unit 3130.

FIG. 53 shows an example of data stored in the nonvolatile memory 3141 prior to the testing of the microcomputer unit 3130.

As shown in the drawing, a 1-bit SELP value which defines SELP signal, a 2-bit TR value which defines TR signal, and test data are stored in the nonvolatile memory 3141 at each address. The meaning of the test data has already been explained in the first and fourth embodiments.

In FIG. 53, a SELP value corresponding to a test data group without concern for any current standard is "1b". A SELP value and a TR value corresponding to a test data group according to the STOP current standard are "0b" and "01b", respectively. A SELP value and a TR value corresponding to a test data group according to the operating current standard are "0b" and "11b", respectively.

This being so, when the testing of the microcomputer unit 3130 begins, the address generation circuit 102 sequentially generates addresses which are incremented by 1 starting with 0000h, as address signal S102a. In response, the nonvolatile memory 3141 outputs SELP signal, TR signal, test signal S141a, and expectation signal S141b. Here, test signal S141a and expectation signal S141b each reflect data of a predetermined number of bits in test data stored at an address shown by address signal S102a.

As a result, the switch 3138 receives SELP signal showing the SELP value "1b". The switch 3138 responsively supplies the external power to a circuit block in the microcomputer unit 3130 as operating power S3138. Since the external power does not pass the sense amplifier 3149, the pass/fail judgment based on comparison result signal S3142 is not performed. Hence the microcomputer unit 3130 is tested without concern for any current standard.

Following this, the register 3148 receives TR signal showing the TR value "01b". The register 3148 stores the TR value, and also outputs it to the reference current generation circuit 3145. The reference current generation circuit 3145 responsively generates a first reference current. In the meantime, the switch 3138 receives SELP signal showing the SELP value "0b". The switch 3138 responsively supplies power S3141 to each circuit block in the microcomputer unit 3130 as operating power S3138. Meanwhile, the current comparison circuit 3146 compares a current of power S3141 with an upper limit that meets the STOP current standard and is set according to the first reference current. Hence the microcomputer unit 3130 is tested based on the STOP current standard.

Following this, the microcomputer unit 3130 is tested based on the operating current standard according to TR signal showing "11b" and SELP signal showing "0b", in the same way as above.

According to this embodiment, the current consumption of the microcomputer unit 3130 can easily be tested based on various current standards.

Twentieth Embodiment

Figure 54:
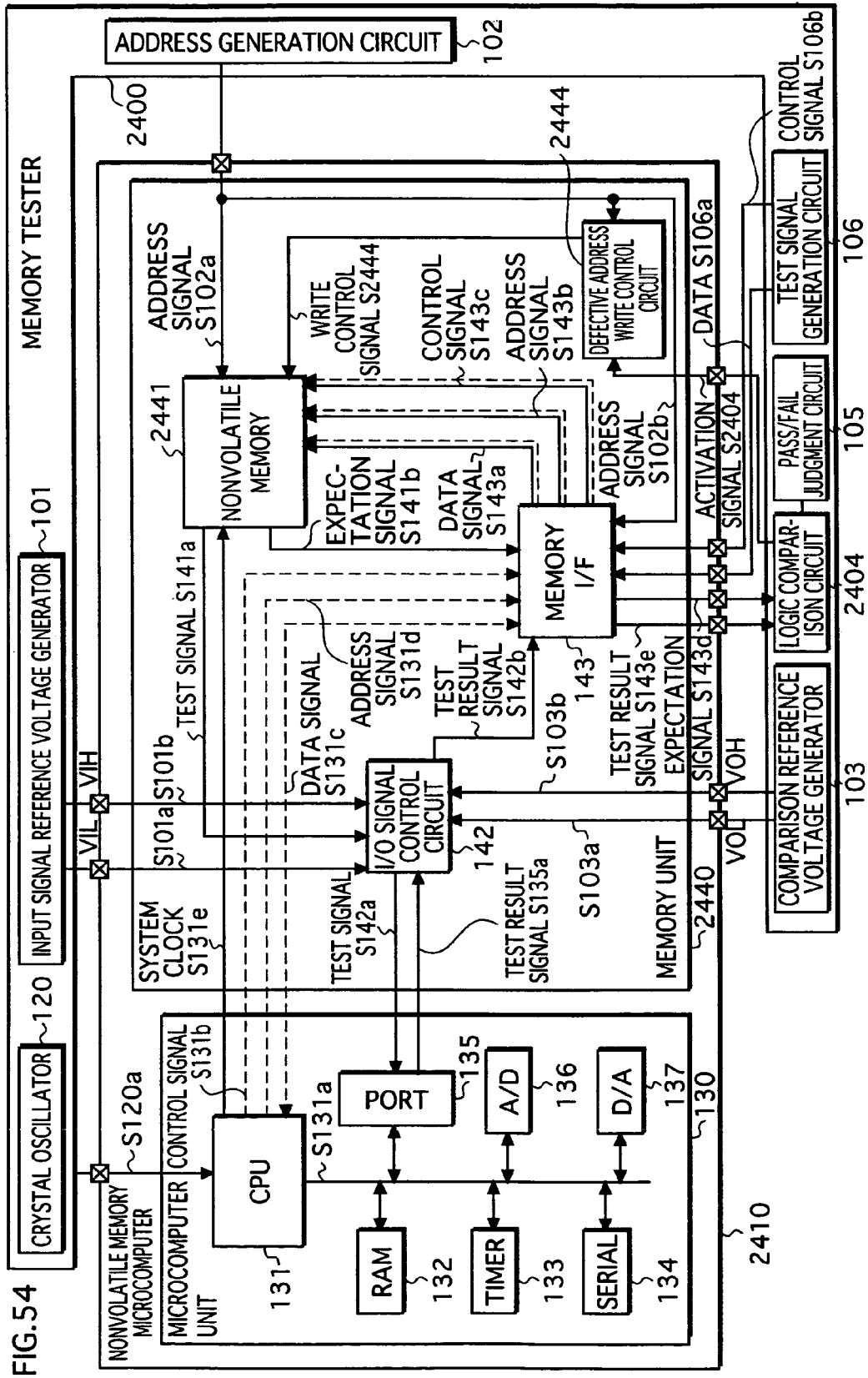
FIG. 54 shows a construction of a nonvolatile memory microcomputer to which the twentieth embodiment of the invention relates.
Figure 55A:
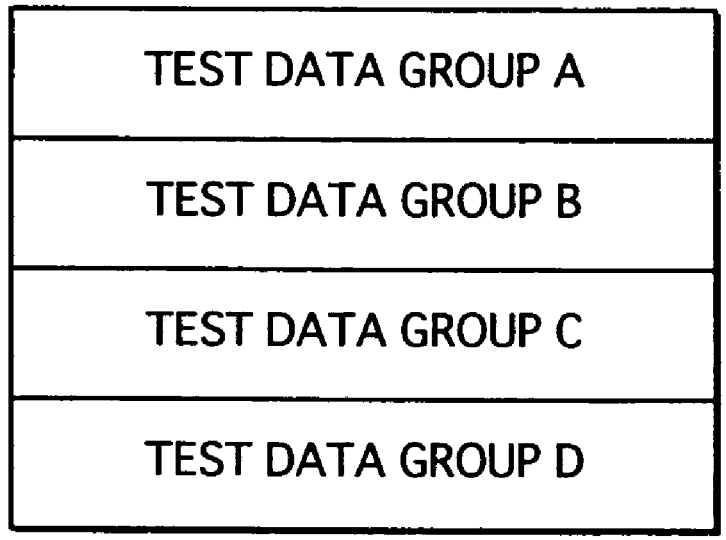
FIG. 55A shows an example of test data stored in a nonvolatile memory shown in FIG. 54, before testing a microcomputer unit shown in FIG. 54.
Figure 55B:
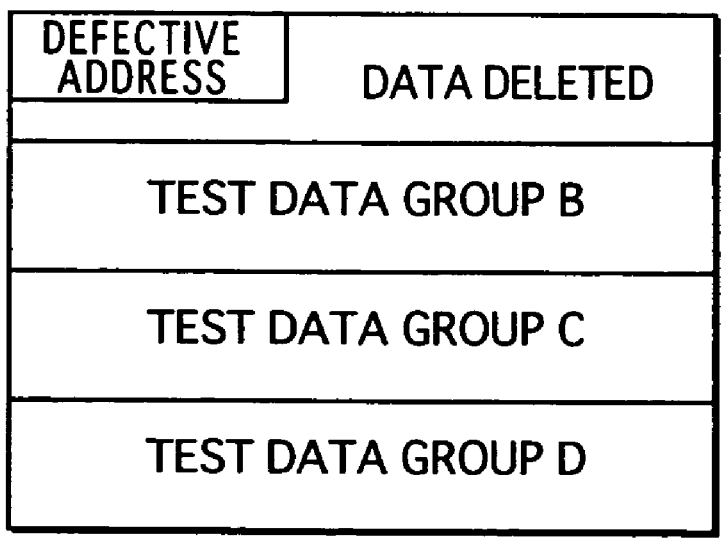
FIG. 55B shows an example of data stored in the nonvolatile memory after testing the microcomputer unit.
Figure 56:
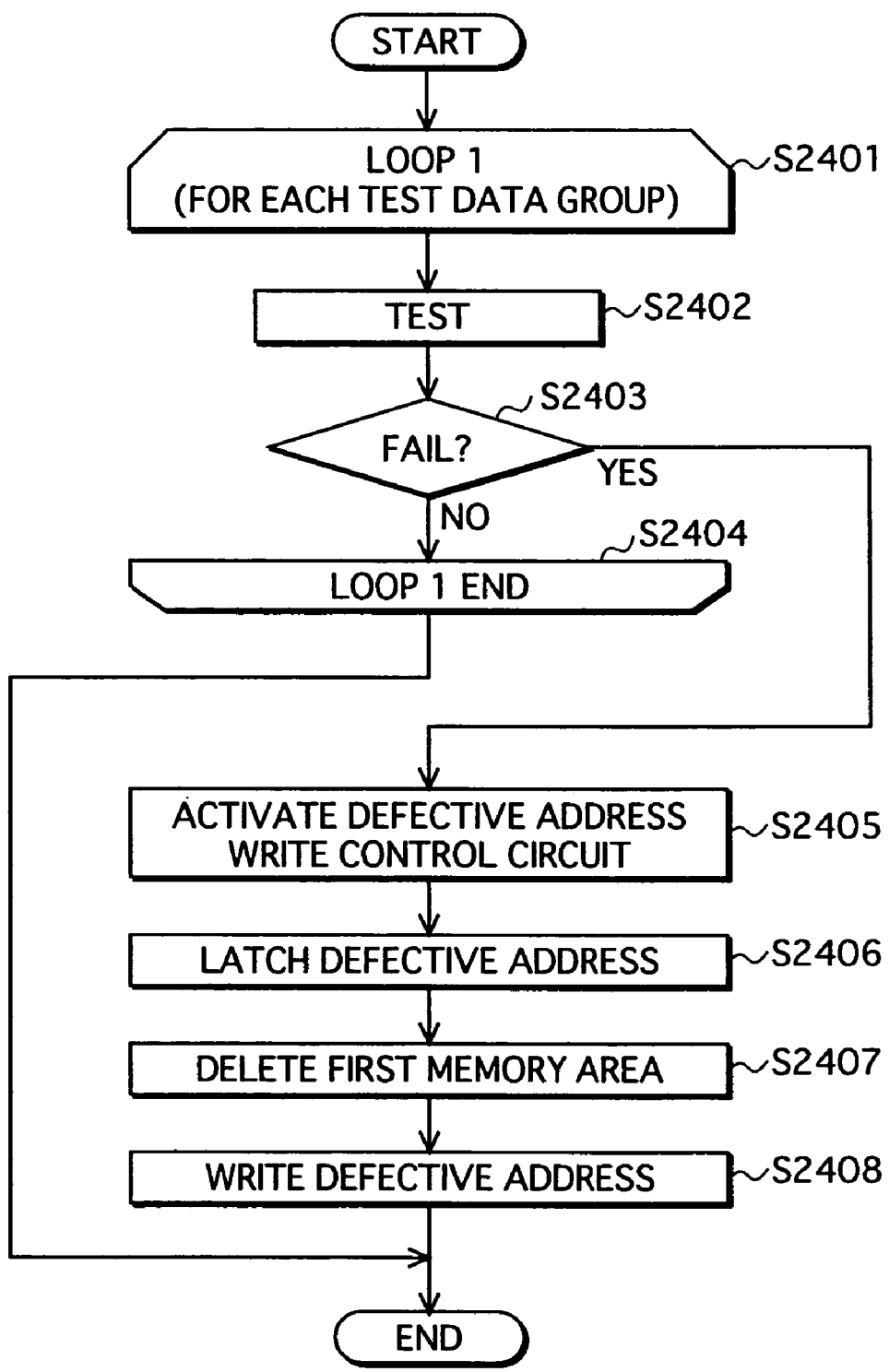
FIG. 56 is a flowchart showing a testing procedure in the twentieth embodiment.

The following describes a nonvolatile memory microcomputer to which the twentieth embodiment of the invention relates, with reference to FIGS. 54 to 56.

FIG. 54 shows a construction of a nonvolatile memory microcomputer 2410 in the twentieth embodiment.

The nonvolatile memory microcomputer 2410 is roughly made up of the microcomputer unit 130 and a memory unit 2440. The memory unit 2440 includes a nonvolatile memory 2441, the I/O signal control circuit 142, the memory I/F 143, and a defective address write control circuit 2444.

FIG. 54 also shows a memory tester 2400 that is an external device for testing the nonvolatile memory microcomputer 2410. The memory tester 2400 differs from the memory tester 100 of the first embodiment shown in FIG. 1, in that the logic comparison circuit 104 has been replaced with a logic comparison circuit 2404.

This embodiment differs from the first embodiment shown in FIG. 1 mainly in the following point. When detecting that test result signal S143e does not match expectation signal S143d, the logic comparison circuit 2404 outputs activation signal S2404 to the defective address write control circuit 2444. The defective address write control circuit 2444 writes an address corresponding to the mismatch to the nonvolatile memory 2441.

In FIG. 54, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 55A shows an example of data stored in the nonvolatile memory 2441 prior to the testing of the microcomputer unit 130. FIG. 55B shows an example of data stored in the nonvolatile memory 2441 after the testing. The meaning of test data shown in these drawings has already been explained in the first and four embodiments.

In FIG. 55A, test data groups A to D for testing four circuit blocks in the microcomputer unit 130 are stored in the nonvolatile memory 2441.

In FIG. 55B, as a result that test result signal S143e does not match expectation signal S143d, test data group A stored in the first memory area of the nonvolatile memory cell block in the nonvolatile memory 2441 is deleted, and a defective address is written to the first memory area.

FIG. 56 is a flowchart showing a testing procedure in this embodiment. In a state where the data shown in FIG. 55A is stored in the nonvolatile memory 2441, the microcomputer unit 130 is tested using test data groups A to D one by one, according to the procedure explained in the first embodiment (S2401 to S2404). During this, if the logic comparison circuit 2404 detects that test result signal S143e does not match expectation signal S143d (S2403:YES), the logic comparison circuit 2404 outputs activation signal S2404 to activate the defective address write control circuit 2444 (S2405).

The defective address write control circuit 2444 latches an address by address signal S102a (S2406). The defective address write control circuit 2444 then deletes data stored in the first memory area of the nonvolatile memory 2441 (S2407), and writes the latched address to the first memory area (S2408). The resulting storage contents of the nonvolatile memory 2441 are shown in FIG. 55B.

Here, the defective address write control circuit 2444 deletes the data from the nonvolatile memory 2441 and writes the address to the nonvolatile memory 2441, by supplying write control signal S2444 to the nonvolatile memory 2441.

According to this embodiment, a defective address is written to the nonvolatile memory 2441. Therefore, even when a power failure occurs, the defective address can be read once power has been recovered. This enhances testing flexibility and defect analysis efficiency.

Twenty-First Embodiment

Figure 57:
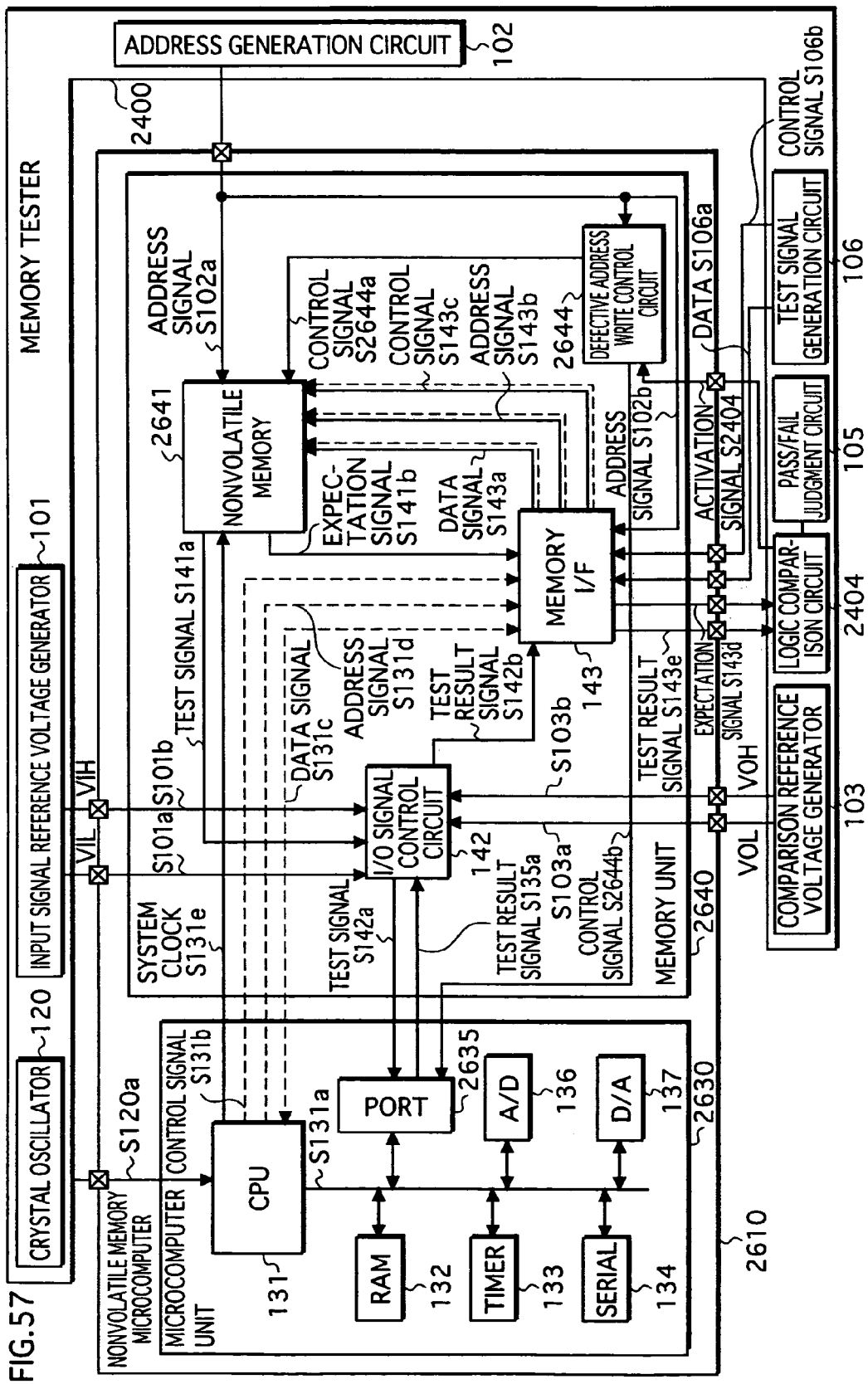
FIG. 57 shows a construction of a nonvolatile memory microcomputer to which the twenty-first embodiment of the invention relates.
Figure 58A:
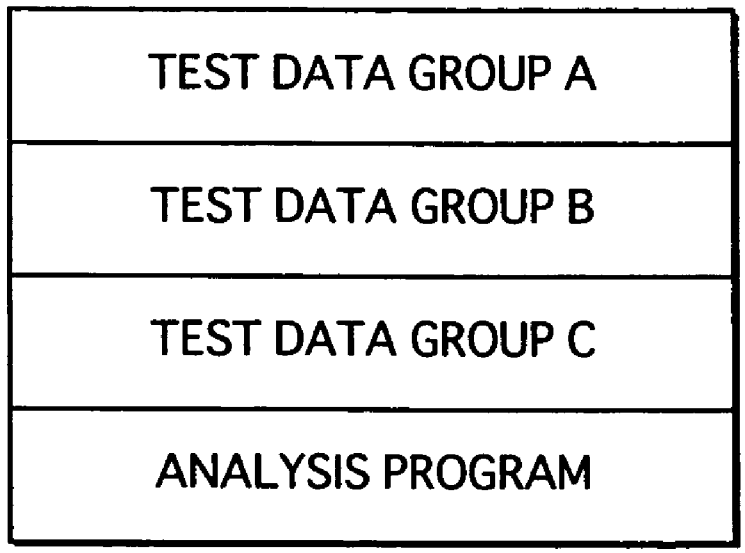
FIG. 58A shows an example of test data stored in a nonvolatile memory shown in FIG. 57, before testing a microcomputer unit shown in FIG. 57.
Figure 58B:
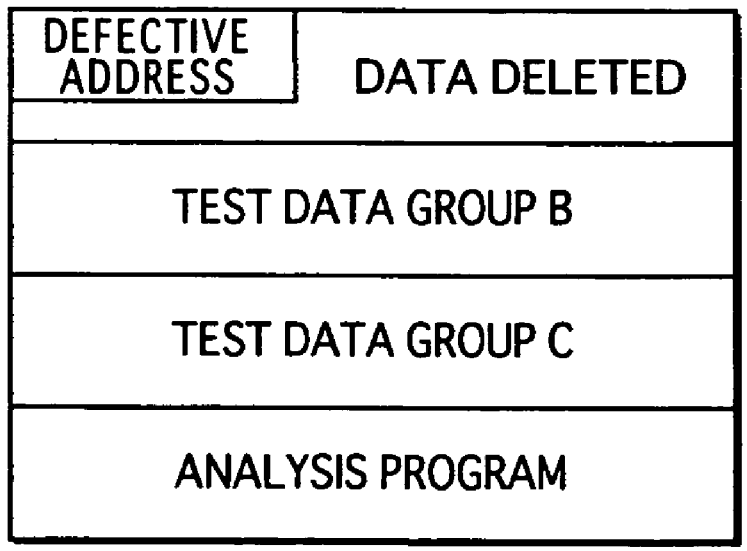
FIG. 58B shows an example of data stored in the nonvolatile memory after testing the microcomputer unit.
Figure 59:
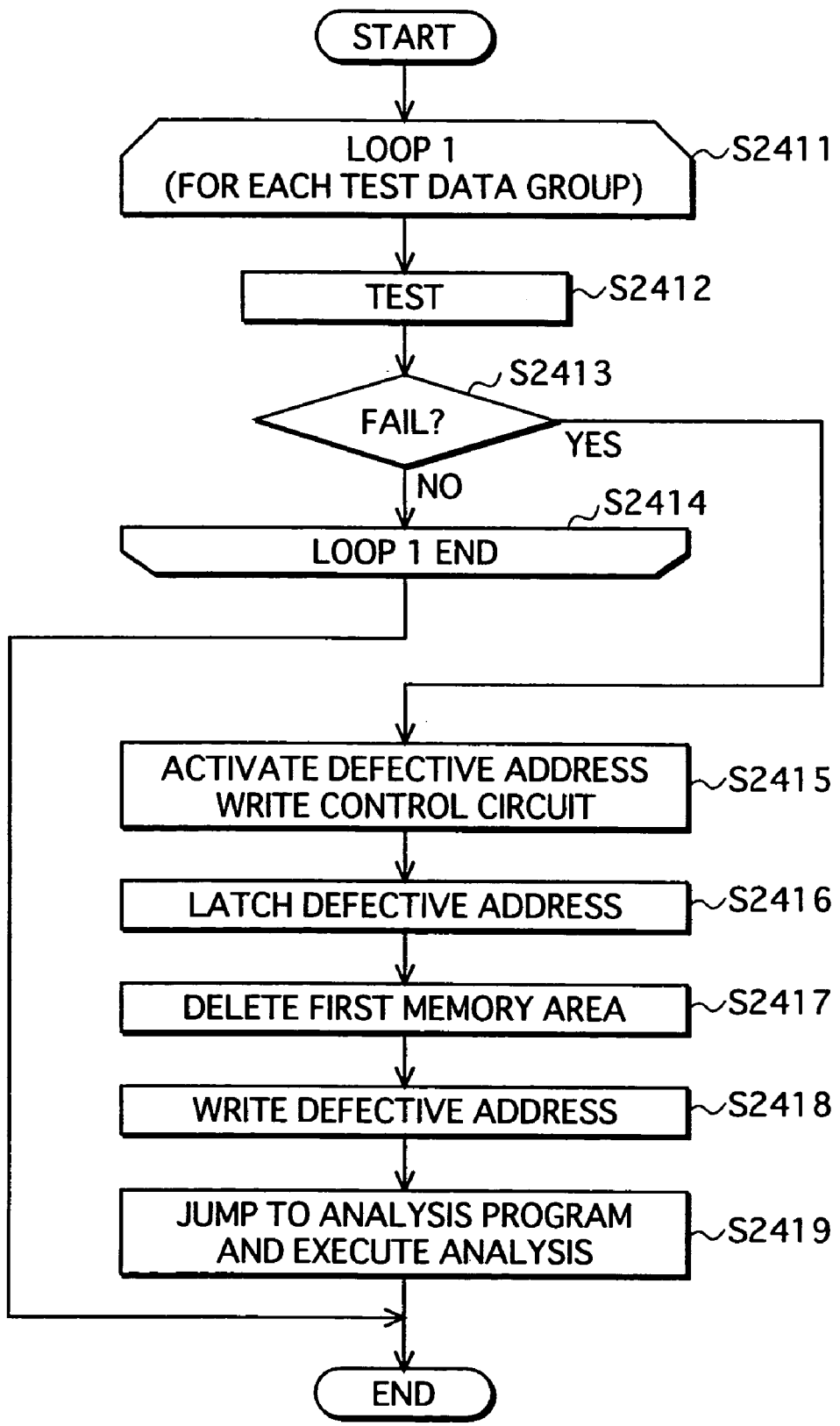
FIG. 59 is a flowchart showing a testing procedure in the twenty-first embodiment.

The following describes a nonvolatile memory microcomputer to which the twenty-first embodiment of the invention relates, with reference to FIGS. 57 to 59.

FIG. 57 shows a construction of a nonvolatile memory microcomputer 2610 in the twenty-first embodiment.

The nonvolatile memory microcomputer 2610 is a modification to the nonvolatile memory microcomputer 2410 of the twentieth embodiment shown in FIG. 54. The nonvolatile memory microcomputer 2610 is roughly made up of a microcomputer unit 2630 and a memory unit 2640. The microcomputer unit 2630 includes the CPU 131, the RAM 132, the timer 133, the serial I/F 134, a port 2635, the A/D converter 136, and the D/A converter 137. The memory unit 2640 includes a nonvolatile memory 2641, the I/O signal control circuit 142, the memory I/F 143, and a defective address write control circuit 2644.

The nonvolatile memory microcomputer 2610 differs from the nonvolatile memory microcomputer 2410 mainly in the following point. The nonvolatile memory 2641 stores an analysis program that is executable by the CPU 131, and the defective address write control circuit 2644 instructs the CPU 131 to execute the analysis program via the port 2635.

In FIG. 57, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 58A shows an example of data stored in a nonvolatile memory cell block in the nonvolatile memory 2641 prior to the testing of the microcomputer unit 2630. FIG. 55B shows an example of data stored in the nonvolatile memory cell block after the testing. The meaning of test data shown in these drawings has already been explained in the first and fourth embodiments. An analysis program is a machine instruction string executable by the CPU 131.

In FIG. 58A, test data groups A to C for testing three circuit blocks in the microcomputer unit 2630 and an analysis program are stored in the nonvolatile memory 2641.

In FIG. 58B, as a result that test result signal S143e does not match expectation signal S143d, test data group A stored in the first memory area of the nonvolatile memory 2641 is deleted, and a defective address is written to the first memory area.

FIG. 59 is a flowchart showing a testing procedure in this embodiment. Suppose the data shown in FIG. 58A is stored in the nonvolatile memory 2641. This being so, the microcomputer unit 2630 is tested using test data groups A to C one by one (S2411 to S2414), and a defective address is written to the nonvolatile memory 2641 (S2415 to S2418), as in the twentieth embodiment. The resulting storage contents of the nonvolatile memory 2641 are shown in FIG. 58B. Following this, the defective address write control circuit 2644 outputs control signal S2644b which shows a start address of the analysis program and releases a halt of the CPU 131, to the CPU 131 via the port 2635. The CPU 131 accordingly starts executing the analysis program (S2419).

The analysis program serves, for example, to reference the defective address written in the nonvolatile memory 2641 to identify a circuit block which contains the defect, and thoroughly analyze the defect by intensively driving the circuit block.

According to this embodiment, a defective address is written to the nonvolatile memory 2641. Therefore, even when a power failure occurs, the defective address can be read once power has been recovered. This enhances testing flexibility and defect analysis efficiency. Also, by executing an analysis program, a defect can be thoroughly analyzed.

Twenty-Second Embodiment

Figure 60:
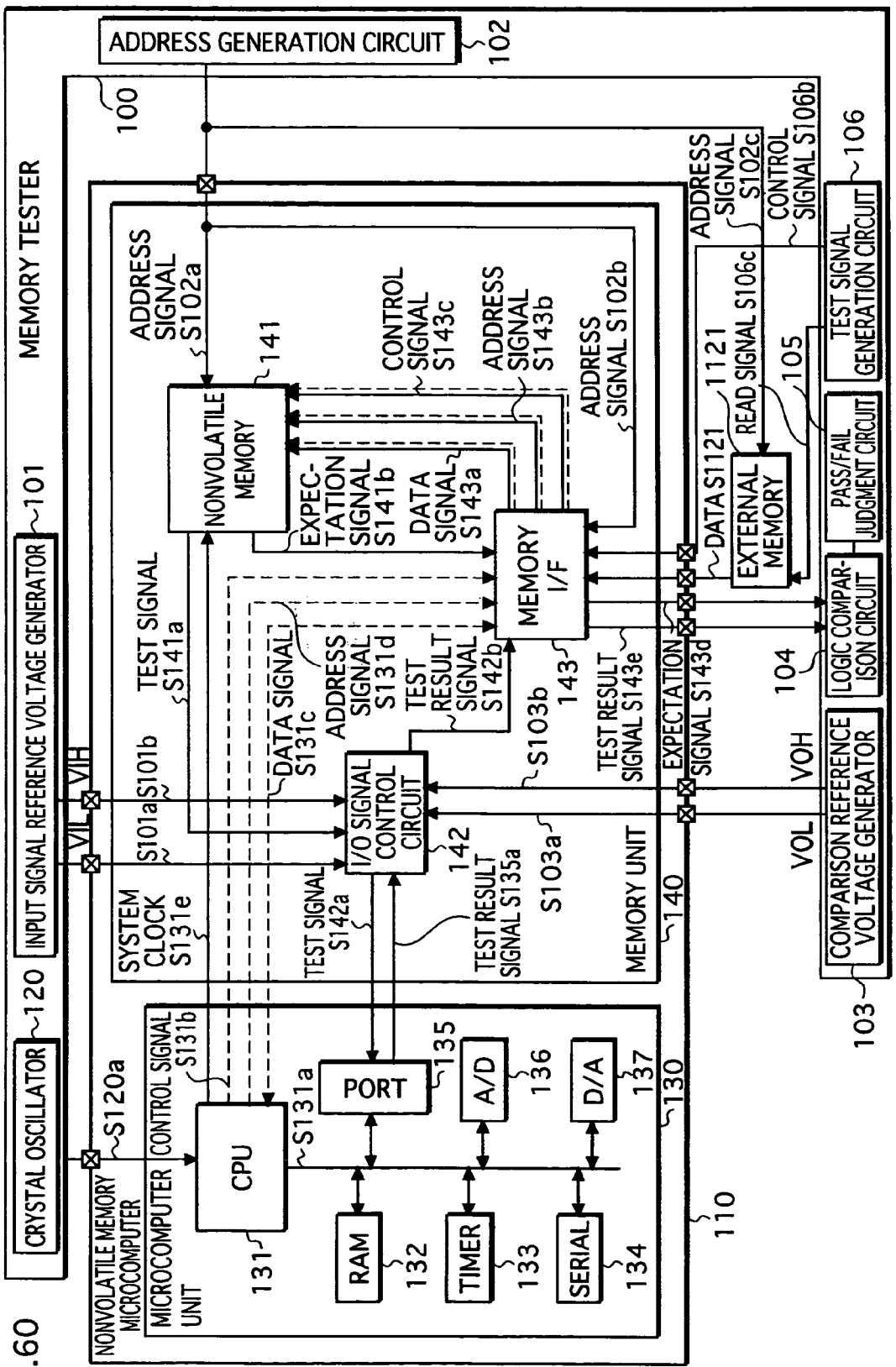
FIG. 60 shows a construction of an environment for implementing a testing method to which the twenty-second embodiment of the invention relates.
Figure 61:
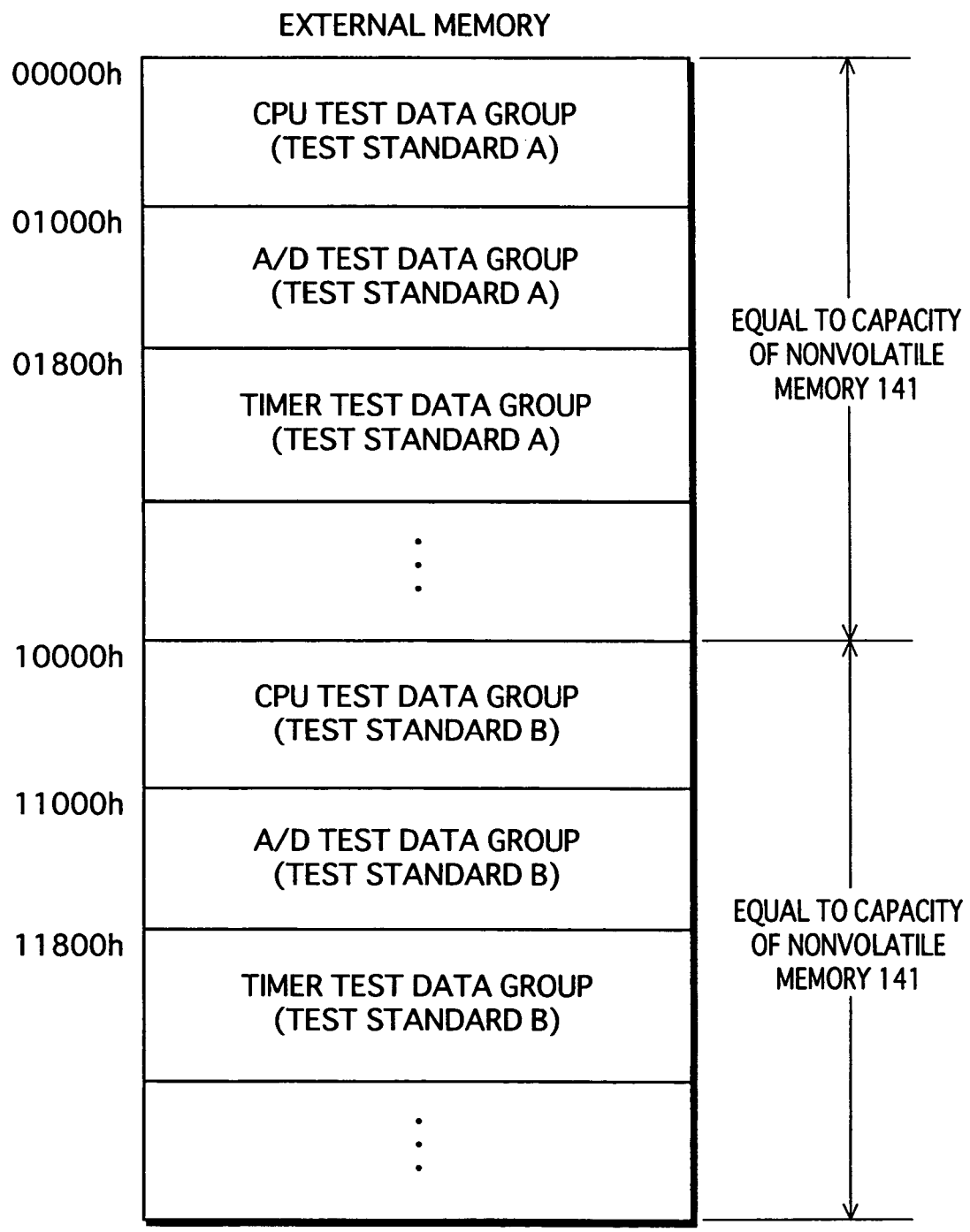
FIG. 61 shows an example of data stored in an external memory shown in FIG. 60.
Figure 62:
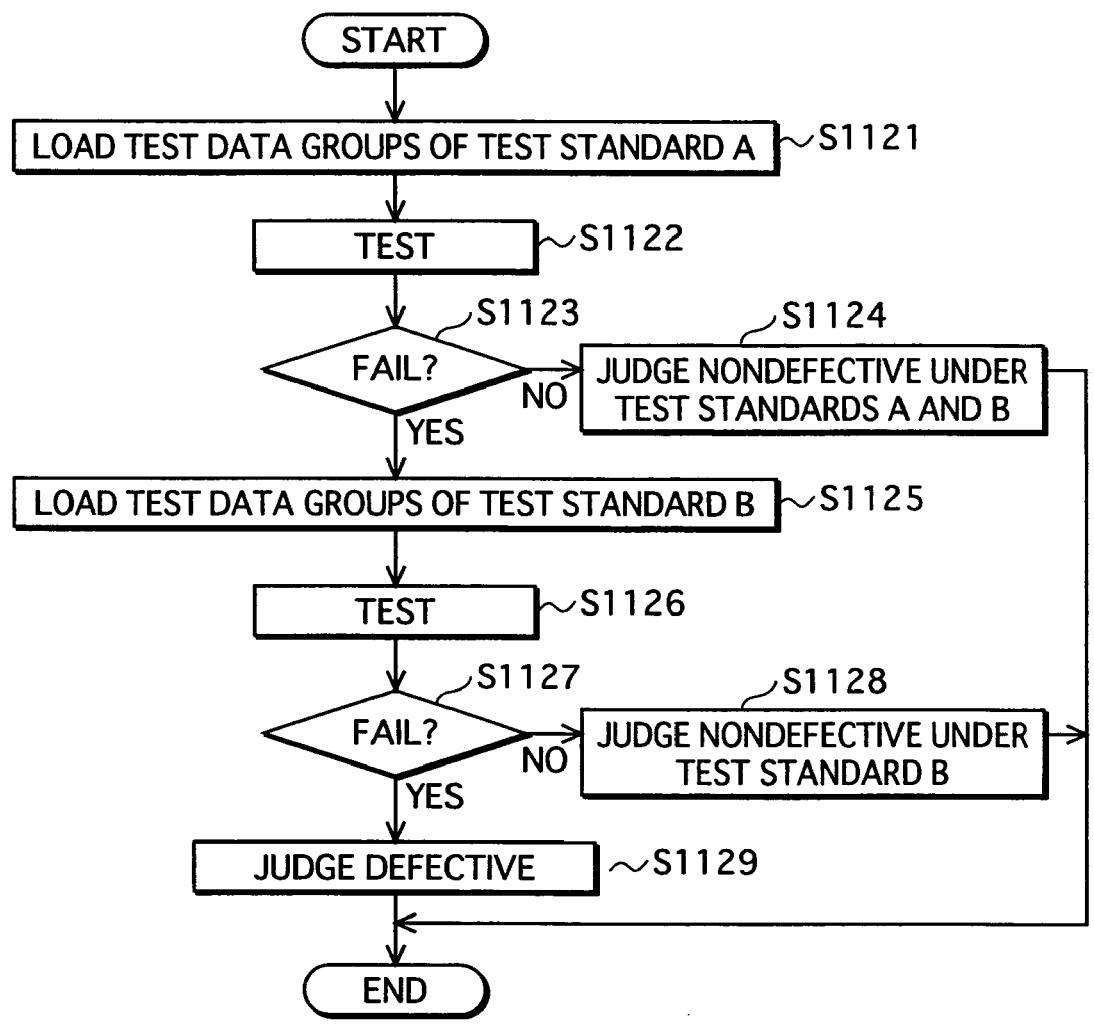
FIG. 62 is a flowchart showing a testing procedure in the twenty-second embodiment.

The following describes a nonvolatile memory microcomputer testing method to which the twenty-second embodiment of the invention relates, with reference to FIGS. 60 to 62.

FIG. 60 shows a construction of an environment for implementing the testing method of the twenty-second embodiment. This environment includes the nonvolatile memory microcomputer 110 which is to be tested, the memory tester 100 for testing the nonvolatile memory microcomputer 110, and an external memory 112 which stores data to be loaded to the nonvolatile memory 141. The nonvolatile memory microcomputer 110 and the memory tester 100 are the same as those in the first embodiment.

Components which are the same as those in the preceding embodiments have been given the same reference numerals and their explanation has been omitted.

The external memory 1121 is actually realized by a hard disk device, a memory device, or the like. The external memory 1121 stores test data which is greater than a capacity of the nonvolatile memory 141, and supplies part of the test data to the nonvolatile memory 141.

FIG. 61 shows an example of data stored in the external memory 1121. Here, the external memory 1121 has a storage area equivalent to two nonvolatile memories 141. The external memory 1121 stores test data groups for testing circuit blocks in the microcomputer unit 130 such as the CPU 131, the A/D converter 136, and the timer 133, for each of strict test standard A and lenient test standard B.

The nonvolatile memory 141 can simultaneously store test data groups of one of test standards A and B.

FIG. 62 is a flowchart showing a testing procedure in this embodiment.

First, the test data groups of test standard A are loaded from the external memory 1121 to the nonvolatile memory 141, in the following manner. The address generation circuit 102 sequentially outputs addresses which are incremented by 1 starting with 00000h, to the external memory 1121 as address signal S102c. The address generation circuit 102 also outputs the lower-order 16 bits of address signal S102c to the nonvolatile memory 141 as address signal S102a. Meanwhile, the test signal generation circuit 106 outputs read signal S106c to the external memory 1121. The external memory 1121 receives address signal S102c and read signal S106c, and sequentially outputs the test data groups of test standard A as data S1121. The test signal generation circuit 106 also outputs control signal S106b showing a write command, to the nonvolatile memory 141 via the memory I/F 143. As a result, the test data groups of test standard A are loaded to the nonvolatile memory 141 (S1121).

Next, the microcomputer unit 130 is tested using the test data groups of test standard A loaded in the nonvolatile memory 141, according to the procedure explained in the first embodiment (S1122). If the logic comparison circuit 104 detects no mismatch between test result signal S143e and expectation signal S143d (S1123:NO), the pass/fail judgment circuit 105 judges the nonvolatile memory microcomputer 110 as being nondefective under both test standards A and B (S1124).

If the logic comparison circuit 104 detects a mismatch (S1123:YES), on the other hand, the test data groups of test standard B are loaded from the external memory 1121 to the nonvolatile memory 141 (S1125). This is done in the same way as the test data groups of test standard A, except that the address generation circuit 102 sequentially outputs addresses which are incremented by 1 starting with 10000h as address signal S102c.

After this, the microcomputer unit 130 is tested using the test data groups of test standard B loaded in the nonvolatile memory 141 (S1126). If the logic comparison circuit 104 detects no mismatch between test result signal S143e and expectation signal S143d (S1127:NO), the pass/fail judgment circuit 105 judges the nonvolatile memory microcomputer 110 as being nondefective only under test standard B (S1128).

If the logic comparison circuit 104 detects a mismatch (S1127:YES), on the other hand, the pass/fail judgment circuit 105 judges the nonvolatile memory microcomputer 110 as being defective (S1129).

According to this embodiment, test data is loaded from the external memory 1121 to the nonvolatile memory 141. This enables the memory tester 100 to test the nonvolatile memory microcomputer 110. Hence the testing cost can be reduced. Also, even if the nonvolatile memory 141 has a capacity of storing only test data of a single test standard, the nonvolatile memory microcomputer 110 can be tested by various test standards by loading test data of these various test standards one by one from the external memory 1121. This makes it possible to rank the nonvolatile memory microcomputer 110 based on various test standards.

Twenty-Third Embodiment

The following describes a nonvolatile memory microcomputer testing method to which the twenty-third embodiment of the invention relates, with reference to FIGS. 63 to 66.

Figure 63:
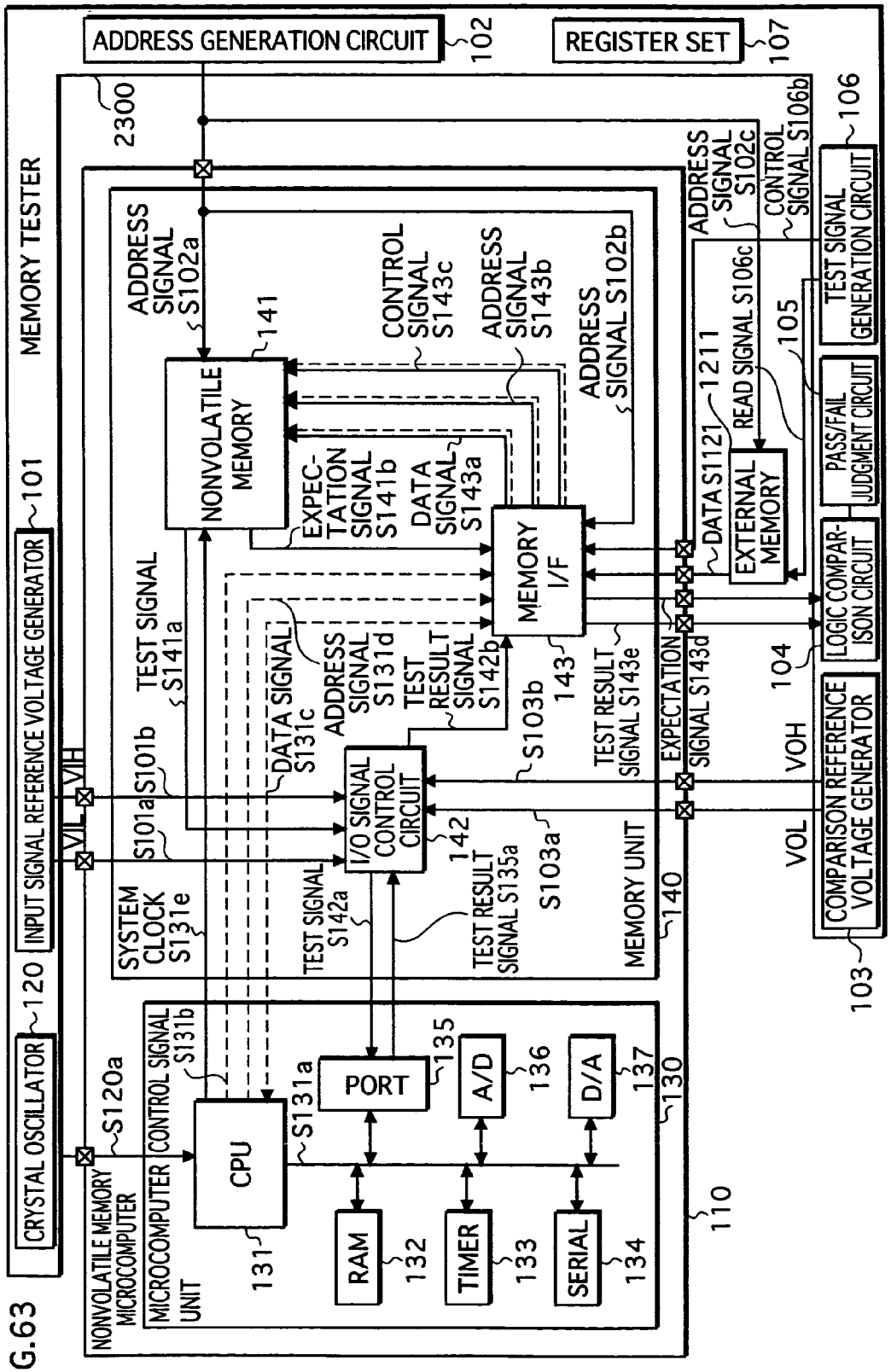
FIG. 63 shows a construction of an environment for implementing a testing method to which the twenty-third embodiment of the invention relates.

FIG. 63 shows a construction of an environment for implementing the testing method of the twenty-third embodiment. This environment differs from that of the twenty-second embodiment shown in FIG. 60, in that the memory tester 100 has been replaced with a memory tester 2300 and the external memory 1121 has been replaced with an external memory 1211. The memory tester 2300 differs from the memory tester 100 in that a register set 107 for storing a pass/fail result for each test item is newly included. The nonvolatile memory microcomputer 110 is the same as that of the first embodiment.

Components which are the same as those in the preceding embodiments have been given the same reference numerals and their explanation has been omitted.

Figure 64:
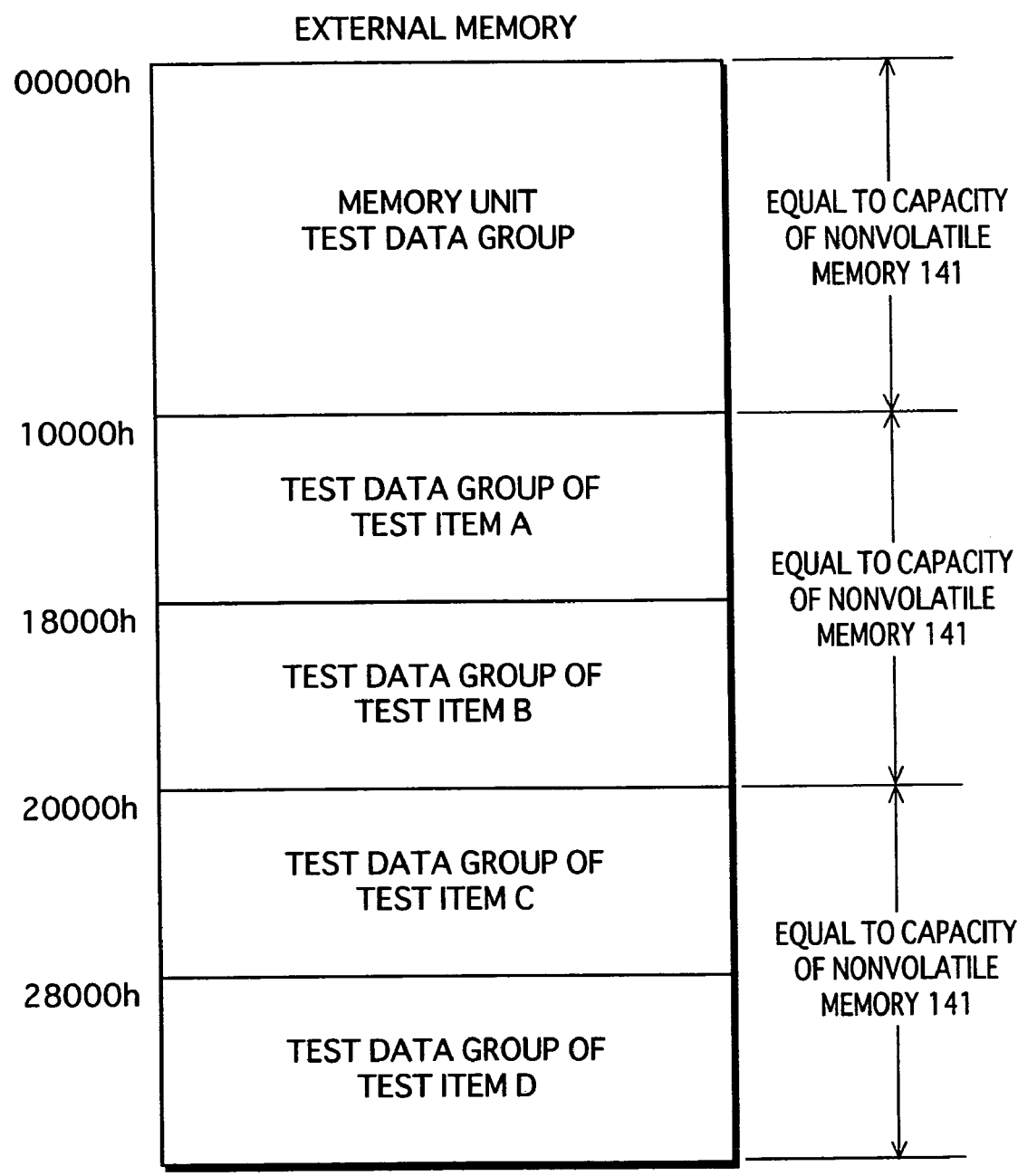
FIG. 64 shows an example of data stored in an external memory shown in FIG. 63.

FIG. 64 shows an example of data stored in the external memory 1211. In FIG. 64, the external memory 1211 has a storage area equivalent to three nonvolatile memories 141. A memory unit test data group, microcomputer unit test data groups of test items A and B, and microcomputer unit test data groups of test items C and D are each stored in an area equivalent to the capacity of one nonvolatile memory 141.

Figure 65:
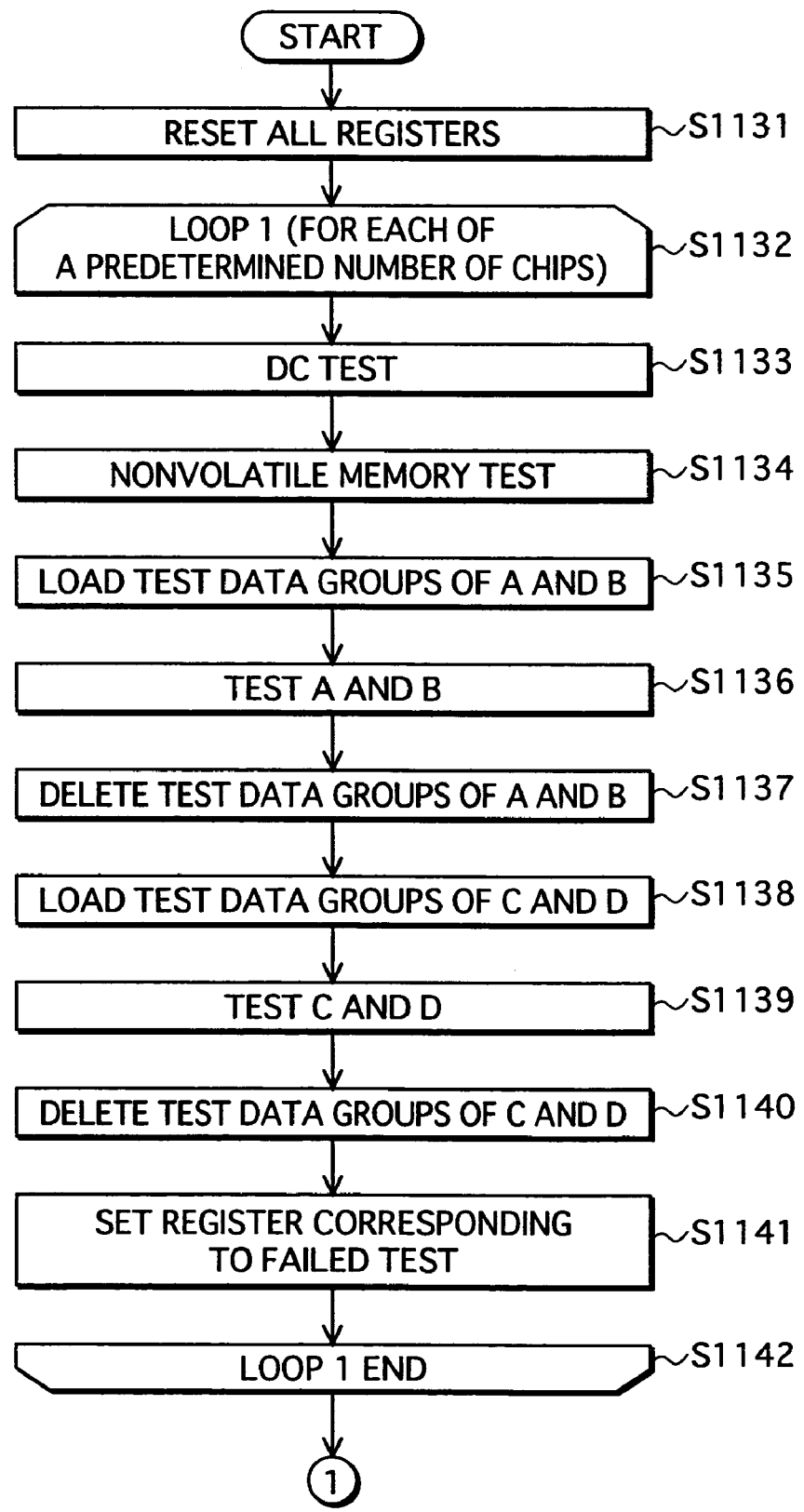
FIG. 65 is a flowchart showing the first half of a testing procedure in the twenty-third embodiment.
Figure 66:
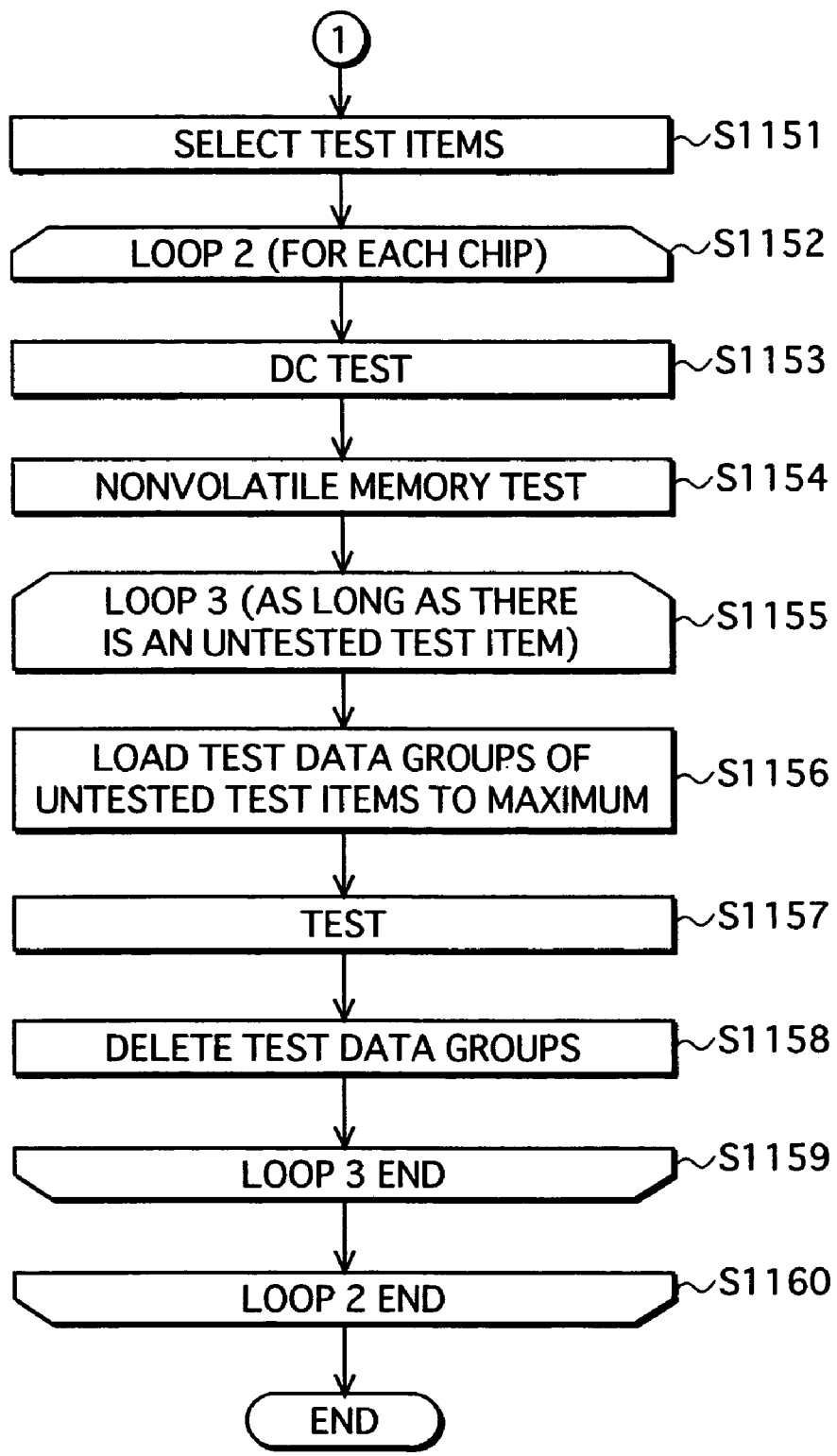
FIG. 66 is a flowchart showing the latter half of the testing procedure in the twenty-third embodiment.

FIGS. 65 and 66 are flowcharts showing the first and latter halves of a testing procedure in this embodiment.

In the first half, all registers in the register set 107 are reset (S1131). After this, the following processing (S1132 to S1142) is repeated for each of a predetermined number of test samples. The predetermined number is, for example, 10% of a total number of nonvolatile memory microcomputers which are subjected to testing.

DC testing (S1133) and testing of the memory unit 140 (S1134) are conducted.

After this, the microcomputer unit test data groups of test items A and B are loaded from the external memory 1211 to the nonvolatile memory 141 (S1135), and the microcomputer unit 130 is tested for test items A and B (S1136). The loaded test data groups are then deleted from the nonvolatile memory 141 (S1137). Here, the loading of data and the testing can be performed in the same way as in the preceding embodiments.

Following this, the microcomputer unit test data groups of test items C and D are loaded from the external memory 1211 to the nonvolatile memory 141 (S1138), and the microcomputer unit 130 is tested for test items C and D (S1139). The loaded test data groups are then deleted from the nonvolatile memory 141 (S1140).

A register corresponding to each failed test item of the microcomputer unit 130 is set in the register set 107 (S1141).

In the latter half, all test items corresponding to the set registers are selected (S1151). The following processing (S1152 to S1160) is repeated for each of the nonvolatile memory microcomputers 110 that are subjected to testing.

DC testing (S1153) and testing of the memory unit 140 (S1154) are conducted.

Next, the following processing (S1155 to S1159) is repeated so long as there is any test item which is selected in step S1151 and is untested yet.

Test data groups of untested test items are loaded to the nonvolatile memory 141 to a maximum capacity (S1156). The microcomputer unit 130 is tested using the loaded test data groups (S1157). The loaded test data groups are then deleted from the nonvolatile memory 141 (S1158).

According to this embodiment, if the defect rate is low for some test item in selective testing conducted in the first half part, the test item is omitted in total testing conducted in the latter half part. This shortens testing time. For example, by performing the testing procedure of this embodiment before a chip is taken from a wafer and then performing total testing again after packaging, the time taken for testing at the wafer stage can be reduced without causing a loss of product quality.

Twenty-Fourth Embodiment

Figure 67:
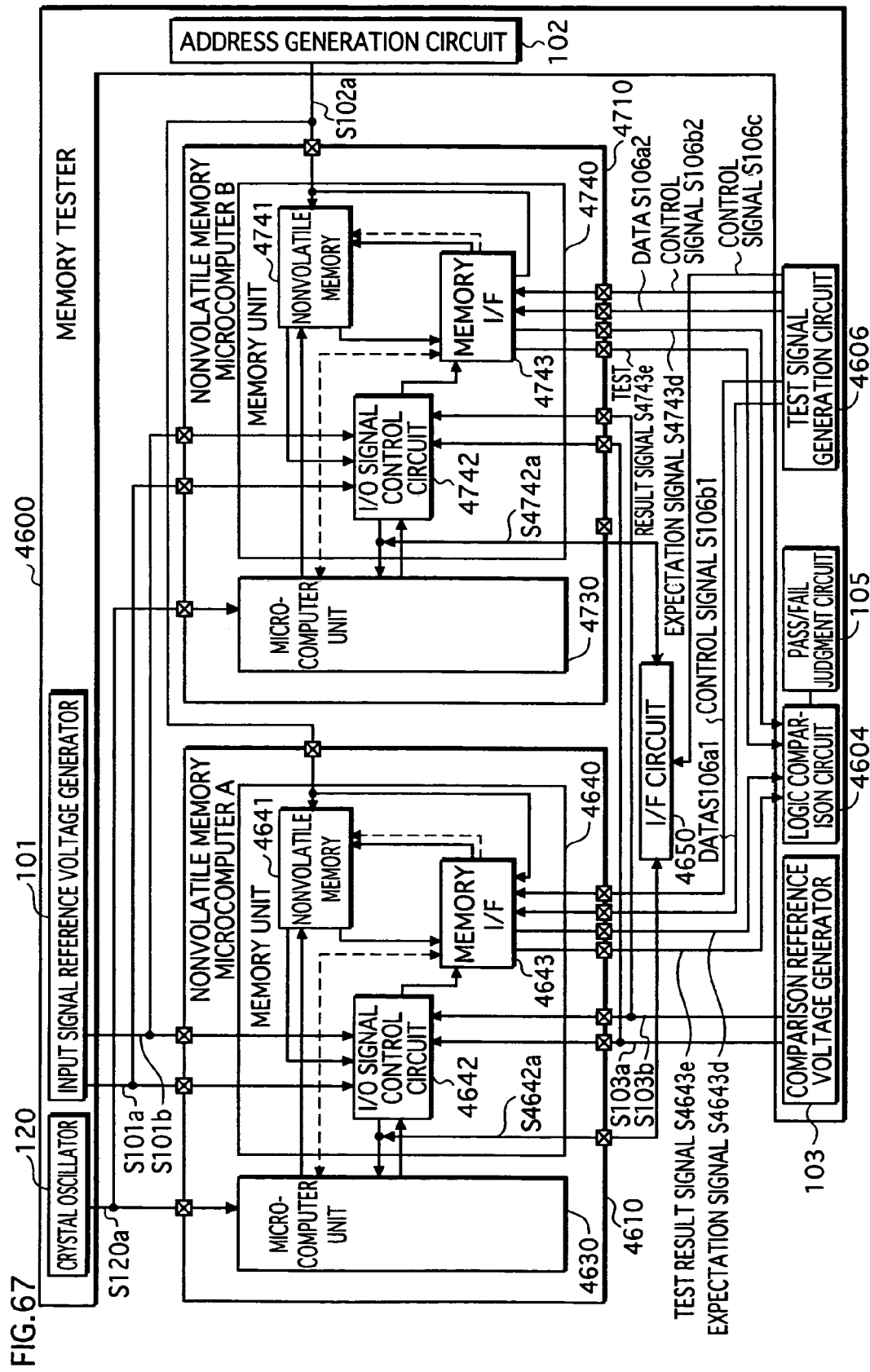
FIG. 67 shows a construction of an environment for implementing a testing method to which the twenty-fourth embodiment of the invention relates.

The following describes a nonvolatile memory microcomputer testing method to which the twenty-fourth embodiment of the invention relates, with reference to FIGS. 67 to 69.

FIG. 67 shows a construction of an environment for implementing the testing method of the twenty-fourth embodiment. This environment includes nonvolatile memory microcomputers 4610 and 4710 which are subjected to testing, a memory tester 4600 for testing the two nonvolatile memory microcomputers 4610 and 4710, and an I/F circuit 4650.

The nonvolatile memory microcomputers 4610 and 4710 are each a modification to the nonvolatile memory microcomputer 110 of the first embodiment shown in FIG. 1. Each of the nonvolatile memory microcomputers 4610 and 4710 differs from the nonvolatile memory microcomputer 110, mainly in that test signal S4642a or S4742a, which corresponds to test signal S142a in the nonvolatile memory microcomputer 110, can be output to and supplied from outside the nonvolatile memory microcomputer 4610 or 4710.

The memory tester 4600 is a modification to the memory tester 100 of the first embodiment. The memory tester 4600 differs from the memory tester 100 in the following point. The memory tester 4600 can separately compare test result signal S4643e and expectation signal S4643d output from the nonvolatile memory microcomputer 4610 and compare test result signal S4743e and expectation signal S4743d output from the nonvolatile memory microcomputer 4710. Also, the memory tester 4600 can separately supply data S106a1 and control signal S106b1 to the nonvolatile memory microcomputer 4610 and supply data S106a2 and control signal S106b2 to the nonvolatile memory microcomputer 4710. Furthermore, the memory tester 4600 can supply control signal S106c to the I/F circuit 4650.

The I/F circuit 4650 electrically connects or disconnects a transmission path of test signal S4642a and a transmission path of test signal S4742a, according to control signal S106c.

In FIG. 67, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 68A shows an example of data stored in a nonvolatile memory 4641 in the nonvolatile memory microcomputer 4610. FIG. 68B shows an example of data stored in a nonvolatile memory 4741 in the nonvolatile memory microcomputer 4710.

As shown in the drawing, the nonvolatile memory 4641 stores test data group A, whereas the nonvolatile memory 4741 stores test data group B.

FIG. 69 is a flowchart showing a testing procedure in this embodiment.

A test signal generation circuit 4606 in the memory tester 4600 outputs control signal S106c instructing to electrically disconnect the transmission paths of test signals S4642a and S4742a, to the I/F circuit 4650. In response, the I/F circuit 4650 electrically disconnects the two transmission paths (S4601).

In this state, the memory tester 4600 outputs control signal S106b1, to test the nonvolatile memory microcomputer 4610 using test data group A. Here, the memory tester 4600 compares test result signal S4643e and expectation signal S4643d to make pass/fail judgment on the nonvolatile memory microcomputer 4610, while ignoring test result signal S4743e and expectation signal S4743d from the nonvolatile memory microcomputer 4710 (S4602).

Following this, the memory tester 4600 outputs control signal S106b2, to test the nonvolatile memory microcomputer 4710 using test data group B. Here, the memory tester 4600 compares test result signal S4743e and expectation signal S4743d to make pass/fail judgment on the nonvolatile memory microcomputer 4710, while ignoring test result signal S4643e and expectation signal S4643d from the nonvolatile memory microcomputer 4610 (S4603).

Next, the test signal generation circuit 4606 outputs control signal S106c instructing to short-circuit the transmission paths of test signals S4642a and S4742a, to the I/F circuit 4650. In response, the I/F circuit 4650 electrically connects the two transmission paths (S4604).

In this state, the memory tester 4600 outputs control signal S106b1 instructing to output test signal S4642a, to the nonvolatile memory microcomputer 4610. At the same time, the memory tester 4600 outputs control signal S106b2 to the nonvolatile memory microcomputer 4710, to disable the output of test signal S4742a (i.e. to put in a high impedance state).

As a result, test data group A is output from the nonvolatile memory microcomputer 4610 as test signal S4642a, and supplied to a microcomputer unit 4730 in the nonvolatile memory microcomputer 4710 via the I/F circuit 4650. The memory tester 4600 tests the nonvolatile memory microcomputer 4710 using test data group A, by comparing test result signal S4743e and expectation signal S4743d. During this time, the memory tester 4600 ignores test result signal S4643e and expectation signal S4643d form the nonvolatile memory microcomputer 4610 (S4605).

Next, the memory tester 4800 tests the nonvolatile memory microcomputer 4610 using test data group B, in the same way as above (S4606).

According to this embodiment, if the size of test data is greater than a capacity of one nonvolatile memory, the test data is divided into test data groups and stored in nonvolatile memories of a plurality of nonvolatile memory microcomputers. This being so, the plurality of nonvolatile memory microcomputers can be tested using the test data stored in these nonvolatile memory microcomputers. This makes it unnecessary to write the test data groups to each individual nonvolatile memory one by one, with it being possible to shorten testing time.

Twenty-Fifth Embodiment

Figure 70:
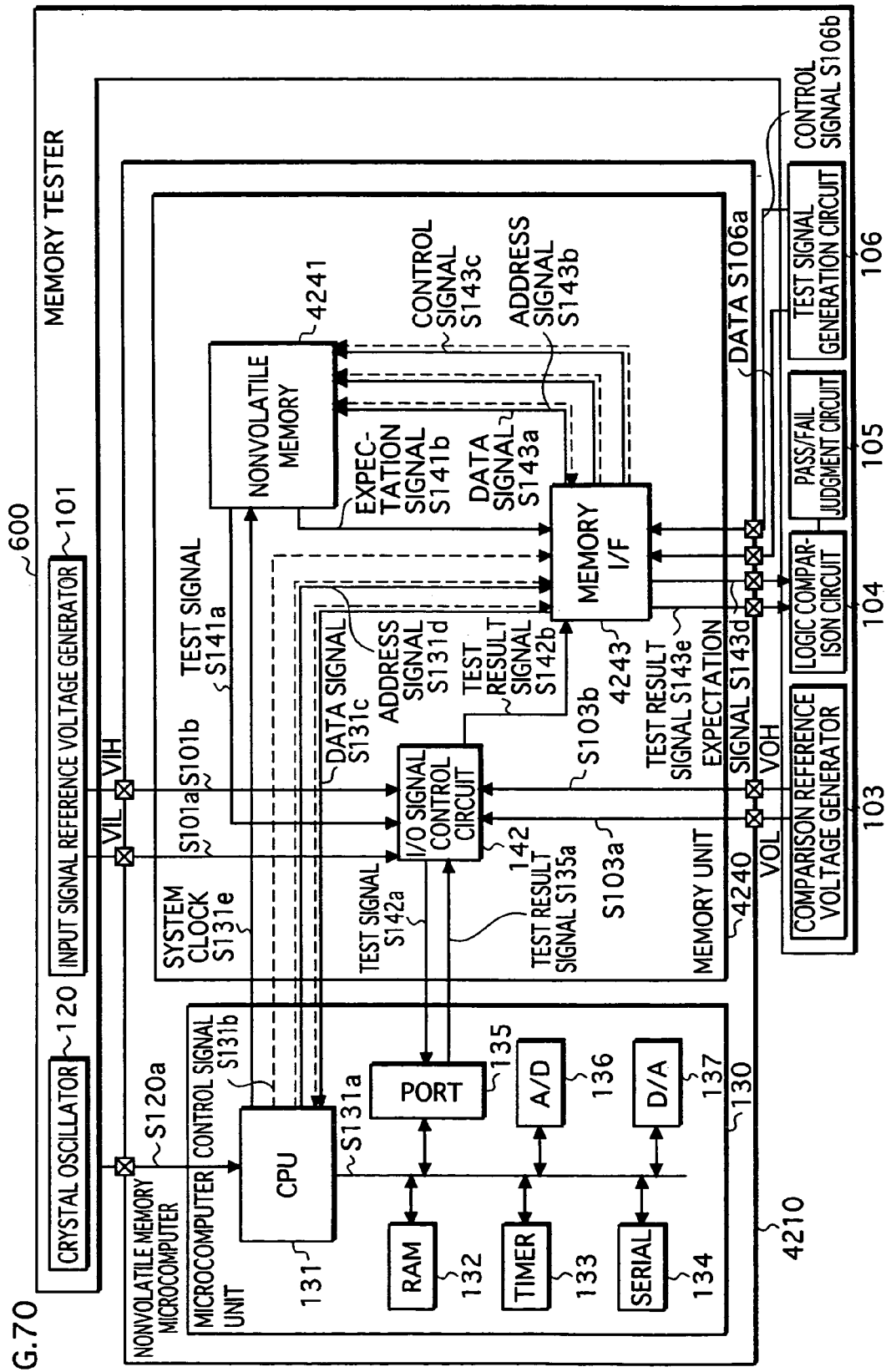
FIG. 70 shows a construction of a nonvolatile memory microcomputer to which the twenty-fifth embodiment of the invention relates.
Figure 71:
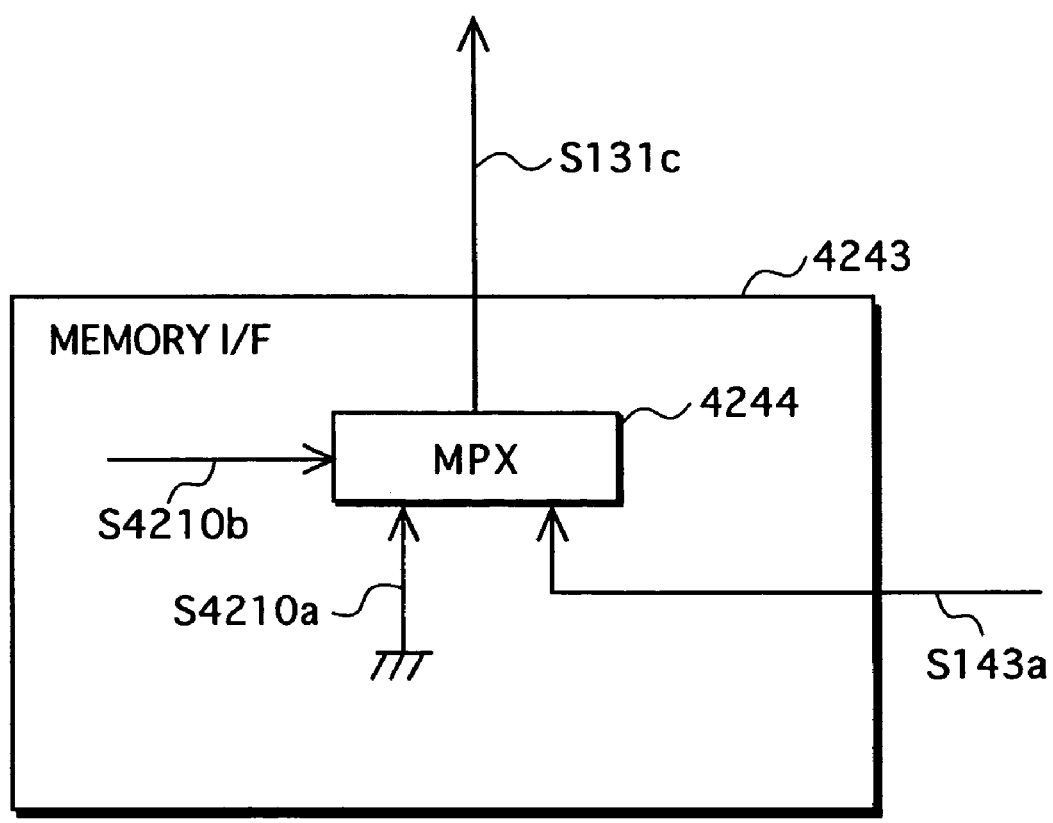
FIG. 71 shows a partial construction of a memory I/F shown in FIG. 70.
Figure 72:
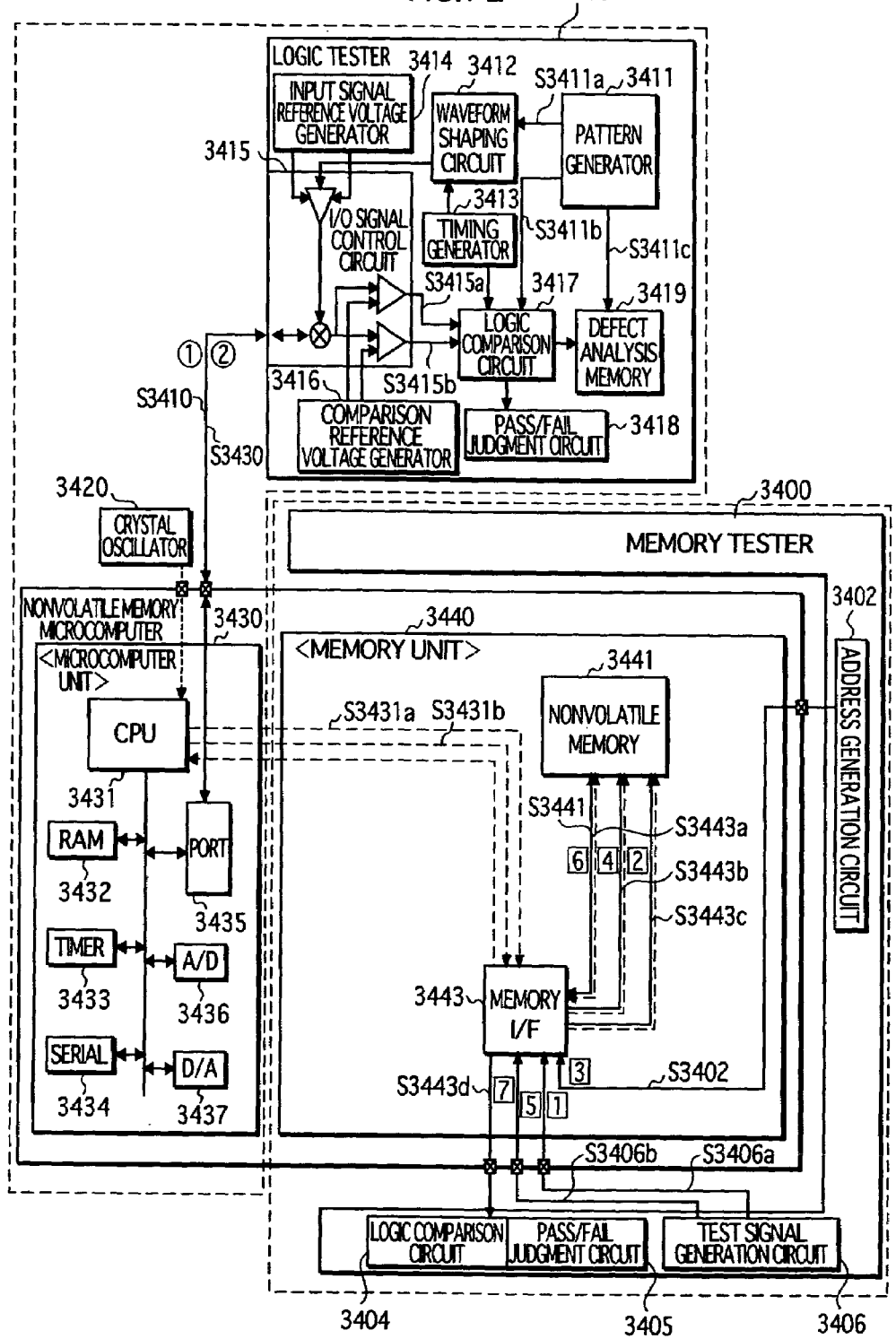
FIG. 72 shows rough constructions of a conventional nonvolatile memory microcomputer, a memory tester, and a logic tester.

The following describes a nonvolatile memory microcomputer to which the twenty-fifth embodiment of the invention relates, with reference to FIGS. 70 and 71.

FIG. 70 shows a construction of a nonvolatile memory microcomputer 4210 in the twenty-fifth embodiment.

The nonvolatile memory microcomputer 4210 is roughly made up of the microcomputer unit 130 and a memory unit 4240. The memory unit 4240 includes a nonvolatile memory 4241, the I/O signal control circuit 142, and a memory I/F 4243.

The nonvolatile memory microcomputer 4210 differs from the nonvolatile memory microcomputer 110 of the first embodiment shown in FIG. 1, mainly in the following point. When testing is performed, the memory I/F 4243 outputs data signal S131c showing a non-operation instruction (NOP), to the CPU 131. In response, the CPU 131 sequentially outputs program counter values which are incremented by 1, as address signal S131d. The memory I/F 4243 passes address signal S131d to the nonvolatile memory 4241 as address signal S143b. The nonvolatile memory 4241 outputs test data stored at an address shown by address signal S143b.

In FIG. 70, the solid arrows between components indicate signal flows when testing is performed, whereas the dotted arrows between components indicate signal flows when a normal operation other than testing is performed. A signal shown by each of these solid arrows and dotted arrows is transferred through one signal line or a plurality of signal lines.

Components which are the same as those in the preceding embodiments have been given the same reference numerals and their explanation has been omitted.

FIG. 71 shows a construction of a characteristic part of the memory I/F 4243.

The memory I/F 4243 includes a multiplexer (MPX) 4244. Based on selection signal S4210b, the memory I/F 4243 outputs data signal S143a given from the nonvolatile memory 4241 as data signal S131c when a normal operation other than testing is performed, and outputs signal S4210a showing NOP (e.g. a signal in which all bits are low) as data signal S131c when testing is performed. Selection signal S4210b is supplied from the memory tester 600 according to control signal S106b.

The meaning of test data stored in the nonvolatile memory 4241 is the same as that explained in the preceding embodiments.

The nonvolatile memory microcomputers 4210 is tested in the following way. Based on control signal S106b output from the test signal generation circuit 106, the memory I/F 4243 outputs data signal S131c showing NOP to the CPU 131. In response, the CPU 131 sequentially outputs addresses which are incremented by 1 to the nonvolatile memory 4241 via the memory I/F 4243, as address signal S131d. The nonvolatile memory 4241 reads test data stored at an address shown by address signal S143b corresponding to address signal S131d, and outputs it as test signal S141a and expectation signal S141b. The nonvolatile memory microcomputer 4210 is tested based on test signal S141a and expectation signal S141b, in the same manner as in the preceding embodiments.

According to this embodiment, it becomes unnecessary to supply an address signal from the memory tester 600. As a result, the number of connection lines between the memory tester 600 and the nonvolatile memory microcomputer 4210 can be reduced. This enables the memory tester 600 to test more nonvolatile memory microcomputers 4210 in parallel, with it being possible to shorten the total testing time.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A nonvolatile memory microcomputer chip comprising a microcomputer unit and a memory unit,
    the microcomputer unit including:
    a plurality of circuit blocks including a CPU, and
    the memory unit including:
    a nonvolatile memory;
    a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;
    a drive unit operable to supply each of the plurality of test signals sequentially output from the nonvolatile memory, to any of the plurality of circuit blocks that is to be tested using a piece of test data shown by the test signal, to drive the circuit block; and
    an output unit operable to receive a test result signal from the driven circuit block, and output the test result signal to outside the nonvolatile memory microcomputer chip, wherein the microcomputer unit further includes:
a port operable to send/receive a signal to/from outside the microcomputer unit,
the drive unit supplies the test signal to the circuit block through the port, and
the output unit receives the test result signal from the circuit block through the port,
wherein the memory control unit (a) acquires a plurality of pieces of expectation data from outside the nonvolatile memory microcomputer chip in a one-to-one correspondence with the plurality of pieces of test data, and stores each piece of test data and a corresponding piece of expectation data in a memory area of the nonvolatile memory having a unique address, each piece of expectation data representing a test result signal that is expected if a circuit block to which a test signal showing a corresponding piece of test data is output is driven correctly, and then (b) each time an address signal is given from outside the nonvolatile memory microcomputer chip, controls the nonvolatile memory to output a test signal and an expectation signal that respectively show a piece of test data and a piece of expectation data stored in a memory area having an address shown by the address signal,
the drive unit supplies the test signal output from the nonvolatile memory in response to the address signal, to a circuit block that is to be tested using the piece of test data shown by the test signal, to drive the circuit block, and
the output unit receives a test result signal from the driven circuit block, and outputs the test result signal and the expectation signal together to outside the nonvolatile memory microcomputer chip,
wherein at least two pieces of test data out of the plurality of pieces of test data have different bit lengths according to different contents of the at least two pieces of test data,
the drive unit supplies a mixed signal to the port, the mixed signal being made up of a test signal showing a piece of test data whose bit length is not largest among the plurality of pieces of test data and one part of an expectation signal output from the nonvolatile memory together with the test signal, and
the port extracts the test signal from the mixed signal according to contents of the mixed signal, and supplies the extracted test signal to a circuit block that is to be tested using the piece of test data shown by the test signal.

2. A nonvolatile memory microcomputer chip comprising a microcomputer unit and a memory unit,
the microcomputer unit including:
a plurality of circuit blocks including a CPU, and
the memory unit including:
a nonvolatile memory;
a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;
a drive unit operable to supply each of the plurality of test signals sequentially output from the nonvolatile memory, to any of the plurality of circuit blocks that is to be tested using a piece of test data shown by the test signal, to drive the circuit block; and an output unit operable to receive a test result signal from the driven circuit block, and output the test result signal to outside the nonvolatile memory microcomputer chip,
wherein the nonvolatile memory microcomputer chip further comprises:
a plurality of pairs of connection lines which are provided in a one-to-one correspondence with the plurality of circuit blocks, and each operable to transfer a signal between a corresponding circuit block and the drive unit and between the corresponding circuit block and the output unit,
the drive unit supplies the test signal to the circuit block through one connection line out of a pair of connection lines corresponding to the circuit block,
the output unit receives the test result signal from the circuit block through the other connection line out of the pair of connection lines corresponding to the circuit block, and
the nonvolatile memory microcomputer chip further comprises:
an interface circuit operable to connect each of the plurality of pairs of connection lines with the corresponding circuit block and disconnect the CPU from the corresponding circuit block, when the microcomputer is in a test mode.

3. The nonvolatile memory microcomputer chip of claim 2, wherein the memory control unit (a) stores each piece of test data in a memory area of the nonvolatile memory having a unique address, and then (b) each time an address signal is given from outside the nonvolatile memory microcomputer chip, controls the nonvolatile memory to output a test signal showing a piece of test data stored in a memory area having an address shown by the address signal,
the memory unit further includes:
a circuit block specification unit operable to specify a circuit block that is to be tested using the piece of test data shown by the test signal output from the nonvolatile memory in response to the address signal, based on the address signal, and
the drive unit supplies the test signal to the circuit block specified by the circuit block specification unit, to drive the circuit block.

4. The nonvolatile memory microcomputer chip of claim 2, wherein the memory control unit (a) acquires a plurality of pieces of selection data from outside the nonvolatile memory microcomputer chip in a one-to-one correspondence with the plurality of pieces of test data, and stores each piece of test data and a corresponding piece of selection data in a memory area of the nonvolatile memory having a unique address, each piece of selection data being used for specifying a circuit block that is to be tested using a corresponding piece of test data, and then (b) each time an address signal is given from outside the nonvolatile memory microcomputer chip, controls the nonvolatile memory to output a test signal and a selection signal which respectively show a piece of test data and a piece of selection data stored in a memory area having an address shown by the address signal, and
the drive unit supplies the test signal output from the nonvolatile memory in response to the address signal, to a circuit block that is specified according to the selection signal, to drive the circuit block.

5. A nonvolatile memory microcomputer chip comprising a microcomputer unit and a memory unit, the microcomputer unit including:

a plurality of circuit blocks including a CPU, and the memory unit including:

a nonvolatile memory;

a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;

a drive unit operable to supply each of the plurality of test signals sequentially output from the nonvolatile memory, to any of the plurality of circuit blocks that is to be tested using a piece of test data shown by the test signal, to drive the circuit block; and an output unit operable to receive a test result signal from the driven circuit block, and output the test result signal to outside the nonvolatile memory microcomputer chip, wherein the memory unit includes a plurality of nonvolatile memories, the memory control unit (a) stores the plurality of pieces of test data in the plurality of nonvolatile memories, and then (b) controls each nonvolatile memory to sequentially output a plurality of test signals which each show a piece of test data out of pieces of test data stored in the nonvolatile memory, in parallel, wherein if two nonvolatile memories out of the plurality of nonvolatile memories are to output test signals showing pieces of test data used for testing a same circuit block, the memory control unit allows one of the two nonvolatile memories to output a test signal and prohibits the other nonvolatile memory from outputting a test signal, and the drive unit supplies a test signal output from each nonvolatile memory, to a circuit block that is to be tested using a piece of test data shown by the test signal, to drive the circuit block.

6. A nonvolatile memory microcomputer chip comprising a microcomputer unit and a memory unit, the microcomputer unit including:

a plurality of circuit blocks including a CPU, and the memory unit including:

a nonvolatile memory;

a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;

a drive unit operable to supply each of the plurality of test signals sequentially output from the nonvolatile memory, to any of the plurality of circuit blocks that is to be tested using a piece of test data shown by the test signal, to drive the circuit block; and an output unit operable to receive a test result signal from the driven circuit block, and output the test result signal to outside the nonvolatile memory microcomputer chip, wherein the nonvolatile memory includes:

an oscillation circuit operable to generate a first clock signal, and the nonvolatile memory microcomputer chip further comprises:

a selection circuit operable to selectively supply one of the first clock signal and a second clock signal which is fed from outside the nonvolatile memory microcomputer chip, to each circuit block in the microcomputer unit, wherein the memory control unit (a) acquires a plurality of pieces of selection data from outside the nonvolatile memory microcomputer chip in a one-to-one correspondence with the plurality of pieces of test data, and stores each piece of test data and a corresponding piece of selection data in a memory area of the nonvolatile memory having a unique address, each piece of selection data being used for selecting a frequency of the first clock signal, and then (b) each time an address signal is given from outside the nonvolatile memory microcomputer chip, controls the nonvolatile memory to output a test signal and a selection signal which respectively show a piece of test data and a piece of selection data stored in a memory area having an address shown by the address signal, and the oscillation circuit generates the first clock signal having a frequency that is selected from a plurality of predetermined frequencies according to the selection signal.

7. A nonvolatile memory microcomputer chip comprising a microcomputer unit and a memory unit, the microcomputer unit including:

a plurality of circuit blocks including a CPU, and the memory unit including:

a nonvolatile memory;

a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;

a drive unit operable to supply each of the plurality of test signals sequentially output from the nonvolatile memory, to any of the plurality of circuit blocks that is to be tested using a piece of test data shown by the test signal, to drive the circuit block; and an output unit operable to receive a test result signal from the driven circuit block, and output the test result signal to outside the nonvolatile memory microcomputer chip, wherein the memory control unit (a) acquires a plurality of pieces of designation data from outside the nonvolatile memory microcomputer chip in a one-to-one correspondence with the plurality of pieces of test data, and stores each piece of test data and a corresponding piece of designation data in a memory area of the nonvolatile memory having a unique address, each piece of designation data being used for designating a voltage, and then (b) each time an address signal is given from outside the nonvolatile memory microcomputer chip, controls the nonvolatile memory to output a test signal and a designation signal which respectively show a piece of test data and a piece of designation data stored in a memory area having an address shown by the address signal, and the nonvolatile memory microcomputer chip further comprises:

a power supply unit operable to adjust a voltage of external power applied from outside the nonvolatile memory microcomputer chip to a voltage that is designated according to the designation signal to generate internal power, and supply the internal power to a circuit block that is to be tested using the piece of test data shown by the test signal as operating power.

8. The nonvolatile memory microcomputer chip of claim 7, wherein the plurality of circuit blocks in the microcomputer unit include:
a D/A conversion circuit which serves as the power supply unit,
wherein the D/A conversion circuit generates the internal power by digital-to-analog converting the piece of designation data shown by the designation signal, and supplies the internal power to the circuit block as the operating power.

9. The nonvolatile memory microcomputer chip of claim 7, wherein the nonvolatile memory includes a power circuit which serves as the power supply unit,
wherein the power circuit includes:
a step-up circuit operable to step-up the voltage of the external power; and
a voltage adjustment circuit operable to generate the internal power by stepping-down the stepped-up voltage of the external power to the voltage designated according to the designation signal, and supply the internal power to the circuit block as the operating power.

10. A nonvolatile memory microcomputer chip comprising a microcomputer unit and a memory unit,
the microcomputer unit including:
a plurality of circuit blocks including a CPU, and
the memory unit including:
a nonvolatile memory;
a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;
a drive unit operable to supply each of the plurality of test signals sequentially output from the nonvolatile memory, to any of the plurality of circuit blocks that is to be tested using a piece of test data shown by the test signal, to drive the circuit block; and
an output unit operable to receive a test result signal from the driven circuit block, and output the test result signal to outside the nonvolatile memory microcomputer chip,
wherein the memory control unit (a) acquires a plurality of pieces of designation data from outside the nonvolatile memory microcomputer chip in a one-to-one correspondence with the plurality of pieces of test data, and stores each piece of test data and a corresponding piece of designation data in a memory area of the nonvolatile memory having a unique address, each piece of designation data being used for designating a current, and then (b) each time an address signal is given from outside the nonvolatile memory microcomputer chip, controls the nonvolatile memory to output a test signal and a designation signal which respectively show a piece of test data and a piece of designation data stored in a memory area having an address shown by the address signal,
the nonvolatile memory microcomputer chip further comprises:

a current judgment unit operable to judge whether a power supply current applied to the microcomputer unit exceeds a current designated according to the designation signal, and output a current judgment signal showing a result of the judgment, and
the output unit receives the current judgment signal from the current judgment unit, and outputs the current judgment signal to outside the nonvolatile memory microcomputer chip together with a test result signal received from a circuit block which is driven by the test signal.

11. The nonvolatile memory microcomputer chip of claim 10, wherein the nonvolatile memory includes:
a sense amplifier through which the power supply current passes, and which serves as the current judgment unit,
wherein the sense amplifier generates a reference current according to the designation signal, and outputs the current judgment signal based on a comparison between the reference current and the power supply current.

12. A nonvolatile memory microcomputer chip comprising a microcomputer unit and a memory unit,
the microcomputer unit including:
a plurality of circuit blocks including a CPU, and
the memory unit including:
a nonvolatile memory;
a memory control unit operable to (a) acquire a plurality of pieces of test data from outside the nonvolatile memory microcomputer chip and store the plurality of pieces of test data in the nonvolatile memory, and then (b) control the nonvolatile memory to sequentially output a plurality of test signals which each show a piece of test data out of the plurality of pieces of test data;
a drive unit operable to supply each of the plurality of test signals sequentially output from the nonvolatile memory, to any of the plurality of circuit blocks that is to be tested using a piece of test data shown by the test signal, to drive the circuit block; and
an output unit operable to receive a test result signal from the driven circuit block, and output the test result signal to outside the nonvolatile memory microcomputer chip,
wherein the microcomputer unit further includes:
a port operable to send/receive a signal to/from outside the microcomputer unit,
the drive unit supplies the test signal to the circuit block through the port, and
the output unit receives the test result signal from the circuit block through the port,
wherein the memory control unit (a) acquires a plurality of pieces of expectation data from outside the nonvolatile memory microcomputer chip in a one-to-one correspondence with the plurality of pieces of test data, and stores each piece of test data and a corresponding piece of expectation data in a memory area of the nonvolatile memory having a unique address, each piece of expectation data representing a test result signal that is expected if a circuit block to which a test signal showing a corresponding piece of test data is output is driven correctly, and then (b) each time an address signal is given from outside the nonvolatile memory microcomputer chip, controls the nonvolatile memory to output a test signal and an expectation signal that respectively show a piece of test data and a piece of expectation data stored in a memory area having an address shown by the address signal, the drive unit supplies the test signal output from the nonvolatile memory in response to the address signal, to a circuit block that is to be tested using the piece of test data shown by the test signal, to drive the circuit block, and the output unit receives a test result signal from the driven circuit block, and outputs the test result signal and the expectation signal together to outside the nonvolatile memory microcomputer chip, wherein when a defective signal is given from outside the nonvolatile memory microcomputer chip in response to the test result signal and the expectation signal, the memory control unit stores the address shown by the address signal to a predetermined memory area of the nonvolatile memory, the defective signal indicating that the circuit block is judged as being defective as a result of testing.

13. The nonvolatile memory microcomputer chip of claim 12, wherein the memory control unit (a) acquires a plurality of instructions which constitute a program that is executable by the CPU, from outside the nonvolatile memory microcomputer chip, and stores each instruction in a memory area of the nonvolatile memory having a unique address, and then (b) when the defective signal is given from outside the nonvolatile memory microcomputer chip, stores the address shown by the address signal to the predetermined memory area of the nonvolatile memory, and subsequently supplies a control signal to the CPU, the control signal instructing to execute the program from an address of a memory area storing a beginning instruction.

14. A method for testing a nonvolatile memory microcomputer chip including a microcomputer unit and a nonvolatile memory unit, comprising:

a first test step of storing first test data in the nonvolatile memory unit, and then testing the microcomputer unit using the first test data in the nonvolatile memory unit to judge whether the microcomputer unit is defective; and a second test step of storing, if the microcomputer unit is judged as being defective in the first test step, replacing the first test data in the nonvolatile memory unit with second test data, and then testing the microcomputer unit using the second test data in the nonvolatile memory unit.

15. A method for testing a plurality of nonvolatile memory microcomputer chips which each include a microcomputer unit and a nonvolatile memory unit, comprising:

a first test step of selecting a part of the plurality of nonvolatile memory microcomputer chips as test samples, storing first test data for performing testing about at least one test item in a nonvolatile memory unit of each test sample, and then testing a microcomputer unit of each test sample using the first test data stored in the nonvolatile memory unit for each test item;

a decision step of deciding, for each test item, whether all of the plurality of nonvolatile memory microcomputer chips need to be tested, based on a result of the testing in the first test step; and a second test step of storing second test data for performing testing about each test item for which all of the plurality of nonvolatile memory microcomputer chips are decided as needing to be tested, to a nonvolatile memory unit of each of the plurality of nonvolatile memory microcomputer chips, and then testing a microcomputer unit of each of the plurality of nonvolatile memory microcomputer chips using the second test data stored in the nonvolatile memory unit.

16. A method for testing a first nonvolatile memory microcomputer chip and a second nonvolatile memory microcomputer chip which each include a microcomputer unit and a nonvolatile memory unit, where the first and second nonvolatile memory microcomputer chips are connected so that data stored in a nonvolatile memory unit of the second nonvolatile memory microcomputer chip can be supplied to a microcomputer unit of the first nonvolatile memory microcomputer chip, comprising:

a storage step of storing first test data for performing testing about a first test item in a nonvolatile memory unit of the first nonvolatile memory microcomputer chip, and storing second test data for performing testing about a second test item in the nonvolatile memory unit of the second nonvolatile memory microcomputer chip;

a first test step of testing the microcomputer unit of the first nonvolatile memory microcomputer chip using the first test data stored in the nonvolatile memory unit of the first nonvolatile memory microcomputer chip;

a supply step of supplying the second test data stored in the nonvolatile memory unit of the second nonvolatile memory microcomputer chip, to the microcomputer unit of the first nonvolatile memory microcomputer chip; and a second test step of testing the microcomputer unit of the first nonvolatile memory microcomputer chip using the second test data supplied from the nonvolatile memory unit of the second nonvolatile memory microcomputer chip.

* * * * *